United States Patent
Yamazaki et al.

(10) Patent No.: US 8,937,306 B2
(45) Date of Patent: Jan. 20, 2015

(54) OXIDE SEMICONDUCTOR

(71) Applicant: Semiconductor Energy Laboratory Co., Ltd., Atsugi (JP)

(72) Inventors: Shunpei Yamazaki, Tokyo (JP); Kengo Akimoto, Kanagawa (JP); Masashi Tsubuku, Kanagawa (JP); Toshinari Sasaki, Kanagawa (JP); Hideaki Kuwabara, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/862,528

(22) Filed: Apr. 15, 2013

(65) Prior Publication Data

US 2013/0228777 A1 Sep. 5, 2013

Related U.S. Application Data

(63) Continuation of application No. 12/846,556, filed on Jul. 29, 2010, now Pat. No. 8,421,083.

(30) Foreign Application Priority Data

Jul. 31, 2009 (JP) .................................. 2009-179722

(51) Int. Cl.
    *H01L 33/00* (2010.01)
    *H01L 29/786* (2006.01)
    *H01L 27/12* (2006.01)

(52) U.S. Cl.
    CPC ...... *H01L 33/0041* (2013.01); *H01L 29/78606* (2013.01); *H01L 29/7869* (2013.01); *H01L 29/78696* (2013.01); *H01L 27/1225* (2013.01); *H01L 27/1214* (2013.01)

USPC .......................................................... 257/43

(58) Field of Classification Search
    CPC ............ H01L 27/1214; H01L 27/1225; H01L 27/1248; H01L 29/7869; H01L 29/78696; H01L 29/78606; H01L 33/0041
    USPC .......................................... 257/43, 40, 57, 66
    See application file for complete search history.

(56) References Cited

U.S. PATENT DOCUMENTS 5,731,856 A   3/1998   Kim et al.
5,744,864 A   4/1998   Cillessen et al.

(Continued)

FOREIGN PATENT DOCUMENTS

EP   1 737 044 A1   12/2006
EP   1 976 018 A2   10/2008

(Continued)

OTHER PUBLICATIONS

Neamen, Semiconductor Physics and Devices, Richard D. Irwin, Inc., 1993, p. 165.*

(Continued)

*Primary Examiner* — Nikolay Yushin
(74) *Attorney, Agent, or Firm* — Fish & Richardson P.C.

(57) ABSTRACT

In a bottom-gate thin film transistor using the stack of the first oxide semiconductor layer and the second oxide semiconductor layer, an oxide insulating layer serving as a channel protective layer is formed over and in contact with part of the oxide semiconductor layer overlapping with a gate electrode layer. In the same step as formation of the insulating layer, an oxide insulating layer covering a peripheral portion (including a side surface) of the stack of the oxide semiconductor layers is formed.

48 Claims, 36 Drawing Sheets

(56) References Cited

U.S. PATENT DOCUMENTS

| | | |
|---|---|---|
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 6,838,308 B2 | 1/2005 | Haga |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,382,421 B2 | 6/2008 | Hoffman et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,576,394 B2 | 8/2009 | Furuta et al. |
| 7,601,984 B2 | 10/2009 | Sano et al. |
| 7,629,633 B2 | 12/2009 | Chan et al. |
| 7,642,038 B2 | 1/2010 | Fujii |
| 7,674,650 B2 | 3/2010 | Akimoto et al. |
| 7,732,819 B2 | 6/2010 | Akimoto et al. |
| 7,994,500 B2 | 8/2011 | Kim et al. |
| 8,148,779 B2 | 4/2012 | Jeong et al. |
| 8,188,480 B2 | 5/2012 | Itai |
| 8,203,143 B2 | 6/2012 | Imai |
| 8,222,092 B2 | 7/2012 | Yamazaki et al. |
| 2001/0046027 A1 | 11/2001 | Tai et al. |
| 2002/0056838 A1 | 5/2002 | Ogawa |
| 2002/0075423 A1 | 6/2002 | Fujino |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2005/0221203 A1 | 10/2005 | Fujii |
| 2005/0275038 A1 | 12/2005 | Shih et al. |
| 2006/0035452 A1 | 2/2006 | Carcia et al. |
| 2006/0043377 A1 | 3/2006 | Hoffman et al. |
| 2006/0043447 A1 | 3/2006 | Ishii et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052020 A1 | 3/2007 | Chen et al. |
| 2007/0052025 A1 | 3/2007 | Yabuta |
| 2007/0054507 A1 | 3/2007 | Kaji et al. |
| 2007/0069209 A1* | 3/2007 | Jeong et al. ................ 257/57 |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0237598 A1 | 10/2008 | Nakayama |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0291350 A1 | 11/2008 | Hayashi et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308804 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0269881 A1 | 10/2009 | Furuta et al. |
| 2009/0278122 A1 | 11/2009 | Hosono et al. |
| 2009/0280600 A1 | 11/2009 | Hosono et al. |
| 2009/0294772 A1* | 12/2009 | Jeong et al. ................ 257/59 |
| 2009/0305461 A1 | 12/2009 | Akimoto et al. |
| 2009/0321731 A1* | 12/2009 | Jeong et al. ................ 257/43 |
| 2010/0006833 A1 | 1/2010 | Ha et al. |
| 2010/0025678 A1 | 2/2010 | Yamazaki et al. |
| 2010/0032665 A1 | 2/2010 | Yamazaki et al. |
| 2010/0044701 A1 | 2/2010 | Sano et al. |
| 2010/0051938 A1 | 3/2010 | Hayashi et al. |
| 2010/0051943 A1 | 3/2010 | Fujii |
| 2010/0051949 A1 | 3/2010 | Yamazaki et al. |
| 2010/0065844 A1 | 3/2010 | Tokunaga |
| 2010/0078633 A1 | 4/2010 | Watanabe |
| 2010/0084648 A1 | 4/2010 | Watanabe |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0140612 A1 | 6/2010 | Omura et al. |
| 2010/0163868 A1 | 7/2010 | Yamazaki et al. |
| 2010/0283049 A1 | 11/2010 | Sato et al. |
| 2010/0301328 A1 | 12/2010 | Yamazaki et al. |
| 2011/0024740 A1 | 2/2011 | Yamazaki et al. |
| 2011/0024750 A1 | 2/2011 | Yamazaki et al. |
| 2011/0031491 A1 | 2/2011 | Yamazaki et al. |
| 2011/0037068 A1 | 2/2011 | Yamazaki et al. |
| 2011/0193083 A1 | 8/2011 | Kim et al. |
| 2011/0210328 A1 | 9/2011 | Yamazaki et al. |
| 2011/0212571 A1 | 9/2011 | Yamazaki et al. |
| 2011/0215318 A1 | 9/2011 | Yamazaki et al. |
| 2011/0215319 A1 | 9/2011 | Yamazaki et al. |
| 2013/0130437 A1 | 5/2013 | Yamazaki et al. |

(56) References Cited

U.S. PATENT DOCUMENTS

2013/0140559 A1 6/2013 Yamazaki et al.
2013/0175526 A1 7/2013 Yamazaki et al.

FOREIGN PATENT DOCUMENTS

| EP | 2 226 847 A2 | 9/2010 |
|---|---|---|
| GB | 2153589 A | 8/1985 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-505377 A | 5/1999 |
| JP | 2000-044236 A | 2/2000 |
| JP | 2000-150900 A | 5/2000 |
| JP | 2000-357586 A | 12/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2007-073559 A | 3/2007 |
| JP | 2007-096055 A | 4/2007 |
| JP | 2007-123861 A | 5/2007 |
| JP | 2009-231613 A | 10/2009 |
| JP | 2010-016347 A | 1/2010 |
| JP | 2010-040552 A | 2/2010 |
| JP | 2010-067954 A | 3/2010 |
| WO | 2004/114391 A1 | 12/2004 |
| WO | 2008/126879 A1 | 10/2008 |
| WO | WO-2009/034953 | 3/2009 |
| WO | 2009/072532 A1 | 6/2009 |

OTHER PUBLICATIONS

Hye Dong Kim et al.; "22.1: Invited Paper: Technological Challenges for Large-Size AMOLED Display"; SID Digest '08 : SID International Symposium Digest of Technical Papers; 2008; pp. 291-294; vol. 39, No. 1.

Masaya Nakayama et al.; "17a-TL-8 Effect of GaO Layer on IGZO-TFT Channel"; Extended Abstracts of the 57th Spring Meeting of the The Japan Society of Applied Physics and Related Societies (2010 spring Tokai University); Mar. 17, 2010, pp. 21-008 with English translation.

Michael Quirk et al.; "Semiconductor manufacturing technology"; 2001; pp. 314-320; Prentice-Hall.

International Search Report, PCT Application No. PCT/JP2010/062484, dated Oct. 19, 2010, 3 pages.

Written Opinion, PCT Application No. PCT/JP2010/062484, dated Oct. 19, 2010, 4 pages.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced at Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn—Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn—Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda, T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies In ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium—Gallium—Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MoO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

(56) References Cited

OTHER PUBLICATIONS

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m=3, 4, and 5), InGaO3(ZnO)3, and Ga2O3(ZnO)m (m=7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium—Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display Using In—Ga—Zn—Oxide TFTS With a Novel Passivation Layer," SID Digest '09 : SID International Symposium Digest of Technical Papers, May 31, 2009, pp. 284-287.

Ohara, H et al., "Amorphous In—Ga—Zn—Oxide TFTs with Suppressed Variation for 4.0 inch QVGA AMOLED Display," AM-FPD '09 Digest of Technical Papers, Jul. 1, 2009, pp. 227-330, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn—Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn—Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium—Gallium—Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium—Gallium—Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by PEALD Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-In. AMOLED Display With Driver Circuit Using Amorphous In—Ga—Zn—Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous GIZO (Ga2O3—In2O3—ZnO) TFT," SID Digest '08 : SID International Symposium Digest of Technical Papers, May 20, 2008, vol. 39, pp. 633-636.

(56) References Cited

OTHER PUBLICATIONS

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

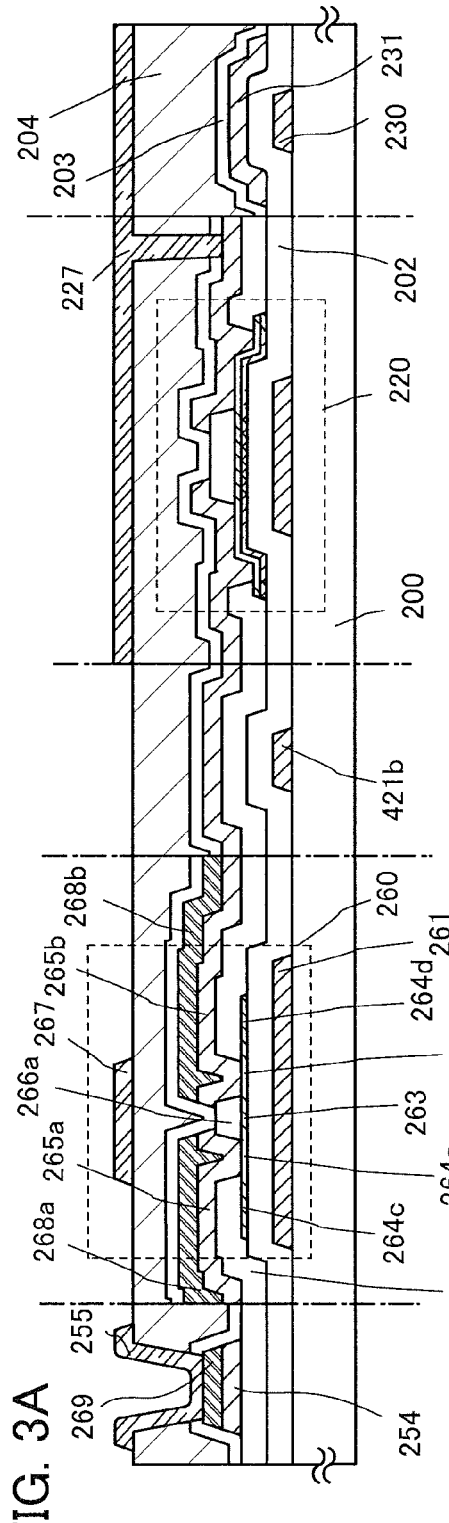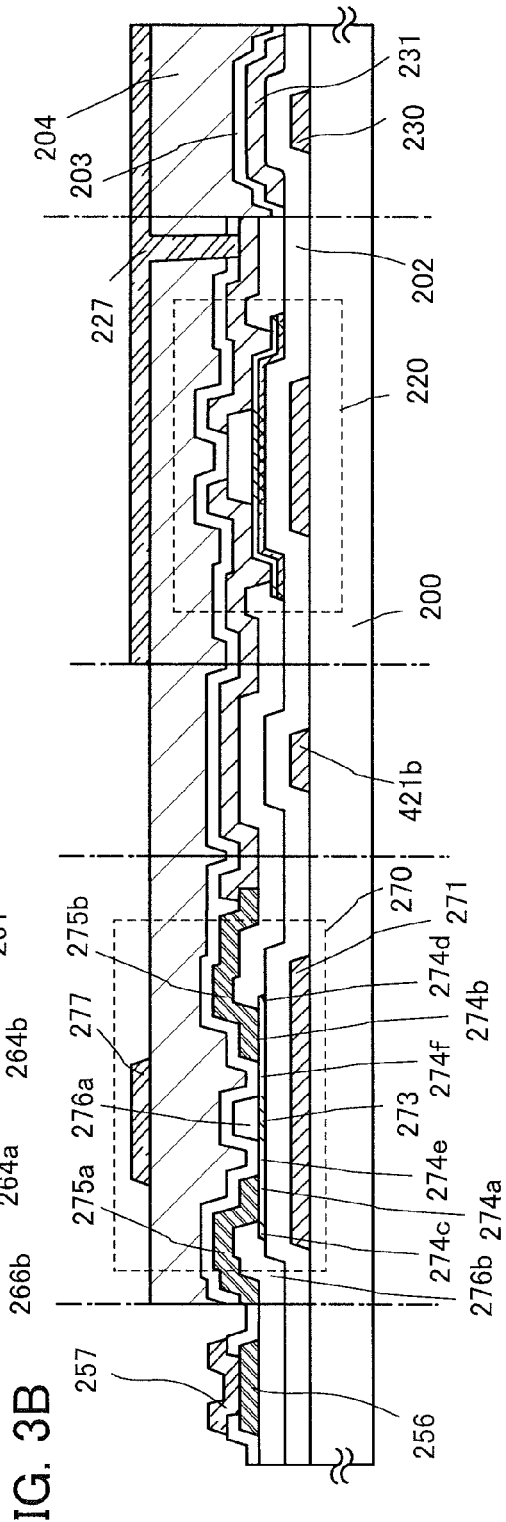

FIG. 4A1
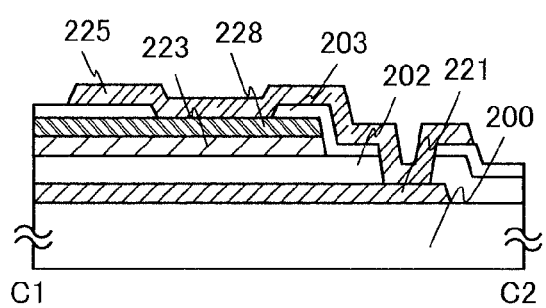
FIG. 4A2
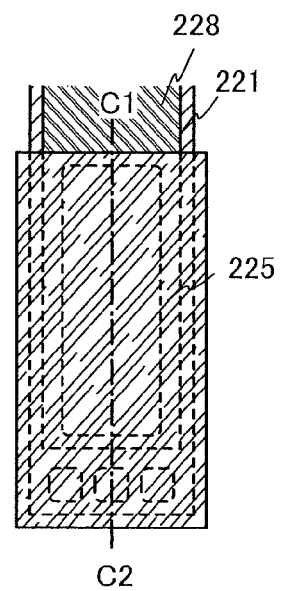
FIG. 4B1
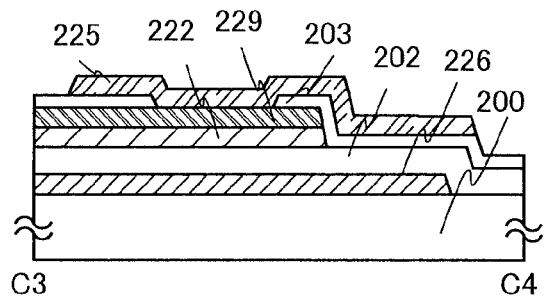
FIG. 4B2
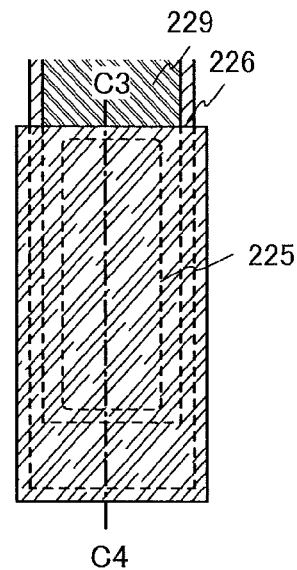

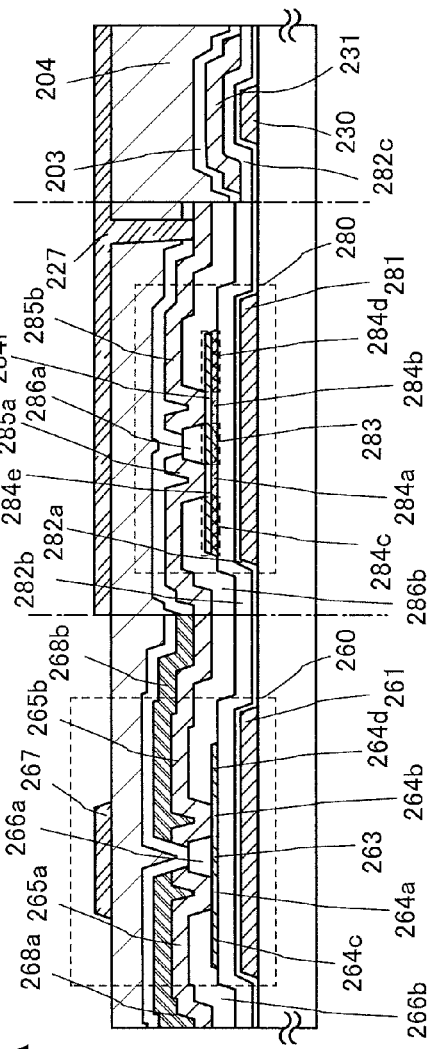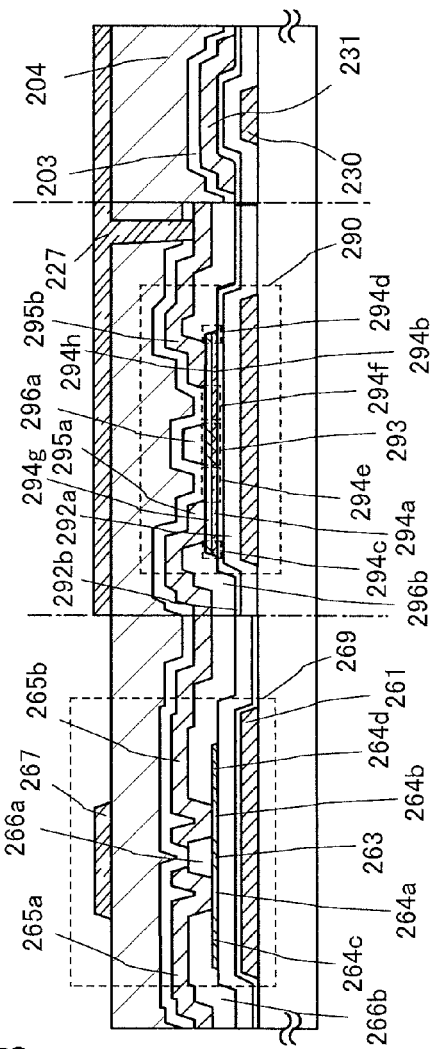
FIG. 6A
FIG. 6B

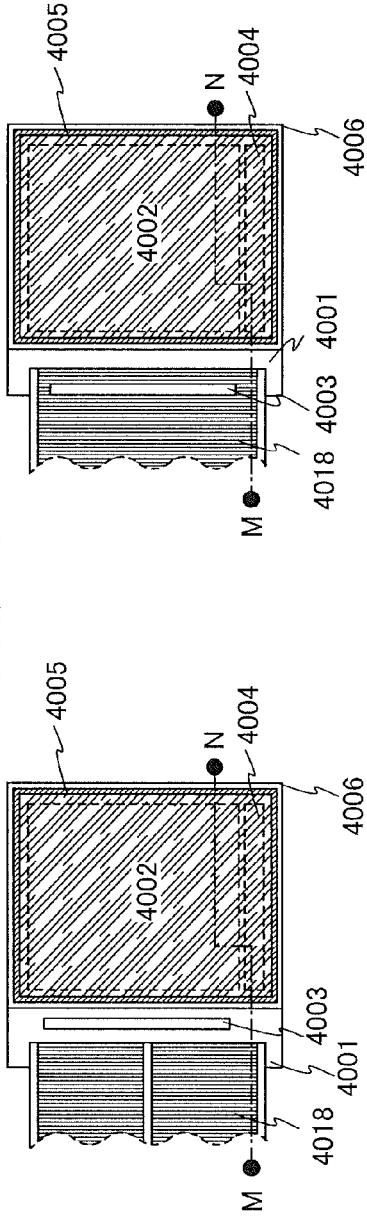
FIG. 10A1
FIG. 10A2
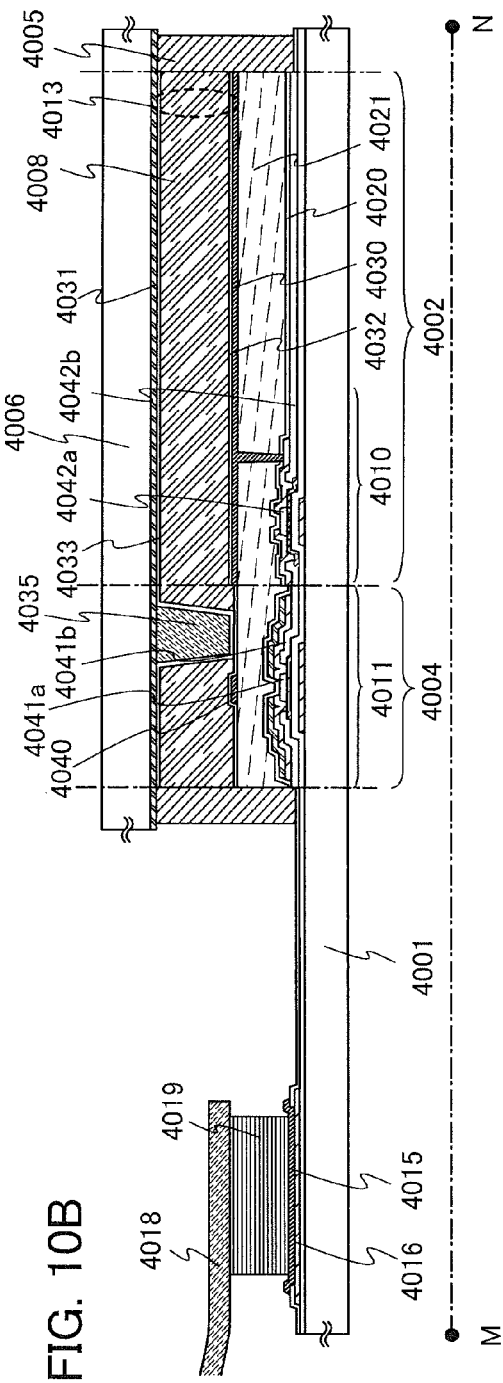
FIG. 10B

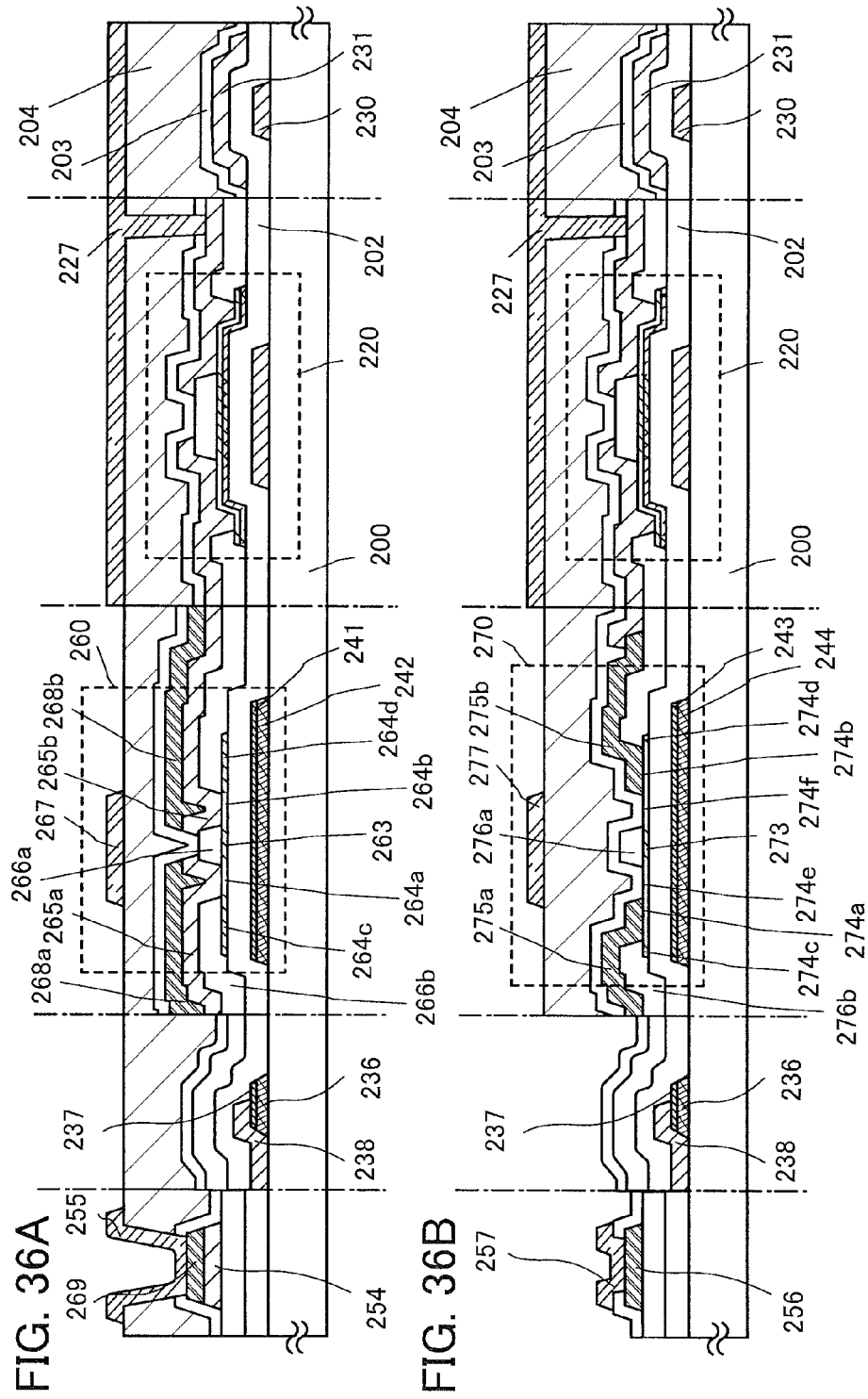

US 8,937,306 B2

OXIDE SEMICONDUCTOR

CROSS-REFERENCE TO RELATED APPLICATIONS

This application is a continuation of U.S. application Ser. No. 12/846,556, filed Jul. 29, 2010, now allowed, which claims the benefit of a foreign priority application filed in Japan as Serial No. 2009-179722 on Jul. 31, 2009, both of which are incorporated by reference.

TECHNICAL FIELD

The present invention relates to a semiconductor device using an oxide semiconductor and a manufacturing method thereof.

In this specification, a semiconductor device generally means a device which can function by utilizing semiconductor characteristics, and an electrooptic device, a semiconductor circuit, and electronic equipment are all semiconductor devices.

BACKGROUND ART

In recent years, a technique for forming a thin film transistor (TFT) by using a semiconductor thin film (having a thickness of approximately several nanometers to several hundred nanometers) formed over a substrate having an insulating surface has attracted attention. Thin film transistors are applied to a wide range of electronic devices such as ICs or electro-optical devices, and prompt development of thin film transistors that are to be used as switching elements in image display devices, in particular, is being pushed. Various metal oxides are used for a variety of applications. Indium oxide is a well-known material and is used as a transparent electrode material which is necessary for liquid crystal displays and the like.

Some metal oxides have semiconductor characteristics. The examples of such metal oxides having semiconductor characteristics are a tungsten oxide, a tin oxide, an indium oxide, a zinc oxide, and the like. A thin film transistor in which a channel formation region is formed using such metal oxides having semiconductor characteristics is known (Patent Documents 1 and 2).

REFERENCE

Patent Documents

[Patent Document 1] Japanese Published Patent Application No. 2007-123861
[Patent Document 2] Japanese Published Patent Application No. 2007-096055

DISCLOSURE OF INVENTION

In the case where a plurality of thin film transistors is formed over an insulating surface, for example, there is a portion where a gate wiring and a source wiring intersect each other. At the portion where the gate wiring and the source wiring intersect each other, capacitance is formed between the gate wiring and the source wiring whose potential is different from that of the gate wiring, in which an insulating layer serving as a dielectric is provided between the gate wiring and the source wiring. The capacitance is referred to as parasitic capacitance between wirings and distortion of a signal waveform may occur. In addition, when the parasitic capacitance is large, delay of transmission of a signal may occur.

Further, increase in the parasitic capacitance causes a cross talk phenomenon in which an electric signal leaks between wirings or increase in power consumption.

Furthermore, in an active matrix display device, particularly when large parasitic capacitance is formed between a signal wiring supplying a video signal and another wiring or an electrode, display quality may deteriorate.

Also in the case of miniaturizing a circuit, a distance between wirings is reduced and the parasitic capacitance between the wirings may be increased.

An object of an embodiment of the present invention is to provide a semiconductor device having a structure which enables sufficient reduction of parasitic capacitance between wirings.

In the case where a driver circuit is formed over an insulating surface, it is preferable that the operation speed of a thin film transistor used for the driver circuit be high.

For example, the operation speed is increased when a channel length (L) of the thin film transistor is reduced or a channel width (W) of the thin film transistor is increased. However, when the channel length is reduced, there is a problem in that a switching characteristic, for example, an on-off ratio is lowered. In addition, when the channel width (W) is increased, there is a problem in that the capacity load of the thin film transistor itself is increased.

Another object of an embodiment of the present invention is to provide a semiconductor device provided with a thin film transistor with stable electric characteristics even if a channel length is small.

In the case where a plurality of circuits which are different from each other is formed over an insulating surface, for example, when a pixel portion and a driver circuit are formed over one substrate, excellent switching characteristics are needed. For example, a high on-off ratio is needed for a thin film transistor used for the pixel portion, and a high operation speed is needed for a thin film transistor used for the driver circuit. In particular, as the definition of a display device is higher, writing time of a display image is reduced. Therefore, it is preferable that the thin film transistor used for the driver circuit operate at high speed.

Another object of an embodiment of the present invention is to provide a method for manufacturing a semiconductor device, by which plural kinds of thin film transistors are formed over one substrate to form plural kinds of circuits.

A first oxide semiconductor layer and a second oxide semiconductor layer are formed over an insulating surface, and then the oxide semiconductor layers are patterned. The resulting oxide semiconductor layers are used as a semiconductor layer of a thin film transistor. In particular, in the case where plural kinds of thin film transistors are formed over one substrate, a stack of the first oxide semiconductor layer and the second oxide semiconductor layer is used as a semiconductor layer of at least one of the thin film transistors.

In a bottom-gate thin film transistor using the stack of the first oxide semiconductor layer and the second oxide semiconductor layer, an oxide insulating layer serving as a channel protective layer is formed over and in contact with part of the oxide semiconductor layer overlapping with a gate electrode layer. In the same step as formation of the insulating layer, an oxide insulating layer covering a peripheral portion (including a side surface) of the stack of the oxide semiconductor layers is formed.

When the oxide insulating layer covering the periphery portion (including the side surface) of the stack of the first oxide semiconductor layer and the second oxide semiconductor layer is provided, a distance between the gate electrode layer and wiring layers (such as a source wiring layer and a capacitor wiring layer) formed over or at the periphery of the gate electrode layer is increased so that parasitic capacitance is reduced.

The oxide insulating layer covers end portions (peripheries and side surfaces) of the first oxide semiconductor layer and the second oxide semiconductor layer, so that leakage current can be reduced.

The oxide insulating layer covering the periphery portion of the stack of the first oxide semiconductor layer and the second semiconductor layer is formed in the same step as the channel protective layer. Therefore, parasitic capacitance can be reduced without increase in the number of steps.

The oxide insulating layer covering the periphery portion (including the side surface) of the stack of the first oxide semiconductor layer and the second oxide semiconductor layer enables reduction in parasitic capacitance and suppression of distortion of a signal waveform.

In order to reduce parasitic capacitance, it is preferable that an insulating material with a low dielectric constant be used for the oxide insulating layer between the wirings.

When the oxide insulating layer covering the peripheries (including the side surfaces) of the oxide semiconductor layers is provided, parasitic capacitance is reduced as much as possible and high speed operation of the thin film transistor can be achieved. In addition, with use of the thin film transistor operating at high speed, integration degree of the circuits is improved.

An embodiment of the present invention disclosed in this specification is a semiconductor device including a gate electrode layer provided over an insulating surface, a gate insulating layer provided over the gate electrode layer, a first oxide semiconductor layer provided over the gate insulating layer, a second oxide semiconductor layer provided over and in contact with the first oxide semiconductor layer, an oxide insulating layer which overlaps with a first region of the first oxide semiconductor layer and a first region of the second oxide semiconductor layer and is in contact with the second oxide semiconductor layer, a source electrode layer and a drain electrode layer which are provided over the oxide insulating layer and a second region of the first oxide semiconductor layer, overlap with a second region of the second oxide semiconductor layer, and are in contact with the second oxide semiconductor layer. In the semiconductor device, the first region of the first oxide semiconductor layer and the first region of the second oxide semiconductor layer are provided in a region overlapping with the gate electrode layer and in peripheries and side surfaces of the first oxide semiconductor layer and the second oxide semiconductor layer.

Another embodiment of the present invention disclosed in this specification is a semiconductor device including a gate electrode layer provided over an insulating surface, a gate insulating layer provided over the gate electrode layer, a first oxide semiconductor layer provided over the gate insulating layer, a second oxide semiconductor layer provided over and in contact with the first oxide semiconductor layer, an oxide insulating layer which overlaps with a first region of the first oxide semiconductor layer and a first region of the second oxide semiconductor layer and is in contact with the second oxide semiconductor layer, a source electrode layer and a drain electrode layer which are provided over the oxide insulating layer and a second region of the first oxide semiconductor layer, overlap with a second region of the second oxide semiconductor layer, and are in contact with the second oxide semiconductor layer, a protective insulating layer which is provided over the oxide insulating layer, the source electrode layer, the drain electrode layer, and a third region of the first oxide semiconductor layer, overlaps with a third region of the second oxide semiconductor layer, and is provided in contact with the second oxide semiconductor layer. In the semiconductor device, the first region of the first oxide semiconductor layer and the first region of the second oxide semiconductor layer are provided in a region overlapping with the gate electrode layer and in peripheries and side surfaces of the first oxide semiconductor layer and the second oxide semiconductor layer.

In the embodiment of the present invention disclosed in this specification, the protective insulating layer may be formed using silicon nitride, aluminum oxide, or aluminum nitride formed by a sputtering method.

In the embodiment of the present invention disclosed in this specification, the oxide insulating layer may be formed using silicon oxide or aluminum oxide formed by a sputtering method.

In the embodiment of the present invention disclosed in this specification, the source electrode layer and the drain electrode layer may be formed using a film including an element selected from Al, Cr, Cu, Ta, Ti, Mo, and W as its main component, or a stacked-layer film including a combination of alloy films of these elements.

In the embodiment of the present invention disclosed in this specification, the source electrode layer and the drain electrode layer of the semiconductor device may be formed using indium oxide, an alloy of indium oxide and tin oxide, an alloy of indium oxide and zinc oxide, or zinc oxide.

In the embodiment of the present invention disclosed in this specification, the semiconductor device may include a capacitor portion over the insulating surface and a capacitor wiring and a capacitor electrode overlapping with the capacitor wiring which are included in the capacitor portion. In the semiconductor device, the capacitor wiring and the capacitor electrode may have a light-transmitting property.

Note that the first oxide semiconductor layer has lower electric resistivity (higher conductivity) than the second oxide semiconductor layer. Further, the distance between the first oxide semiconductor layer and the gate electrode is shorter than the distance between the second oxide semiconductor layer and the gate electrode. The first oxide semiconductor layer is in contact with at least a gate insulating film. By manufacturing a thin film transistor using this stack of layers, a thin film transistor with excellent electrical characteristics (for example, electrical field mobility) can be obtained.

With the above structure, at least one of the above problems can be resolved.

An embodiment of the present invention, by which the above structure is obtained, is a method for manufacturing a semiconductor device, including the steps of forming a gate electrode layer over an insulating surface, forming a gate insulating layer over the gate electrode layer, forming a first oxide semiconductor layer over the gate insulating layer, forming a second oxide semiconductor layer over and in contact with the first oxide semiconductor layer, forming an oxide insulating layer which overlaps with a first region of the first oxide semiconductor layer and a first region of the second oxide semiconductor layer and is provided in contact with the second oxide semiconductor layer, and forming a source electrode layer and a drain electrode layer which are provided over the oxide insulating layer and a second region of the first oxide semiconductor layer, overlap with a second region of the second oxide semiconductor layer, and are in contact with the second oxide semiconductor layer. In this embodiment, the first oxide semiconductor layer and the second oxide semiconductor layer are formed without being exposed to the air so that intrusion of water and hydrogen into the first oxide semiconductor layer and the second oxide semiconductor layer is prevented after dehydration or dehydrogenation of the first oxide semiconductor layer and the second oxide semiconductor layer, and the first region of the first oxide semiconductor layer and the first region of the second oxide semiconductor layer are formed in a region overlapping with the gate electrode layer and in peripheries and side surfaces of the first oxide semiconductor layer and the second oxide semiconductor layer.

Another embodiment of the present invention, by which the above structure is obtained, is a method for manufacturing a semiconductor device, including the steps of forming a gate electrode layer over an insulating surface, forming a gate insulating layer over the gate electrode layer, forming a first oxide semiconductor layer over the gate insulating layer, forming a second oxide semiconductor layer over and in contact with the first oxide semiconductor layer, forming an oxide insulating layer which overlaps with a first region of the first oxide semiconductor layer and a first region of the second oxide semiconductor layer and is provided in contact with the second oxide semiconductor layer, forming a source electrode layer and a drain electrode layer which are provided over the oxide insulating layer and a second region of the first oxide semiconductor layer, overlap with a second region of the second oxide semiconductor layer, and are in contact with the second oxide semiconductor layer, and forming a protective insulating layer which is provided over the oxide insulating layer, the source electrode layer, the drain electrode layer, and a third region of the first oxide semiconductor layer, overlaps with a third region of the second oxide semiconductor layer, and is provided in contact with the second oxide semiconductor layer. In this embodiment, the first region of the first oxide semiconductor layer and the first region of the second oxide semiconductor layer are formed in a region overlapping with the gate electrode layer and in peripheries and side surfaces of the first oxide semiconductor layer and the second oxide semiconductor layer.

The oxide insulating layer is provided to cover the periphery and the side surface of the oxidized metal thin film in order to prevent conduction between the source electrode and the drain electrode.

The average total thickness of the first oxide semiconductor layer and the second oxide semiconductor layer is 3 nm to 30 nm inclusive.

In addition, the second oxide semiconductor layer preferably includes at least one of the elements included in the first oxide semiconductor layer. If the second oxide semiconductor layer includes at least one of the elements included in the first oxide semiconductor layer, the second oxide semiconductor layer and the first oxide semiconductor layer can be etched in the same etching step using the same etchant or the same etching gas, which results in a decrease in the number of manufacturing steps.

Note that the first oxide semiconductor layer and the second oxide semiconductor layer are formed using thin films represented by $InMO_3(ZnO)_m$ (m>0 and m is not an integer), and the thin film transistor whose oxide semiconductor layer is formed using the thin films is manufactured. Note that M represents one or more metal elements selected from Ga, Fe, Ni, Mn, and Co. As an example, M may be Ga or may include the above metal element in addition to Ga, for example, M may be Ga and Ni or Ga and Fe. Moreover, in the above oxide semiconductor, in some cases, a transition metal element such as Fe or Ni or an oxide of the transition metal is included as an impurity element in addition to a metal element included as M. In this specification, among the oxide semiconductor layers whose composition formulas are represented by $InMO_3(ZnO)_m$ (m>0 and m is not an integer), an oxide semiconductor which includes Ga as M is referred to as an In—Ga—Zn—O-based oxide semiconductor, and a thin film of the In—Ga—Zn—O-based oxide semiconductor is also referred to as an In—Ga—Zn—O-based non-single-crystal film.

As a metal oxide applied to the oxide semiconductor layers, any of the following oxide semiconductors can be applied besides the above: an In—Sn—Zn—O-based, an In—Al—Zn—O-based, a Sn—Ga—Zn—O-based, an Al—Ga—Zn—O-based, a Sn—Al—Zn—O-based, an In—Zn—O-based, a Sn—Zn—O-based, an Al—Zn—O-based, an In—O-based, a Sn—O-based, a Zn—O-based, and an In—Ga—O-based metal oxide. Silicon oxide may be included in the oxide semiconductor layer formed using the above metal oxide.

In the case where heat treatment is performed in an atmosphere of an inert gas such as nitrogen or a rare gas such as argon or helium, the oxide semiconductor layers are changed into oxygen-deficient oxide semiconductor layers by the heat treatment so as to be low-resistant oxide semiconductor layers, that is, n-type ($n^-$-type) oxide semiconductor layers. Then, the oxide semiconductor layers are made to be in an oxygen-excess state by formation of an oxide insulating film which is in contact with the oxide semiconductor layer and heat treatment after the formation so as to be high-resistance oxide semiconductor layers, that is, i-type oxide semiconductor layers. In addition, it also can be said that solid phase oxidation by which the oxide semiconductor layers are in an oxygen-excessive state is performed. Accordingly, it is possible to manufacture and provide a semiconductor device including a highly reliable thin film transistor having favorable electric characteristics.

As dehydration or dehydrogenation, heat treatment is performed in an atmosphere of an inert gas such as nitrogen or a rare gas (such as argon or helium) at a temperature higher than or equal to 400° C. and lower than a strain point of the substrate, preferably higher than or equal to 420° C. and lower than or equal to 570° C., so that impurities such as moisture included in the oxide semiconductor layers are reduced.

The oxide semiconductor layers are subjected to dehydration or dehydrogenation under a heat treatment condition that two peaks of water or at least one peak of water at around 300° C. is not detected even if TDS is performed at up to 450° C. on the oxide semiconductor layers subjected to dehydration or dehydrogenation. Therefore, even if TDS is performed at up to 450° C. on a thin film transistor including oxide semiconductor layers subjected to dehydration or dehydrogenation, at least the peak of water at around 300° C. is not detected.

In addition, it is important not to mix water and hydrogen into the oxide semiconductor layers, without the oxide semiconductor layers exposed to the air, with use of a furnace in which dehydration or dehydrogenation is performed on the oxide semiconductor layers when the temperature is lowered from a heat temperature T at which dehydration or dehydrogenation are performed. When a thin film transistor is formed using oxide semiconductor layers obtained by changing oxide semiconductor layers into low-resistant oxide semiconductor layers, that is, N-type ($N^-$-type or the like) oxide semiconductor layers by dehydration or dehydrogenation, and by changing the low-resistant oxide semiconductor layers into high-resistance oxide semiconductor layers so as to be i-type semiconductor layers, the threshold voltage of the thin film transistor can be positive voltage, so that a so-called normally-off switching element can be realized. It is desirable for a semiconductor device (a display device) that a channel be formed with a threshold voltage that is a positive value and as close to 0 V as possible. If the threshold voltage of the thin film transistor is negative, it tends to be normally on; in other words, current flows between the source electrode and the drain electrode even when the gate voltage is 0 V. In an active-matrix display device, electric characteristics of thin film transistors included in a circuit are important and performance of the display device is dependent on the electric characteristics of thin film transistors. Among the electric characteristics of thin film transistors, in particular, a threshold voltage (Vth) is important. When the threshold voltage value is high or is on the minus side even when the field effect mobility is high, it is difficult to control the circuit. When a thin film transistor has a high threshold voltage value and a large absolute value of its threshold voltage, the thin film transistor cannot perform switching function and may be a load when the transistor is driven at low voltage. In the case of an n-channel thin film transistor, it is preferable that a channel is formed and drain current begins to flow after the positive voltage is applied as a gate voltage. A transistor in which a channel is not formed unless the driving voltage is increased and a transistor in which a channel is formed and drain current flows even in the case of the negative voltage state are unsuitable for a thin film transistor used in a circuit.

In addition, a gas atmosphere in which the temperature is lowered from the heat temperature T may be switched to a gas atmosphere which is different from the gas atmosphere in which the temperature is raised to the heating temperature T. For example, cooling is performed by using the furnace in which dehydration or dehydrogenation is performed and by filling the furnace with a high-purity oxygen gas, a high-purity $N_2O$ gas, or ultra-dry air (having a dew point of −40° C. or lower, preferably −60° C. or lower) without exposure to the air.

The electrical characteristics of a thin film transistor are improved using oxide semiconductor films cooled slowly (or cooled) in an atmosphere which does not contain moisture (having a dew point of −40° C. or lower, preferably −60° C. or lower) after moisture which is contained in the films is reduced by heat treatment for dehydration or dehydrogenation, and high-performance thin film transistors which can be mass-produced are realized.

In this specification, heat treatment in an inert gas atmosphere of nitrogen or a rare gas (such as argon or helium) is referred to as heat treatment for dehydration or dehydrogenation. In this specification, dehydrogenation does not refer to only elimination in the form of $H_2$ by the heat treatment, and dehydration or dehydrogenation also refers to elimination of H, OH, and the like for convenience.

In the case where heat treatment is performed in the atmosphere of an inert gas such as nitrogen or a rare gas (argon, helium, or the like), the oxide semiconductor layers are changed into oxygen-deficient oxide semiconductor layers by the heat treatment so as to be low-resistant oxide semiconductor layers, that is, N-type (e.g., $N^-$-type) oxide semiconductor layers.

Further, a region overlapping with the drain electrode layer is formed as a high-resistance drain region (also referred to as an HRD region) which is an oxygen-deficient region, and a region overlapping with the source electrode layer is formed as a high-resistance source region (also referred to as an HRS region) which is an oxygen-deficient region.

Specifically, the carrier concentration of each of the high-resistance drain region and the high-resistance source region is higher than or equal to $1 \times 10^{18}/cm^3$ and is at least higher than the carrier concentration of a channel formation region (lower than $1 \times 10^{18}/cm^3$). Note that the carrier concentration in this specification is obtained by Hall effect measurement at room temperature. In accordance with the gradient of the electrical resistivity (conductivity) of the high-resistance drain region (source region), the high-resistance drain region (source region) is referred to as a first high-resistance drain region (or a first high-resistance source region) or a second high-resistance drain region (or a second high-resistance source region) in some cases in this specification. In addition, in the description of this specification, the first high-resistance drain region has lower electrical resistivity (that is, has higher conductivity) than the second high-resistance drain region.

Then, the channel formation region is formed by making at least part of the stack of the first oxide semiconductor layer and the second oxide semiconductor layer, which are dehydrated or dehydrogenated, be in an oxygen-excess state so as to have high resistance, that is, to be i-type. Note that as the treatment for making the first oxide semiconductor layer and the second oxide semiconductor layer which are dehydrated or dehydrogenated be in an oxygen-excess state, deposition by a sputtering method of the oxide insulating film which is in contact with the stack of the first oxide semiconductor layer and the second oxide semiconductor layer, which are dehydrated or dehydrogenated; heat treatment or heat treatment in an atmosphere containing oxygen, or cooling treatment in an oxygen atmosphere or in ultra-dry air (having a dew point of −40° C. or lower, preferably −60° C. or lower), after heat treatment in an inert gas atmosphere, after the deposition of the oxide insulating film; or the like is performed.

At least part (part overlapping with the gate electrode layer) of the stack of the dehydrated or dehydrogenated first oxide semiconductor layer and the dehydrated or dehydrogenated second oxide semiconductor layer serves as the channel formation region by the treatment which causes an oxygen-excess state; therefore, the first oxide semiconductor layer and the second oxide semiconductor layer can be selectively placed into an oxygen-excess state and can be resistance-increased layers, that is, i-type oxide semiconductor layers.

Accordingly, it is possible to manufacture and provide a semiconductor device including a highly reliable thin film transistor having favorable electric characteristics.

Note that by forming the first high-resistance drain region and the second high-resistance drain region in the oxide semiconductor layers overlapping with the drain electrode layer (and the source electrode layer), the reliability when a driver circuit is formed can be improved. Specifically, by forming the first high-resistance drain region and the second high-resistance drain region, a structure can be employed in which conductivity can be varied gradually from the drain electrode layer to the second high-resistance drain region, the first high-resistance drain region, and the channel formation region. Therefore, in the case where the thin film transistor operates using the drain electrode layer connected to a wiring for supplying a high power supply potential VDD, the first high-resistance drain region and the second high-resistance region serve as buffers and a high electric field is not applied locally even if the high electric field is applied between the gate electrode layer and the drain electrode layer, so that the withstand voltage of the transistor can be improved.

In addition, the first high-resistance drain region and the second high-resistance drain region are formed in the oxide semiconductor layers overlapping with the drain electrode layer (and the source electrode layer), so that increase of on current and reduction of leakage current can be achieved in the channel formation region in forming the driver circuit. In particular, when the first high-resistance drain region, the second high-resistance drain region, the first high-resistance source region, and the second high-resistance source region are formed, leakage current between the drain electrode layer and the source electrode layer of the transistor flows through the drain electrode layer, the first high-resistance drain region, the second high-resistance drain region, the channel formation region, the first high-resistance source region, the second high-resistance source region, and the source electrode layer in this order. In this case, in the channel formation region, leakage current flowing from the first high-resistance drain region and the second high-resistance drain region on the drain electrode layer side to the channel formation region can be concentrated on the vicinity of an interface between the channel formation region and a gate insulating layer which has high resistance when the transistor is off. Thus, the amount of leakage current in a back channel portion (part of a surface of the channel formation which is apart from the gate electrode layer) can be reduced.

Further, the first high-resistance source region and the second high-resistance source region which overlap with the source electrode layer, and the first high-resistance drain region and the second high-resistance drain region which overlap with the drain electrode layer overlap with each other with part of the gate electrode layer and the gate insulating layer interposed therebetween depending on the width of the gate electrode layer, and the intensity of an electric field in the vicinity of an end portion of the drain electrode layer can be reduced more effectively.

Moreover, as a display device including a driver circuit, a light-emitting display device in which a light-emitting element is used and a display device in which an electrophoretic display element is used, which is also referred to as an "electronic paper", are given in addition to a liquid crystal display device.

In the light-emitting display device in which a light-emitting element is used, a plurality of thin film transistors are included in a pixel portion, and in the pixel portion, there is a region where a gate electrode of a thin film transistor is connected to a source wiring or a drain wiring of another thin film transistor. In addition, in a driver circuit of the light-emitting display device in which a light-emitting element is used, there is a region where a gate electrode of a thin film transistor is connected to a source wiring or a drain wiring of the thin film transistor.

Further, by manufacturing a matrix circuit and a driver circuit over one substrate, manufacturing cost of the semiconductor device is reduced. The driver circuit includes, for example, a logic circuit in which emphasis is placed on the speed of operation. A thin film transistor including the stack of the first oxide semiconductor layer and the second oxide semiconductor layer is used in such a circuit while a thin film transistor including a single layer of a third oxide semiconductor layer is used in another circuit. In such a manner, structures of the thin film transistors are different between the circuit in which emphasis is placed on the speed of operation, such as a logic circuit, and another circuit.

Since a thin film transistor is easily broken due to static electricity or the like, a protective circuit for protecting the thin film transistor for the pixel portion is preferably provided over the same substrate for a gate line or a source line. The protective circuit is preferably formed with a non-linear element including an oxide semiconductor layer.

Note that the ordinal numbers such as "first" and "second" in this specification are used for convenience and do not denote the order of steps and the stacking order of layers. In addition, the ordinal numbers in this specification do not denote particular names which specify the present invention.

With use of the stack of the first oxide semiconductor layer and the second oxide semiconductor layer, a semiconductor device including a thin film transistor with excellent electric characteristics can be realized. The periphery and the side surface of the stack of the oxide semiconductor layers are covered with the oxide insulating layer, so that leakage current can be reduced. The oxide insulating layer covering the periphery and the side surface of the stack of the oxide semiconductor layers is formed in the same step as the oxide insulating layer functioning as the channel protective layer.

Further, the thin film transistor including the stack of the oxide semiconductor layers and a thin film transistor including a single layer of an oxide semiconductor layer are formed over one substrate, whereby plural kinds of circuits can be manufactured.

BRIEF DESCRIPTION OF DRAWINGS

FIGS. 3A and 3B are cross-sectional views illustrating an embodiment of the present invention;

FIGS. 4A1 and 4A2 and FIGS. 4B1 and 4B2 are plan views and cross-sectional views of an embodiment of the present invention;

FIGS. 6A and 6B are cross-sectional views of an embodiment of the present invention;

FIGS. 10A1 and 10A2 and FIG. 10B illustrate a semiconductor device of an embodiment of the present invention;

FIGS. 36A and 36B each illustrate a semiconductor device of an embodiment of the present invention.

BEST MODE FOR CARRYING OUT THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

Embodiment 1

In this embodiment, one embodiment of a semiconductor device and a manufacturing method of the semiconductor device will be described with reference to FIGS. 1A to 1C, FIGS. 2A to 2E, FIGS. 3A and 3B, and FIGS. 4A1 and 4A2 and 4B1 and 4B2.

Figure 1A:
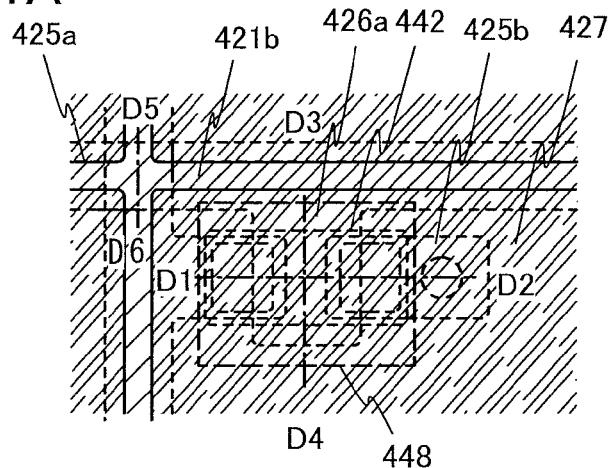
FIG. 1A is a plan view and FIGS. 1B and 1C are cross-sectional views of an embodiment of the present invention.
Figure 1B:
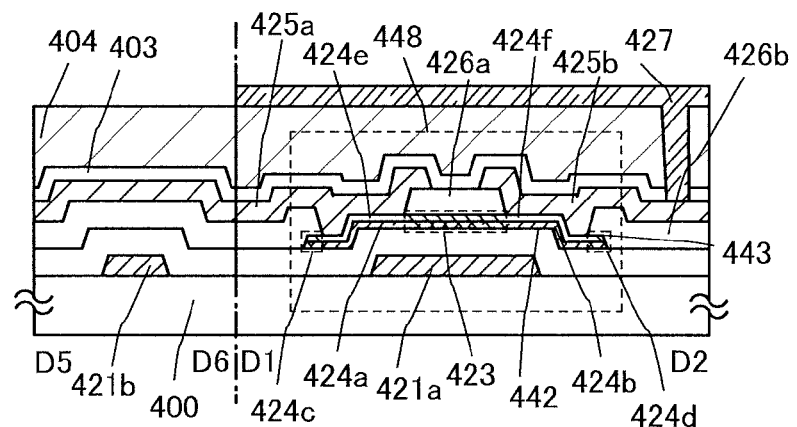
Figure 1C:
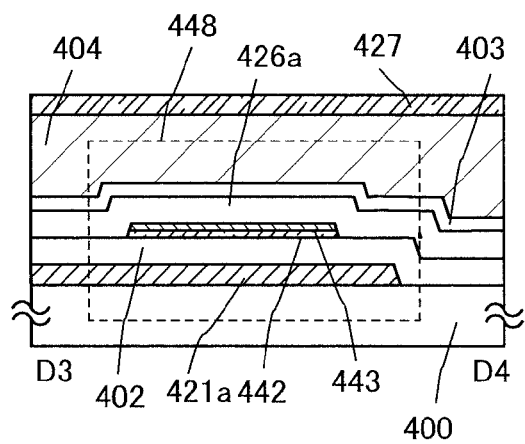

FIG. 1A is a plan view of a channel-protective thin film transistor 448 provided in a pixel, and FIG. 1B is a cross-sectional view taken along line D1-D2 and D5-D6 of FIG. 1A. FIG. 1C is a cross-sectional view taken along line D3-D4 of FIG. 1A. Note that FIG. 2E is the same cross-sectional view as FIG. 1B.

The thin film transistor 448 provided in the pixel is a channel-protective (also called channel-stop) thin film transistor, which includes, over a substrate 400 having an insulating surface, a gate electrode layer 421a; a gate insulating layer 402; a first oxide semiconductor layer 442 and a second oxide semiconductor layer 443 which include a channel formation region 423, an oxide insulating layer 426a functioning as a channel protective layer; a source electrode layer 425a; and a drain electrode layer 425b. In addition, a protective insulating layer 403 is provided to cover the thin film transistor 448 and be in contact with the oxide insulating layer 426a, the source electrode layer 425a, and the drain electrode layer 425b, and a planarizing insulating layer 404 is stacked thereover. Over the planarizing insulating layer 404, a pixel electrode layer 427 is provided, which is in contact with the drain electrode layer 425b and thus is electrically connected to the thin film transistor 448.

Note that an example in which the first oxide semiconductor layer 442 and the second oxide semiconductor layer 443 are stacked is as follows. First, the first oxide semiconductor layer 442 is formed over the gate insulating layer 402 in an atmosphere of a rare gas such as argon and an oxygen gas using a sputtering method. Next, without exposure to the air, the second oxide semiconductor layer 443 is formed over the first oxide semiconductor layer 442 by a sputtering method in an atmosphere of a rare gas such as argon and an oxygen gas, using an oxide semiconductor including an insulating oxide such as silicon oxide. As a result, the first oxide semiconductor layer has lower electrical resistivity (that is, has higher conductivity) than the second oxide semiconductor layer including an insulating oxide such as silicon oxide. By manufacturing a thin film transistor using this stack of the first oxide semiconductor layer 442 and the second oxide semiconductor layer 443, a thin film transistor with excellent electrical characteristics (for example, electrical field effect mobility) can be obtained.

Here, the first oxide semiconductor layer 442 and the second oxide semiconductor layer 443 are formed in the following conditions: an oxide semiconductor target including In, Ga, and Zn ($In_2O_3$:$Ga_2O_3$:ZnO=1:1:1 [mol %] and In:Ga:Zn=1:1:0.5 [at %]) is used; the distance between the substrate and the target is 100 mm; the pressure is 0.2 Pa; the direct current (DC) power is 0.5 kW; and the atmosphere is an atmosphere of argon and oxygen (argon:oxygen=30 sccm:20 sccm and the oxygen flow rate is 40%). Note that a pulse direct current (DC) power supply is preferable because dust can be reduced and the film thickness can be uniform.

Note that examples of a sputtering method include an RF sputtering method in which a high-frequency power source is used for a sputtering power source, a DC sputtering method, and a pulsed DC sputtering method in which a bias is applied in a pulsed manner. An RF sputtering method is mainly used in the case where an insulating film is formed, and a DC sputtering method is mainly used in the case where a metal film is formed.

In addition, there is also a multi-source sputtering apparatus in which a plurality of targets of different materials can be set. With the multi-source sputtering apparatus, films of different materials can be formed to be stacked in the same chamber, or a film of plural kinds of materials can be formed by electric discharge at the same time in the same chamber.

In addition, there are a sputtering apparatus provided with a magnet system inside the chamber and used for a magnetron sputtering, and a sputtering apparatus used for an ECR sputtering in which plasma generated with the use of microwaves is used without using glow discharge.

Furthermore, as a deposition method by sputtering, there are also a reactive sputtering method in which a target substance and a sputtering gas component are chemically reacted with each other during deposition to form a thin compound film thereof, and a bias sputtering in which a voltage is also applied to a substrate during deposition.

The thin film transistor 448 used for the pixel includes the stacked-layer film of the first oxide semiconductor layer 442 and the second oxide semiconductor layer 443, which include a first high-resistance source region 424a, a second high-resistance source region 424e, a first high-resistance drain region 424b, a second high-resistance drain region 424f, and channel formation region 423. The first high-resistance source region 424a is formed and the second high-resistance source region 424e is formed thereover in contact with a bottom surface of the source electrode layer 425a. Further, the first high-resistance drain region 424b and the second high-resistance drain region 424f are formed in contact with a bottom surface of the drain electrode layer 425b. Even if a high electric field is applied to the thin film transistor 448, the first high-resistance source region 424a, the second high-resistance source region 424e, the first high-resistance drain region 424b, and the second high-resistance drain region 424f serve as buffers; therefore, a local high electric field is not applied. In this manner, the thin film transistor 448 has a structure in which withstand voltage is improved. Note that regions where the first oxide semiconductor layer 442 and the second oxide semiconductor layer 443 overlap and are in contact with the first oxide insulating layer 426a and the second oxide insulating layer 426b are referred to as first regions. Furthermore, in the first oxide semiconductor layer 442 and the second oxide semiconductor layer 443, regions where the second oxide semiconductor layer 443 overlaps and is in contact with the source electrode layer 425a and the drain electrode layer 425b are referred to as second regions.

The channel formation region 423 of the thin film transistor 448 provided in the pixel is a region which is included in a stacked-layer film of the first oxide semiconductor layer 442 and the second oxide semiconductor layer 443, is in contact with the oxide insulating layer 426a that is a channel protective layer, and overlaps with the gate electrode layer 421a. Since the thin film transistor 448 is protected by the oxide insulating layer 426a, the second oxide semiconductor layer 442 can be prevented from being etched in the etching step where the source electrode layer 425a and the drain electrode layer 425b are formed.

In order to realize a display device having a high aperture ratio, the source electrode layer 425a and the drain electrode layer 425b are formed using a light-transmitting conductive film, whereby the thin film transistor 448 as a light-transmitting thin film transistor is provided.

In addition, the gate electrode layer 421a of the thin film transistor 448 is formed using a light-transmitting conductive film.

In the pixel provided with the thin film transistor 448, the pixel electrode layer 427, another electrode layer such as a capacitor electrode layer, or a wiring layer such as a capacitor wiring layer is formed using a conductive film transmitting visible light, so that a display device having a high aperture ratio is realized. Needless to say, each of the gate insulating layer 402 and the oxide insulating layer 426a is preferably formed using a film transmitting visible light.

In this specification, a film transmitting visible light indicates a film having such a thickness as to have transmittance of visible light of 75% to 100%. In the case where the film has conductivity, the film is referred to as a transparent conductive film. Further, a conductive film which is semi-transmissive with respect to visible light may be used for metal oxide applied to the gate electrode layer, the source electrode layer, the drain electrode layer, the pixel electrode layer, another electrode layer, or another wiring layer. The conductive film which is semi-transmissive with respect to visible light indicates a film having transmittance of visible light of 50% to 75%.

In order to reduce parasitic capacitance, the gate insulating layer 402 and the oxide insulating layer 426b are provided between a gate electrode layer 421b and the source electrode layer 425a in a wiring intersection where a gate wiring and a source wiring are intersected with each other. Note that although the oxide insulating layer 426a which overlaps with the channel formation region 423 and the oxide insulating layer 426b which does not overlap with the channel formation region 423 are denoted by reference numerals different from each other, they are formed using the same material by the same step.

Hereinafter, manufacturing steps of the thin film transistor 448 and the wiring intersection over one substrate will be described with reference to FIGS. 2A to 2E. Besides the thin film transistor in the pixel portion, a thin film transistor in a driver circuit may be formed. The thin film transistor in the driver circuit can be formed over the same substrate, by the same steps.

First, a light-transmitting conductive film is formed over the substrate 400 having an insulating surface, and then a first photolithography step is performed to form the gate electrode layers 421a and 421b. In the pixel portion, with use of the same light-transmitting material as that of the gate electrode layers 421a and 421b, a capacitor wiring layer is formed by the first photolithography step. In the case of forming the driver circuit as well as the pixel portion, a capacitor wiring layer is provided for the driver circuit if a capacitor is needed therefor. Note that a resist mask may be formed by an inkjet method. Formation of the resist mask by an inkjet method needs no photomask; thus, manufacturing cost can be reduced.

Note that as the above glass substrate, a substrate formed of an insulator such as a ceramic substrate, a quartz substrate, or a sapphire substrate may be used. Alternatively, crystallized glass or the like may be used.

An insulating film serving as a base film may be provided between the substrate 400 and the gate electrode layers 421a and 421b. The base film has a function of preventing diffusion of an impurity element from the substrate 400, and can be formed to have a single-layer or stacked-layer structure using one or more of a silicon nitride film, a silicon oxide film, a silicon nitride oxide film, and a silicon oxynitride film.

As a material of the gate electrode layers 421a and 421b, a conductive material transmitting visible light can be used. For example, any of the following metal oxide can be applied: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness thereof can be set in the range of from 50 nm to 300 nm inclusive as appropriate. The metal oxide used for the gate electrode layers 421a and 421b is deposited by a sputtering method, a vacuum evaporation method (an electron beam evaporation method, or the like), an arc discharge ion plating method, or a spray method. In the case of using a sputtering method, deposition is performed with use of a target containing $SiO_2$ at from 2 wt. % to 10 wt. % inclusive, so that $SiO_x$ (x>0) which hinders crystallization is included in the light-transmitting conductive film. Thus, it is preferable that the light-transmitting conductive film be prevented from being crystallized in heat treatment for dehydration or dehydrogenation performed later.

Then, the gate insulating layer 402 is formed over the gate electrode layers 421a and 421b.

The gate insulating layer 402 can be formed to have a single layer of a silicon oxide layer, a silicon nitride layer, a silicon oxynitride layer, a silicon nitride oxide layer, or an aluminum oxide layer or a stacked layer thereof by a plasma CVD method, a sputtering method, or the like. For example, a silicon oxynitride layer may be formed by a plasma CVD method using $SiH_4$, oxygen, and nitrogen as a film formation gas. The gate insulating layer 402 has a thickness from 100 nm to 500 nm inclusive. In the case of a stacked-layer structure, a first gate insulating layer with a thickness from 50 nm to 200 nm inclusive and a second gate insulating layer with a thickness from 5 nm to 300 nm inclusive are stacked in this order.

In this embodiment, the gate insulating layer 402 is a silicon nitride layer with a thickness of 200 nm or smaller formed by a plasma CVD method.

Next, a first oxide semiconductor film is formed over the gate insulating layer 402. The first oxide semiconductor film is formed using a sputtering method, a vacuum evaporation method, a coating method, or the like, to a thickness of greater than 0 nm and less than 10 nm, preferably greater than or equal to 3 nm and less than or equal to 5 nm. Note that for the first oxide semiconductor film, a material which becomes an oxide having lower electrical resistivity than the second oxide semiconductor layer which is formed over and in contact with the first oxide semiconductor film later is used.

Next, a second oxide semiconductor film with a thickness of 2 nm to 200 nm inclusive is formed over the first oxide semiconductor film. Here, the second oxide semiconductor film is formed using a sputtering method, a vacuum evaporation method, a coating method, or the like so as to include an insulating oxide such as silicon oxide. In order that the oxide semiconductor films are amorphous even after heat treatment for dehydration or dehydrogenation which follows the formation of the second oxide semiconductor film, the total thickness of the first oxide semiconductor film and the second oxide semiconductor film is preferably small, a thickness of 50 nm or less. When the second oxide semiconductor film is thinly formed using an oxide semiconductor film including silicon oxide, in the case where heat treatment is performed after formation of the second oxide semiconductor layer, crystallization of the second oxide semiconductor layer can be suppressed.

The first oxide semiconductor film and the second oxide semiconductor film are formed using an In—Ga—Zn—O-based non-single-crystal film, or includes an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, a Sn—Al—Zn—O-based oxide semiconductor, an In—Zn—O-based oxide semiconductor, a Sn—Zn—O-based oxide semiconductor, an Al—Zn—O-based oxide semiconductor, an In—O-based oxide semiconductor, a Sn—O-based oxide semiconductor, or a Zn—O-based oxide semiconductor. In this embodiment, the first oxide semiconductor film is formed by a sputtering method with use of an In—Ga—Zn—O based oxide semiconductor target. Further, the oxide semiconductor film can be formed by a sputtering method in a rare gas (typically argon) atmosphere, an oxygen atmosphere, or an atmosphere of a rare gas (typically argon) and oxygen. Deposition of the second oxide semiconductor film is performed by a sputtering method with use of a target containing $SiO_2$ at from 2 wt. % to 10 wt. % inclusive, so that $SiO_x$ (x>0) which hinders crystallization is included in the oxide semiconductor film. Thus, it is preferable that the oxide semiconductor film be prevented from being crystallized in heat treatment for dehydration or dehydrogenation performed later.

The first oxide semiconductor film and the second oxide semiconductor film can be simply referred to as oxide semiconductors, and preferably can be referred to as oxide semiconductors including In, more preferably oxide semiconductors including In and Ga.

Then, the stack of the first oxide semiconductor film and the second oxide semiconductor film is processed through a second photolithography step to be the island-shaped first oxide semiconductor layer 442 and the island-shaped second oxide semiconductor layer 443. Further, a resist mask for forming the island-shaped first oxide semiconductor layer 442 and the island-shaped second oxide semiconductor layer 443 may be formed using an ink jet method. When the resist mask is formed using an ink jet method, a photomask is not used; therefore, manufacturing cost can be reduced.

Next, the island-shaped first oxide semiconductor layer 442 and the island-shaped second oxide semiconductor layer 443 are dehydrated or dehydrogenated. First heat treatment for dehydration or dehydrogenation is performed at a temperature which is higher than or equal to 400° C. and lower than a strain point of the substrate, preferably, 425° C. or higher. Note that in the case of the temperature of 425° C. or higher, the heat treatment time may be one hour or shorter, whereas in the case of the temperature that is lower than 425° C., the heat treatment time is longer than one hour. Here, the substrate is introduced into an electric furnace which is one of heat treatment apparatuses, and heat treatment is performed on the island-shaped first oxide semiconductor layer 442 and the island-shaped second oxide semiconductor layer 443 in a nitrogen atmosphere. After that, the island-shaped first oxide semiconductor layer 442 and the island-shaped second oxide semiconductor layer 443 are not exposed to air, which prevents reincorporation of water and hydrogen thereinto, so that the dehydrated or dehydrogenated oxide semiconductor layers are obtained. In this embodiment, one furnace used in heat treatment is continuously used up to the time when the temperature is lowered from the heat temperature T at which dehydration or dehydrogenation of the oxide semiconductors is performed to the temperature which is enough to prevent reincorporation of water. Specifically, slow cooling is performed in a nitrogen atmosphere up to the time when the temperature becomes lower than the heat temperature T by 100° C. or more. Without being limited to a nitrogen atmosphere, dehydration or dehydrogenation is performed in a rare gas atmosphere, such as helium, neon, or argon.

Note that in the first heat treatment, it is preferable that moisture, hydrogen, and the like be not contained in nitrogen or a rare gas such as helium, neon, or argon. In addition, nitrogen or a rare gas such as helium, neon, or argon which is introduced into a heat treatment apparatus preferably has a purity of 6N (99.9999%) or higher, more preferably 7N (99.99999%) or higher (that is, the concentration of impurities is 1 ppm or lower, preferably 0.1 ppm or lower).

Depending on conditions of the first heat treatment and the materials of the island-shaped first oxide semiconductor layer 442 and the island-shaped second oxide semiconductor layer 443, the oxide semiconductor layers may crystallize to be microcrystalline films or polycrystalline films.

Alternatively, the first heat treatment may be performed on the first oxide semiconductor layer 442 and the second oxide semiconductor layer 443 which have not yet been processed into the island-shaped oxide semiconductor layers. In that case, the substrate is taken out from the heat apparatus after the first heat treatment, and then a photolithography step is performed.

Figure 2A:
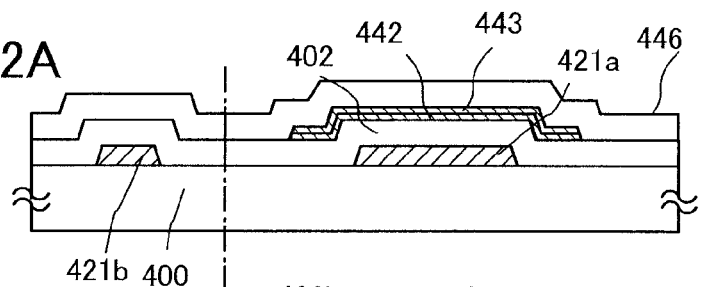
FIGS. 2A to 2E are cross-sectional views illustrating manufacturing steps of an embodiment of the present invention.

Next, an oxide insulating film is formed over the gate insulating layer 402 and the island-shaped second oxide semiconductor layer 443 (see FIG. 2A).

Next, through a third photolithography step, a resist mask is formed, etching is selectively performed to form the oxide insulating layers 426a and 426b, and then, the resist mask is removed. At this stage, the stack of the island-shaped first oxide semiconductor layer 442 and the island-shaped second oxide semiconductor layer 443 has a region in contact with the oxide insulating layer. This region includes the channel formation region 423 corresponding to a region where the gate electrode layer and the oxide insulating layer 426a overlap with each other with the gate insulating layer interposed therebetween. Regions 424c and 424d which overlap with the oxide insulating layer 426b covering the periphery and the side surface of the stack of the island-shaped first oxide semiconductor layer 442 and the island-shaped second oxide semiconductor layer 443 are also formed.

Each of the oxide insulating layers 426a and 426b can be formed to have a thickness at least 1 nm or larger as appropriate by a sputtering method, or the like, that is a method with which impurities such as water and hydrogen are not mixed into the oxide insulating film. In this embodiment, a 300-nm-thick silicon oxide film is formed by a sputtering method, as the oxide insulating film. The substrate temperature in film formation may be higher than or equal to room temperature and lower than or equal to 300° C., and in this embodiment, room temperature. The formation of the silicon oxide film by a sputtering method can be performed in a rare gas (typically, argon) atmosphere, an oxygen atmosphere, or an atmosphere of a rare gas (typically, argon) and oxygen. As a target, a silicon oxide target or a silicon target can be used. For example, with use of a silicon target, a silicon oxide film can be formed by a sputtering method in an atmosphere of oxygen and nitrogen. As the oxide insulating film which is formed in contact with the oxide semiconductor layer whose resistance is reduced, an inorganic insulating film which does not include impurities such as moisture, a hydrogen ion, and OH$^-$ and blocks entry of these from the outside is used. Specifically, a silicon oxide film, a silicon nitride oxide film, an aluminum oxide film, or an aluminum oxynitride film is used.

Figure 2B:
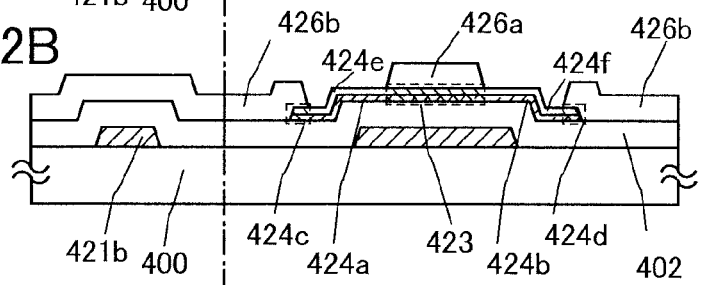
Figure 2C:
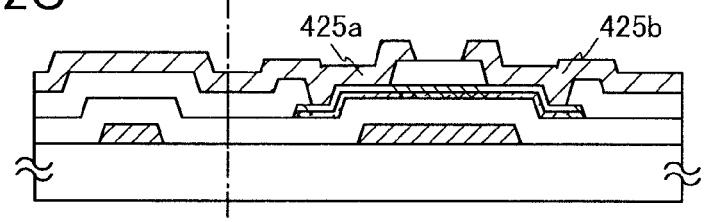

Next, second heat treatment is performed in an inert gas atmosphere or a nitrogen atmosphere at a preferable temperature from 200° C. to 400° C. inclusive, for example, from 250° C. to 350° C. inclusive (see FIG. 2B). For example, second heat treatment is performed at 250° C. for one hour in a nitrogen atmosphere. In the second heat treatment, end portions of the island-shaped first oxide semiconductor layer 442 and the island-shaped second oxide semiconductor layer 443, which overlap with the oxide insulating layer 426b, and parts of the island-shaped first oxide semiconductor layer 442 and the island-shaped second oxide semiconductor layer 443, which overlap with the oxide insulating layer 426a, are heated while being in contact with the oxide insulating layers. Note that in the second heat treatment, parts of the island-shaped first oxide semiconductor layer 442 and the island-shaped second oxide semiconductor layer 443 which do not overlap with the oxide insulating layer are heated while being exposed. When heat treatment is performed in a nitrogen or an inert gas atmosphere while the stack of the island-shaped first oxide semiconductor layer 442 and the island-shaped second oxide semiconductor layer 443 is exposed, the resistance of resistance-increased (i-type) regions which are exposed in the island-shaped first oxide semiconductor layer 442 and the island-shaped second oxide semiconductor layer 443 (the first high-resistance source region 424a, the second high-resistance source region 424e, the first high-resistance drain region 424b, and the second high-resistance drain region 4240 can be reduced. In addition, the oxide insulating layer 426a is provided over and in contact with the channel formation region of the stack of the island-shaped first oxide semiconductor layer 442 and the island-shaped second oxide semiconductor layer 443, and functions as a channel protective layer.

Next, a light-transmitting conductive film is formed over the gate insulating layer 402, the oxide insulating layers 426a and 426b, the island-shaped first oxide semiconductor layer 442, and the island-shaped second oxide semiconductor layer 443. After that, through a fourth photolithography step, a resist mask is formed, and etching is performed selectivity to form the source electrode layer 425a and the drain electrode layer 425b (see FIG. 2C). The light-transmitting conductive film is formed by a sputtering method, a vacuum evaporation method (e.g., an electron beam evaporation method, or the like), an arc discharge ion plating method, or a spray method. As a material of the conductive film, a conductive material transmitting visible light can be used. For example, any of the following metal oxide can be used: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. The thickness of the conductive film is set in the range of from 50 nm to 300 nm inclusive as appropriate. In the case of using a sputtering method, deposition is performed with use of a target containing SiO$_2$ at from 2 wt. % to 10 wt. % inclusive, so that SiO$_x$ (x>0) which hinders crystallization is included in the light-transmitting conductive film. Thus, it is preferable that the light-transmitting conductive film be prevented from being crystallized in heat treatment performed later.

Note that a resist mask used for formation of the source electrode layer 425a and the drain electrode layer 425b may be formed by an inkjet method. Formation of the resist mask by an inkjet method needs no photomask; thus, manufacturing cost can be reduced.

Next, the protective insulating layer 403 is formed over the oxide insulating layers 426a and 426b, the source electrode layer 425a, and the drain electrode layer 425b. In this embodiment, a silicon nitride film is formed by an RF sputtering method. An RF sputtering method has superiority in mass production and thus is a preferable method for forming the protective insulating layer 403. The protective insulating layer 403 does not contain impurities such as moisture, a hydrogen ion, and OH$^-$ and is formed using an inorganic insulating film which prevents the impurities from entering from the outside. Specifically, a silicon nitride film, an aluminum nitride film, a silicon nitride oxide film, an aluminum oxynitride film, or the like is used. Needless to say, the protective insulating layer 403 is a light-transmitting insulating film.

Then, the planarizing insulating layer 404 is formed over the protective insulating layer 403. The planarizing insulating layer 404 can be formed from an organic material having heat resistance, such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. The planarizing insulating layer 404 may be formed by stacking a plurality of insulating films formed of these materials.

Note that the siloxane-based resin corresponds to a resin including a Si—O—Si bond formed using a siloxane-based material as a starting material. The siloxane-based resin may include as a substituent an organic group (e.g., an alkyl group or an aryl group) or a fluoro group. In addition, the organic group may include a fluoro group.

The formation method of the planarizing insulating layer 404 is not limited to a particular method, and the following method can be used depending on the material: a sputtering method, an SOG method, a spin coating method, a dipping method, a spray coating method, a droplet discharge method (an inkjet method, screen printing, offset printing, or the like), or the like. Further, the planarization insulating layer 404 can be formed with a doctor knife, a roll coater, a curtain coater, a knife coater, or the like.

Figure 2D:
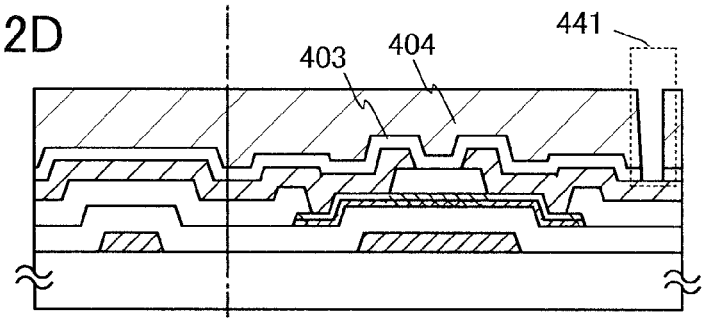
Figure 2E:
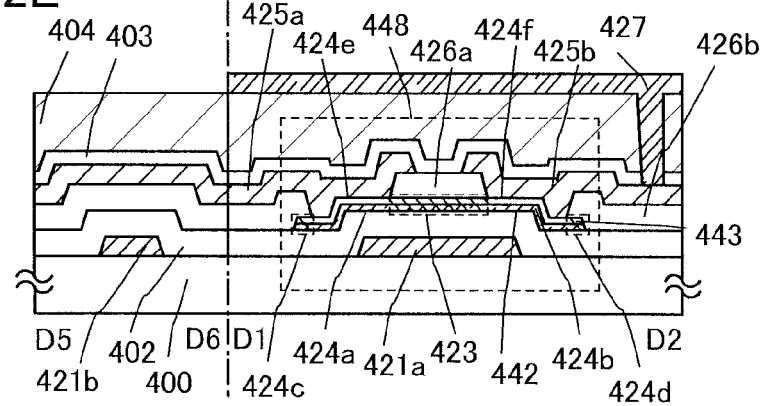

Next, a fifth photolithography step is performed. A resist mask is formed, and the planarizing insulating layer 404 and the protective insulating layer 403 are etched, so that a contact hole 441 which reaches the drain electrode layer 425b is formed. Then, the resist mask is removed (see FIG. 2D). As illustrated in FIG. 2D, the oxide insulating layer 426b is provided below the contact hole, which results in that the thickness of the planarization insulating layer to be removed can be small as compared to the case where the oxide insulating layer is not provided below the contact hole; accordingly, etching time can be shortened. In addition, as compared to the case where the oxide insulating layer is not provided below the contact hole, the depth of the contact hole 441 can be shallow; accordingly, the coverage with a light-transmitting conductive film can be favorable, which is formed later and located in a region overlapping with the contact hole 441. Besides, a contact hole reaching the gate electrode layer 421b is also formed in this etching. A resist mask used for formation of the contact hole reaching the drain electrode layer 425b may be formed by an inkjet method. Formation of the resist mask by an inkjet method needs no photomask; thus, manufacturing cost can be reduced.

Then, the light-transmitting conductive film is formed. The light-transmitting conductive film is formed using indium oxide ($In_2O_3$), an alloy of indium oxide and tin oxide ($In_2O_3$—$SnO_2$, abbreviated as ITO), or the like by a sputtering method, a vacuum evaporation method, or the like. Alternatively, an Al—Zn—O-based non-single-crystal film including nitrogen, that is, an Al—Zn—O—N-based non-single-crystal film, a Zn—O—N-based non-single-crystal film, or a Sn—Zn—O—N-based non-single-crystal film may be used. Note that the percentage (atomic %) of zinc in the Al—Zn—O—N-based non-single-crystal film is less than or equal to 47 atomic % and is higher than that of aluminum in the non-single-crystal film; the percentage (atomic %) of aluminum in the non-single-crystal film is higher than that of nitrogen in the non-single-crystal film. Such a material is etched with a hydrochloric acid-based solution. However, since a residue is easily generated particularly in etching ITO, indium oxide-zinc oxide alloy ($In_2O_3$—ZnO) may be used to improve etching processability.

Note that the unit of the percentage of components in the light-transmitting conductive film is atomic percent, and the percentage of components is evaluated by analysis using an electron probe X-ray microanalyzer (EPMA).

Next, a sixth photolithography step is performed. A resist mask is formed, and an unnecessary portion of the light-transmitting conductive film is removed by etching to form a pixel electrode layer 427. Then, the resist mask is removed (see FIG. 2E).

Through the above steps, with use of the six masks, the thin film transistor 448 and the wiring intersection with reduced parasitic capacitance can be formed over the same substrate. The thin film transistor 448 provided in the pixel is a channel-protective thin film transistor which includes the stack of the first oxide semiconductor layer 442 and the second oxide semiconductor layer 443, which includes the first high-resistance source region 424a, the second high-resistance source region 424e, the first high-resistance drain region 424b, the second high-resistance drain region 424f, and the channel formation region 423. Accordingly, even if a high electric field is applied to the thin film transistor 448, the first high-resistance source region 424a, the second high-resistance source region 424e, the first high-resistance drain region 424b, and the second high-resistance drain region 424f serve as buffers; therefore, a local high electric field is not applied. In this manner, the thin film transistor 448 has a structure in which withstand voltage is improved.

In addition, a storage capacitor formed with the capacitor wiring layer and the capacitor electrode, in which the gate insulating layer 402 is used as a dielectric, can be formed over the same substrate. By arranging the thin film transistor 448 and the storage capacitor in each pixel of a pixel portion in which pixels are arranged in a matrix form, one of the substrates for manufacturing an active matrix display device can be obtained. In this specification, such a substrate is referred to as an active matrix substrate for convenience.

Further, a thin film transistor for a driver circuit can be provided over the same substrate. By providing the driver circuit and the pixel portion over the same substrate, connection wirings between the driver circuit and an external signal can be shortened; thus, reduction in size and cost of the semiconductor device can be achieved.

In the thin film transistor 448 for the pixel illustrated in FIG. 1B, the stack of the first oxide semiconductor layer 442 and the second oxide semiconductor layer 443 is provided with the regions 424c and 424d which overlap with the oxide insulating layer 426b and are positioned in the peripheral portion of the stack of the first oxide semiconductor layer 442 and the second oxide semiconductor layer 443. The regions 424c and 424d which are peripheral portions of the stack of the first oxide semiconductor layer 442 and the second oxide semiconductor layer 443 are in an oxygen-excess state, as well as the channel formation region 423. By the regions 424c and 424d, reduction in leak current and parasitic capacitance can be achieved when the stack of the first oxide semiconductor layer 442 and the second oxide semiconductor layer 443 and a wiring having potential different from the oxide semiconductor layers are arranged to be closed each other.

The oxide insulating layer 426b is provided to cover a side surface of the first oxide semiconductor layer 442 having higher conductivity than the second oxide semiconductor layer 443, so that short circuit between the source electrode layer and the drain electrode layer is prevented.

In terms of high integration, it is preferable that especially in the driver circuit, a plurality of wirings and a plurality of oxide semiconductor layers be arranged at small distances therebetween. In such a driver circuit, it is effective to provide the regions 424c and 424d by overlapping the oxide semiconductor layer with the oxide insulating layer 426b so as to reduce leak current and parasitic capacitance. Further, in the case where a plurality of thin film transistors are arranged in series or in parallel, an oxide semiconductor layer is formed in one island among the plurality of thin film transistors, and the oxide semiconductor layer overlaps with the oxide insulating layer 426b, whereby element isolation is formed. Thus, a region overlapping with the oxide insulating layer 426b is an element isolation region. In such a manner, a plurality of thin film transistors can be arranged in a small area, so that the driver circuit can be highly integrated.

Embodiment 2

In this embodiment, an example in which an active matrix liquid crystal display device is manufactured by using the thin film transistor described in Embodiment 1 to form a pixel portion and a drive circuit over one substrate will be described.

FIG. 3A illustrates an example of a cross-sectional structure of the active matrix substrate.

Although the thin film transistor in the pixel portion and the wiring intersection portion are shown in Embodiment 1, the thin film transistor in the drive circuit, the storage capacitor, the gate wiring, and a terminal portion of the source wiring are also shown in this embodiment as well as the thin film transistor and the wiring intersection portion. The capacitor, the gate wiring, and the terminal portion of the source wiring can be formed by the same process as the manufacturing process described in Embodiment 1. Moreover, in a portion to serve as a display region in a pixel portion, the gate wiring, the source wiring, and a capacitor wiring layer are all formed using a light-transmitting conductive film, resulting in high aperture ratio.

In FIG. 3A, a thin film transistor 220 electrically connected to a pixel electrode layer 227 is of a channel-protective thin film transistor and is provided in the pixel portion. In this embodiment, the transistor having the same structure as the thin film transistor 448 of Embodiment 1 is used. In addition, the width in the channel direction of a gate electrode layer of the thin film transistor 220 is smaller than the width of the channel direction of an oxide semiconductor layer of the thin film transistor 220.

A capacitor wiring layer 230, which is formed using the same light-transmitting conductive material and step as the gate electrode layer of the thin film transistor 220, overlaps with a capacitor electrode 231 with a gate insulating layer 202 serving as a dielectric interposed therebetween, thereby forming the storage capacitor. Note that the capacitor electrode 231 is formed using the same light-transmitting material and formation step as the source electrode layer and drain electrode layer of the thin film transistor 220. Since the storage capacitor has light-transmitting property as well as the thin film transistor 220, the aperture ratio can be increased.

The light transmitting property of the storage capacitor is important in increasing the aperture ratio. For small liquid crystal display panels of 10 inches or smaller in particular, a high aperture ratio can be achieved even when the size of pixels is decreased in order to realize higher resolution of display images by increasing the number of gate wirings, for example. Moreover, wide viewing angle is realized by using a light-transmitting film for components in the thin film transistor 220 and the storage capacitor, so that a high aperture ratio can be achieved even when one pixel is divided into a plurality of subpixels. That is, a high aperture ratio can be maintained even when a group of high-density thin film transistors is provided, and the display region can have a sufficient area. For example, when one pixel includes two to four subpixels and storage capacitors, the storage capacitors have light transmitting properties as well as the thin film transistors, so that the aperture ratio can be increased.

Note that the storage capacitor is provided below the pixel electrode layer 227, and the capacitor electrode 231 is electrically connected to the pixel electrode layer 227.

An example in which the storage capacitor is formed using the capacitor electrode 231 and the capacitor wiring layer 230 is described in this embodiment, but there is no particular limitation on the structure forming the storage capacitor. For instance, the storage capacitor may be formed in such a manner that the pixel electrode layer overlaps with the gate wiring of an adjacent pixel with the planarizing insulating layer, the protective insulating layer, and the gate insulating layer interposed therebetween, without the provision of the capacitor wiring layer.

In FIG. 3A, the storage capacitor includes only the gate insulating layer 202 between the capacitor wiring layer and the capacitor electrode so that large capacitance is formed, while the wiring intersection portion includes the gate insulating layer 202 and an oxide insulating layer 266b which are provided between the gate electrode layer 421b and a wiring formed above the gate electrode layer 421b so that parasitic capacitance is reduced. In the storage capacitor, in order that only the gate insulating layer 202 be provided between the capacitor wiring layer and the capacitor electrode, an etching condition or a material of the gate insulating layer is selected such that etching for removing the oxide insulating layer 266b allows only the gate insulating layer 202 to remain. In this embodiment, because the oxide insulating layer 266b is a silicon oxide film formed by a sputtering method and the gate insulating layer 202 is a silicon nitride film formed by a plasma CVD method, the selective removal can be realized. Note that when a material that causes the oxide insulating layer 266b and the gate insulating layer 202 to be removed under the same conditions is used, the thicknesses are preferably set such that at least part of the gate insulating layer can remain and form the capacitor even if the thickness of the gate insulating layer is partly reduced. Since the thickness of the gate insulating layer is preferably reduced in order to form large capacitance in the storage capacitor, the thickness of part of the gate insulating layer above the capacitor wiring may be reduced during the etching for removing the oxide insulating layer 266b.

A thin film transistor 260 is a channel-protective thin film transistor and is provided in the drive circuit. The thin film transistor 260 has a shorter channel length L than the thin film transistor 220 so that higher operation speed is realized. The channel length L of the thin film transistor of a channel protection type which is provided in the drive circuit is preferably set to 0.1 μm to 2 μm inclusive. The width in the channel length direction of a gate electrode layer 261 of the thin film transistor 260 is larger than that of an oxide semiconductor layer of the thin film transistor 260. End faces of the gate electrode layer 261 overlap with a source electrode layer 265a and a drain electrode layer 265b with the gate insulating layer 202 and the oxide insulating layer 266b interposed therebetween.

In addition, the oxide semiconductor layer of the thin film transistor 260 is formed with a single layer of the first oxide semiconductor layer to be thinner than that of the thin film transistor 220, so that operating speed of the thin film transistor 260 is increased. In the case where the oxide semiconductor layer of the thin film transistor 260 is a single layer, since a metal thin film is selectively etched, the number of photomasks is increased by one as compared to that in the case where the oxide semiconductor layer of the thin film transistor 260 is a stacked layer.

The thin film transistor 260 includes: over a substrate 200 having an insulating surface, the gate electrode layer 261; the gate insulating layer 202; the oxide semiconductor layer having at least a channel formation region 263, a high-resistance source region 264a, and a high-resistance drain region 264b; the source electrode layer 265a; and the drain electrode layer 265b. Further, the oxide insulating layer 266a in contact with the channel formation region 263 is also provided.

The gate electrode layer of the thin film transistor 260 in the drive circuit may be electrically connected to a conductive layer 267 provided above the oxide semiconductor layer. In that case, a planarizing insulating layer 204, a protective insulating layer 203, the oxide insulating layer 266b, and the gate insulating layer 202 are selectively etched using the same photomask as the contact hole for electrically connecting the drain electrode layer of the thin film transistor 220 to the pixel electrode layer 227, whereby a contact hole is formed. Through this contact hole, the conductive layer 267 is electrically connected to the gate electrode layer 261 of the thin film transistor 260 in the drive circuit.

For the protective insulating layer 203, an inorganic insulating film such as a silicon nitride film, an aluminum nitride film, a silicon nitride oxide film, an aluminum oxynitride film, or an aluminum oxide film is used. In this embodiment, a silicon nitride film is used.

In the thin film transistor 260, the width of the gate electrode layer 261 is larger than that of the oxide semiconductor layer. The oxide insulating layer 266b overlaps with a peripheral portion of the oxide semiconductor layer and also overlaps with the gate electrode layer 261. The oxide insulating layer 266b serves to increase the distance between the drain electrode layer 265b and the gate electrode layer 261, and reduce the parasitic capacitance formed between the drain electrode layer 265b and the gate electrode layer 261. A region 264c and a region 264d in the oxide semiconductor layer which overlap with the oxide insulating layer 266b are in an oxygen-excess state like the channel formation region 263, and reduce leakage current and also reduce the parasitic capacitance.

It is preferable that part of a gate wiring be made from a metal wiring so that the wiring resistance is reduced, because there is a possibility that the resistance of a light-transmitting wiring might become a problem in the case where the size of a liquid crystal display panel exceeds 10 inches and is set to 60 inches or further, 120 inches. For example, as in FIG. 3A, the source electrode layer 265a and the drain electrode layer 265b are formed using metal wirings (metal electrodes) of Ti or the like.

In this case, the source electrode layer and the drain electrode layer formed of metal electrodes of Ti or the like are formed over and in contact with the dehydrated or dehydrogenated oxide semiconductor layer, the high-resistance source region overlapping with the source electrode layer and the high-resistance drain region overlapping with the drain electrode layer are formed, and a region between the high-resistance source region and the high-resistance drain region serves as the channel formation region.

In addition, in order to reduce wiring resistance, auxiliary electrode layers 268a and 268b formed using metal electrodes having lower resistance are formed over the source electrode layer 265a and the drain electrode layer 265b, as illustrated in FIG. 3A. Also in this case, since the metal wirings (metal electrodes) are formed the number of photomasks is further increased by one as compared to that in Embodiment 1.

The source electrode layer 265a, the drain electrode layer 265b, the auxiliary electrode layers 268a and 268b, and the source electrode layer and the drain electrode layer of the thin film transistor 220 are formed in such a manner that a light-transmitting conductive film and a metal conductive film are stacked and selectively etched through a photolithography step. The metal conducive film over the source electrode layer and the drain electrode layer of the thin film transistor 220 is removed.

Note that when the metal conductive film is etched, respective materials and etching conditions are appropriately adjusted so as not to remove the source electrode and the drain electrode of the thin film transistor 220.

For example, an alkaline etchant is used for selective etching of the metal conductive film. As a material of the metal conductive film, there are an element selected from Al, Cr, Cu, Ta, Ti, Mo, or W, an alloy including the above element, an alloy film in which some of the above elements are combined, and the like. Further, the metal conductive film may have a single-layer structure or a stacked-layer structure of two or more layers. For example, a single-layer structure of an aluminum film including silicon, a two-layer structure in which a titanium film is stacked over an aluminum film, a three-layer structure in which a titanium film, an aluminum film, and a titanium film are stacked in this order, and the like can be given. Alternatively, a film, an alloy film, or a nitride film of a combination of Al and one or plurality of elements selected from the followings may be used: titanium (Ti), tantalum (Ta), tungsten (W), molybdenum (Mo), chromium (Cr), neodymium (Nd), and scandium (Sc).

The drain electrode layer 265a provided between the oxide semiconductor layer and the auxiliary electrode layer 268a formed of a metal material also functions as a low-resistance drain region (also referred to as an LRN region or an LRD region). When the structure with the oxide semiconductor layer, the low-resistance drain region, and the auxiliary electrode layer 268 that is the metal electrode is employed, the withstand voltage of the transistor can be improved. In particular, the carrier concentration of the low-resistance drain region is higher than that of the high-resistance drain region (HRD region), and preferably in the range of $1\times10^{20}/cm^3$ to $1\times10^{21}/cm^3$ inclusive.

Plural gate wirings, source wirings, and capacitor wiring layers are provided in accordance with the pixel density. In the terminal portion, plural first terminal electrodes at the same potential as the gate wiring, plural second terminal electrodes at the same potential as the source wiring, plural third terminal electrodes at the same potential as the capacitor wiring layer, and the like are arranged. The number of each of the terminal electrodes may be any number determined as appropriate by the practitioner.

In the terminal portion, the first terminal electrode at the same potential as the gate wiring can be formed using the same light-transmitting material as the pixel electrode layer 227. The first terminal electrode is electrically connected to the gate wiring through a contact hole reaching the gate wiring. The contact hole reaching gate wiring is formed in such a manner that the planarizing insulating layer 204, the protective insulating layer 203, the oxide insulating layer 266b, and the gate insulating layer 202 are selectively etched using the same photomask as the contact hole for electrically connecting the drain electrode layer of the thin film transistor 220 to the pixel electrode layer 227.

The second terminal electrode 255 at the same potential as the source wiring 254 and an auxiliary wiring 269 in the terminal portion can be formed using the same light-transmitting material as the pixel electrode layer 227. The second terminal electrode 255 is electrically connected to the source wiring 254 through a contact hole reaching the source wiring 254. The source wiring is a metal wiring formed using the same material and step as the source electrode layer 265a of the thin film transistor 260, and is at the same potential as the source electrode layer 265a. On the other hand, the auxiliary wiring 269 is a metal wiring formed using a metal material which has resistance lower than that of the source wiring 254. The auxiliary wiring 269 is formed using the same material and step as the auxiliary electrode layers 268a and 268b and is at the same potential as the auxiliary electrode layers 268a and 268b.

The third terminal electrode at the same potential as the capacitor wiring layer 230 can be formed using the same light-transmitting material as the pixel electrode layer 227. A contact hole reaching the capacitor wiring layer 230 can be formed by using the same photomask and step as a contact hole for electrically connecting the capacitor electrode 231 to the pixel electrode layer 227.

When an active matrix liquid crystal display device is manufactured, an active matrix substrate and a counter substrate provided with a counter electrode are fixed with a liquid crystal layer therebetween. Note that a common electrode electrically connected to the counter electrode provided for the counter substrate is provided over the active matrix substrate, and a fourth terminal electrode electrically connected to the common electrode is provided in the terminal portion. This fourth terminal electrode is a terminal for setting the common electrode at a fixed potential such as GND or 0 V. The fourth terminal electrode can be formed using the same light-transmitting material as the pixel electrode layer 227.

When the gate electrode layer, the source electrode layer, the drain electrode layer, the pixel electrode layer, another electrode layer, and another wiring layer are formed using the same material, a common sputtering target or a common manufacturing apparatus can be used. Accordingly, the costs of the material of these layers and an etchant (or an etching gas) used in etching can be reduced, resulting in a reduction in manufacturing costs.

In the structure of FIG. 3A, when a photosensitive resin material is used for the planarizing insulating layer 204, the step of forming a resist mask can be omitted.

FIG. 3B illustrates a cross-sectional structure that is partly different from that illustrated in FIG. 3A. FIG. 3B is the same as FIG. 3A except that there is no planarizing insulating layer 204 in the terminal portion and except the structure of the thin film transistor in the drive circuit. Therefore, components common to FIGS. 3A and 3B maintain the same reference numerals, and are not described in detail again. In FIG. 3B, a thin film transistor 270 using a metal wiring is provided. The terminal electrode is also formed by using the same material and process as the metal wiring.

In the structure of FIG. 3B, a photosensitive resin material is used for the planarizing insulating layer 204, and the step of forming a resist mask is omitted. Thus, without use of a resist mask, a structure in which there is no planarizing insulating layer 204 in the terminal portion can be formed. When the planarizing insulating layer 204 is not provided in the terminal portion, good connection to an FPC can easily be obtained.

The thin film transistor 270 includes, over the substrate 200 having an insulating surface; a gate electrode layer 271; the gate insulating layer 202; the oxide semiconductor layer having at least a channel formation region 273, a high-resistance source region 274a, and a high-resistance drain region 274b; a source electrode layer 275a; and a drain electrode layer 275b. Further, an oxide insulating layer 276a in contact with the channel formation region 273 is also provided. Note that in the oxide semiconductor layer of the thin film transistor 270, regions which overlap and are in contact with the oxide insulating layers 276a and 276b are referred to as first regions. Furthermore, in the oxide semiconductor layer of the thin film transistor 270, regions which overlap and are in contact with the source electrode layer 475a and the drain electrode layer 475b are referred to as second regions.

A region 274c and a region 274d in the oxide semiconductor layer which overlap with the oxide insulating layer 276b are in an oxygen-excess state like the channel formation region 273, and serve to reduce leakage current and also reduce the parasitic capacitance. A region 274e in the oxide semiconductor layer which is in contact with the protective insulating layer 203 is provided between the channel formation region 273 and the high-resistance source region 274a. A region 274f in the oxide semiconductor layer which is in contact with the protective insulating layer 203 is provided between the channel formation region 273 and the high-resistance drain region 274b. Note that in the oxide semiconductor layer in the thin film transistor 270, a region which overlaps and is in contact with the protective insulating layer 203 is referred to as a third region. The region 274e and the region 274f in the oxide semiconductor layer which are in contact with the protective insulating layer 203 enables a reduction in off-current.

In the channel-protective thin film transistor, when the source electrode layer and the drain electrode layer are provided over the oxide insulator layer having a small width which is reduced so as to shorten the channel length L of the channel formation region, a short circuit could be formed over the oxide insulating layer. Therefore, the source electrode layer 275a and the drain electrode layer 275b are provided so that their end portions are apart from the oxide insulating layer 276a having a small width.

The gate electrode layer of the thin film transistor 270 in the drive circuit may be electrically connected to a conductive layer 277 provided above the oxide semiconductor layer.

The second terminal electrode 257 at the same potential as the source wiring 256 in the terminal portion can be formed using the same light-transmitting material as the pixel electrode layer 227. The source wiring is a metal wiring formed using the same material and step as the source electrode layer 275a of the thin film transistor 270, and is at the same potential as the source electrode layer 275a.

Since a thin film transistor is easily broken due to static electricity or the like, a protective circuit is preferably provided over the same substrate as the pixel portion or the drive circuit. The protective circuit is preferably formed with a non-linear element including an oxide semiconductor layer. For example, a protective circuit is provided between the pixel portion, and a scan line input terminal and a signal line input terminal. In this embodiment, a plurality of protective circuits are provided so as to prevent breakage of the a pixel transistor and the like which can be caused when a surge voltage due to static electricity or the like is applied to a scan line, a signal line, and a capacitor bus line. Therefore, the protective circuit is formed so as to release charge to a common wiring when a surge voltage is applied to the protective circuit. Further, the protective circuit includes non-linear elements arranged in parallel to each other with the scan line therebetween. The non-linear element includes a two-terminal element such as a diode or a three-terminal element such as a transistor. For example, the non-linear element can also be formed through the same step as the thin film transistor 220 in the pixel portion, and can be made to have the same properties as a diode by connecting a gate terminal to a drain terminal of the non-linear element.

A structure in which the planarizing insulating layer 204 is not provided may be employed by omitting the step of forming the planarizing insulating layer 204. In this case, the conductive layer 267, the conductive layer 277, the pixel electrode layer 227, and the second terminal electrodes 255 and 257 are provided above and in contact with the protective insulating layer 203.

This embodiment can be combined with Embodiment 1 as appropriate.

Embodiment 3

In this embodiment, an example of a structure of a terminal portion provided over the same substrate as the thin film transistor is described. Although an example of the terminal portion of the source wiring is described in Embodiment 2, a terminal portion of the source wiring which is different from the terminal portion described in Embodiment 2 and a terminal portion of the gate wiring are shown in this embodiment. Note that in FIGS. 4A1 to 4B2, components common to FIGS. 3A and 3B maintain the same reference numerals.

FIGS. 4A1 and 4A2 respectively illustrate a cross-sectional view and a top view of the terminal portion of the gate wiring. FIG. 4A1 is the cross-sectional view taken along line C1-C2 of FIG. 4A2. In FIG. 4A1, a transparent conductive layer 225 formed over protective insulating layer 203 is a terminal electrode for connection which functions as an input terminal. Furthermore, in the terminal portion of FIG. 4A1, a first terminal 221 formed using the same material as the gate electrode layer 421b, a connection electrode layer 223 formed using the same material as the source wiring, and the auxiliary electrode layer 228 formed using a metal electrode material having lower resistance than the connection electrode layer 223 overlap with each other with the gate insulating layer 202 interposed therebetween, and are electrically connected to each other through the transparent conductive layer 225. When the structure illustrate in FIG. 3B is employed, the connection electrode layer 223 can be formed using a metal wiring material.

FIGS. 4B1 and 4B2 are respectively a cross-sectional view and a top view of the terminal portion of the source wiring which is different from the source wiring terminal portion illustrated in FIG. 3B. FIG. 4B1 is the cross-sectional view taken along line C3-C4 of FIG. 4B2. In FIG. 4B1, the transparent conductive layer 225 formed over the protective insulating layer 203 is the terminal electrode for connection which functions as an input terminal. Furthermore, in the terminal portion of FIG. 4B1, an electrode layer 226 formed using the same material as the gate wiring is located below and overlaps with a second terminal 222, which is electrically connected to the source wiring, with the gate insulating layer 202 interposed therebetween. The electrode layer 226 is not electrically connected to the second terminal 222. When the potential of the electrode layer 226 is set to a potential different from that of the second terminal 222, such as floating, GND, or 0 V, a capacitor for preventing noise or static electricity can be formed. An auxiliary electrode layer 229 formed using a metal electrode material having lower resistance than the second terminal 222 is stacked over the second terminal 222 and electrically connected to the transparent conductive layer 225 with the protective insulating layer 203 interposed therebetween. In addition, in the case where the structure illustrated in FIG. 3B is employed, a metal wiring material can be used for the second terminal 222.

Plural gate wirings, source wirings, and capacitor wirings are provided in accordance with the pixel density. In the terminal portion, plural first terminals at the same potential as the gate wiring, plural second terminals at the same potential as the source wiring, plural third terminals at the same potential as the capacitor wiring, and the like are arranged. The number of each of the terminal electrodes may be any number determined as appropriate by the practitioner.

This embodiment can be combined with Embodiment 1 or 2 as appropriate.

Embodiment 4

In this embodiment, a description is provided of an example of a liquid crystal display device in which a liquid crystal layer is sealed between a first substrate and a second substrate, and a common connection portion electrically connected to the counter electrode provided for the second substrate is formed over the first substrate. Note that a thin film transistor is formed as a switching element over the first substrate, and the common connection portion is manufactured in the same process as the switching element in the pixel portion, thereby being obtained without complicating the process.

The common connection portion is provided in a position that overlaps with a sealant for bonding the first substrate and the second substrate, and is electrically connected to the counter electrode through conductive particles contained in the sealant. Alternatively, the common connection portion is provided in a position that does not overlap with the sealant (except for the pixel portion) and a paste containing conductive particles is provided separately from the sealant so as to overlap with the common connection portion, whereby the common connection portion is electrically connected to the counter electrode.

Figure 5A:
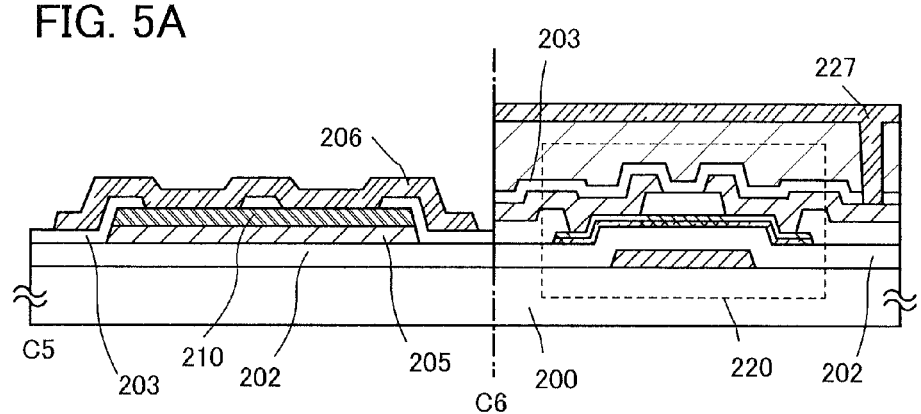
FIGS. 5A and 5C are cross-sectional views and FIG. 5B is a plan view of an embodiment of the present invention.

FIG. 5A is a cross-sectional view of a semiconductor device in which a thin film transistor and a common connection portion are formed over one substrate.

In FIG. 5A, the thin film transistor 220 electrically connected to the pixel electrode layer 227 is a channel-protective thin film transistor and is provided in the pixel portion. In this embodiment, the thin film transistor 220 has the same structure as the thin film transistor 448 of Embodiment 1.

Figure 5B:
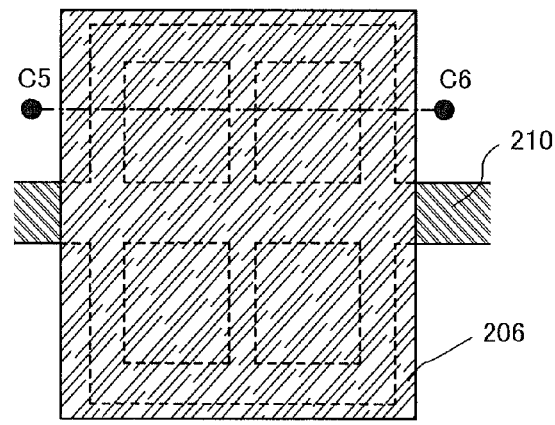

FIG. 5B illustrates an example of a top view of the common connection portion, and dashed line C5-C6 in FIG. 5B corresponds to a cross section of the common connection portion of FIG. 5A. Note that in FIG. 5B, components common to FIG. 5A maintain the same reference numerals.

The common potential line 205 is provided over the gate insulating layer 202 and formed using the same material and through the same process as the pixel electrode layer 227 of the pixel portion.

Also, the common potential line 205 is covered with the protective insulating layer 203. The protective insulating layer 203 has a plurality of opening portions overlapping with the common potential line 205. This opening portion is formed by using the same step as the contact hole that connects the drain electrode layer of the thin film transistor 220 to the pixel electrode layer 227.

Note that because of a significant difference in area, a distinction is made here between the contact hole in the pixel portion and the opening portion in the common connection portion. Further, in FIG. 5A, the pixel portion and the common connection portion are not illustrated on the same scale. For example, the length of the dashed line C5-C6 in the common connection portion is about 500 μm while the width of the thin film transistor is less than 50 μm; thus, the common connection portion actually has greater than or equal to ten times as large area as the thin film transistor. However, for simplicity, the pixel portion and the common connection portion are shown on different scales in FIG. 5A.

The common electrode layer 206 is provided over the protective insulating layer 203 and formed using the same material and through the same process as the pixel electrode layer 227 of the pixel portion. Note that an auxiliary wiring 210 which is formed using a metal wiring formed using the same material and through the same process as the auxiliary electrode layer is formed over the common potential line 205.

In this manner, the common connection portion is manufactured in the same step as the switching element in the pixel portion.

The first substrate provided with the pixel portion and the common connection portion and the second substrate having the counter electrode are fixed with the sealant.

When the sealant is made to contain conductive particles, the pair of substrates are aligned so that the sealant overlaps with the common connection portion. For example, in a small liquid crystal panel, two common connection portions are arranged so as to overlap with the sealant at opposite corners of the pixel portion and the like. In a large liquid crystal panel, four or more common connection portions are arranged so as to overlap with the sealant.

Note that the common electrode layer 206 is an electrode in contact with the conductive particles contained in the sealant, and is electrically connected to the counter electrode of the second substrate.

When a liquid crystal injection method is used, the pair of substrates are fixed with the sealant, and then liquid crystals are injected between the pair of substrates. Alternatively, when a liquid crystal dropping method is used, the sealant is drawn on the second substrate or the first substrate, liquid crystals are dropped thereon, and then the pair of substrates is bonded together in a reduced pressure.

An example of the common connection portion electrically connected to the counter electrode is described in this embodiment, but without any limitation thereto, such a common connection portion can be used as a connection portion connected to any other wiring or an external connection terminal or the like.

Figure 5C:
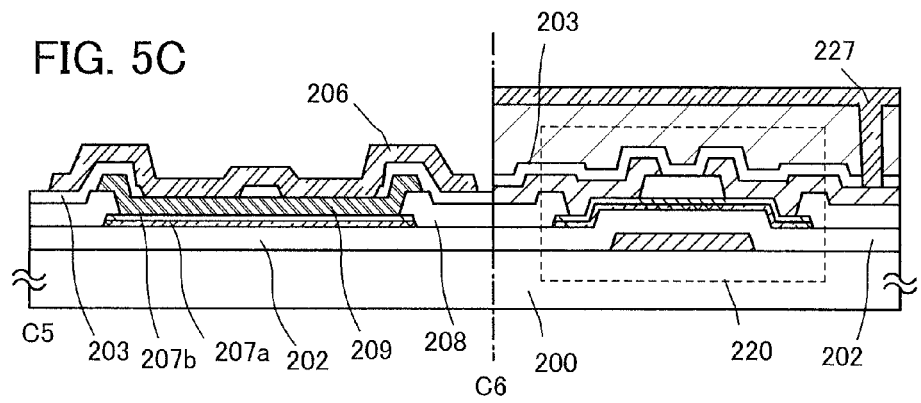

FIG. 5C illustrates a cross-sectional structure which is partly different from FIG. 5A. The structure of FIG. 5C is the same as that of FIG. 5A except that a stack of a first oxide semiconductor layer and a second oxide semiconductor layer which overlaps with the common electrode layer 206, and an oxide insulating layer covering an end portion are provided, and a metal wiring is used as a common potential line. Therefore, the same reference numerals are used for the same portions and detailed description of the same portions will be omitted.

The stack of the first oxide semiconductor layer 207a and the second oxide semiconductor layer 207b is provided over the gate insulating layer 202 and formed using the same materials and through the same process as the first oxide semiconductor layer and the second oxide semiconductor layer which are stacked in the thin film transistor 220. In addition, an oxide insulating layer 208 covering the stack of the first oxide semiconductor layer 207a and the second oxide semiconductor layer 207b is formed. A common potential line 209 formed using a metal wiring is formed over the stack of the first oxide semiconductor layer 207a and the second oxide semiconductor layer 207b. The common potential line 209 is, as illustrated in FIG. 3B of Embodiment 2, formed in the same process as the source and drain electrode layers of the thin film transistor of the driver circuit.

The common potential line 209 is covered with the protective insulating layer 203. The protective insulating layer 203 has a plurality of opening portions in positions overlapping with the common potential line 209. The opening portions are formed through the same process as a contact hole for connection between the drain electrode layer of the thin film transistor 220 and the pixel electrode layer 227.

The common electrode layer 206 is provided over the protective insulating layer 203 and formed using the same material and through the same process as those of the pixel electrode layer 227 of the pixel portion.

In this manner, the common connection portion may be manufactured in the same process as the switching element in the pixel portion, and a metal wiring may be used as the common potential line, so that wiring resistance is reduced.

This embodiment can be freely combined with any one of Embodiments 1 to 3.

Embodiment 5

An example in which a gate insulating layer has a single-layer structure is described in Embodiment 1 or Embodiment 2. In this embodiment, an example of a stacked-layer structure will be described. Note that in FIGS. 6A and 6B, the same portions as FIG. 3A or FIG. 3B are denoted by the same reference numerals.

FIG. 6A illustrates a channel-protective thin film transistor 280 provided in a pixel. The thin film transistor 280 is an example of a thin film transistor having a gate insulating layer formed with two layers and an oxide semiconductor layer formed with two layers. In addition, the thin film transistor 260 is a channel-protective thin film transistor provided in a driver circuit and is an example of a thin film transistor having a gate insulating layer formed with two layers and an oxide semiconductor layer formed with a single layer. Note that the thin film transistor 260 illustrated in FIG. 3A and the thin film transistor 260 are the same; therefore, description thereof is omitted here.

In this embodiment, the gate insulating layer has a stacked-layer structure of a first gate insulating layer 282a with a thickness of 50 nm to 200 nm inclusive and a second gate insulating layer 282b with a thickness of 50 nm to 300 nm inclusive. As the first gate insulating layer 282a, a silicon nitride film or a silicon nitride oxide film with a thickness of 100 nm is used. As the second gate insulating layer 282b, a silicon oxide film with a thickness of 100 nm is used.

In the thin film transistor 280 includes, over a substrate having an insulating surface, a gate electrode layer 281; the first gate insulating layer 282a; a second gate insulating layer 282b; an oxide semiconductor layer of a stacked layer including at least a channel formation region 283, a first high-resistance source region 284a, a second high-resistance source region 284e, a first high-resistance drain region 284b, and a second high-resistance drain region 284f; a source electrode layer 285a; and a drain electrode layer 285b. Further, a stack of an oxide insulating layer 286a is provided in contact with the channel formation region 283. In addition, the pixel electrode layer 227 is electrically connected to the drain electrode layer 285b.

Note that a storage capacitor is provided below the pixel electrode layer 227, and the capacitor electrode 231 is electrically connected to the pixel electrode layer 227.

In this embodiment, the storage capacitor is formed using the capacitor electrode 231 and the capacitor wiring layer 230.

In FIG. 6A, the storage capacitor includes only the gate insulating layer between the capacitor wiring and the capacitor electrode so as to have large capacitance.

In this embodiment, as an example, an oxide insulating layer 286b is formed using a silicon oxide film obtained by a sputtering method, and the second gate insulating layer formed using a silicon oxide film is etched to be thin when the stack of the oxide insulating layers which overlap with the capacitor wiring layer 230 is removed, whereby a third gate insulating layer 282c is formed. Note that the first gate insulating layer 282a is formed using a silicon nitride film or a silicon nitride oxide film, and functions as an etching stopper to prevent etching damage on the gate electrode layer or the substrate.

When the third gate insulating layer 282c has a small thickness, storage capacitance can be increased.

FIG. 6B illustrates a cross-sectional structure which is partly different from that in FIG. 6A. FIG. 6B illustrates a channel-protective thin film transistor 290 provided in a pixel. The thin film transistor 290 is an example of a thin film transistor having a gate insulating layer formed with two layers and an oxide semiconductor layer formed with the first oxide semiconductor layer and the second oxide semiconductor layer. Note that the thin film transistor 289 illustrated in FIG. 6B is the same as the thin film transistor 260 illustrated in FIG. 3A except that the auxiliary electrode layers 268a and 268b are not provided; therefore, description thereof is omitted here. As the thin film transistor 289, a structure in which an auxiliary electrode layer is not provided and a source electrode layer and a drain electrode layer are formed may be employed also in the driver circuit.

In the thin film transistor 290 illustrated in FIG. 6B, the gate insulating layer has a stacked-layer structure of a first gate insulating layer 292a with a thickness of 50 nm to 200 nm inclusive and a second gate insulating layer 292b with a thickness of 1 nm to 50 nm inclusive. As the first gate insulating layer 292a, a silicon oxide film with a thickness of 100 nm is used. As the second gate insulating layer 292b, a silicon nitride film or a silicon nitride oxide film with a thickness of 10 nm is used.

The thin film transistor 290 includes: over the substrate 200 having an insulating surface, the gate electrode layer 271; the first gate insulating layer 292a; the second gate insulating layer 292b; the stack of the first oxide semiconductor layer and the second oxide semiconductor layer, which has at least a channel formation region 293, a first high-resistance source region 294a, a second high-resistance source region 294g, a first high-resistance drain region 294b, and a second high-resistance drain region 294h; a source electrode layer 295a; and a drain electrode layer 295b. Further, an oxide insulating layer 296a is provided in contact with the channel formation region 293.

In addition, a region 294c and a region 294d of the stack of the first oxide semiconductor layer and the second oxide semiconductor layer, which overlap with an oxide insulating layer 296b, are in the same oxygen-excess state as the channel formation region 293 and have a function of reducing leakage current or parasitic capacitance. Furthermore, a region 294e of the stack of the first oxide semiconductor layer and the second oxide semiconductor layer, which is in contact with the protective insulating layer 203, is provided between the channel formation region 293 and the first high-resistance source region 294a (and the second high-resistance source region 294g). A region 294f of the stack of the first oxide semiconductor layer and the second oxide semiconductor layer, which is in contact with the protective insulating layer 203, is provided between the channel formation region 293 and the first high-resistance drain region 294b (and the second high-resistance source region 294h). With the region 294e and the region 294f of the stack of the first oxide semiconductor layer and the second oxide semiconductor layer, which are in contact with the protective insulating layer 203, off current can be reduced.

The region 294e and the region 294f of the oxide semiconductor layers are also in contact with the second gate insulating layer 292b formed using a silicon nitride film or a silicon nitride oxide film. The protective insulating layer 203 is formed using an inorganic insulating film which does not include impurities such as moisture, a hydrogen ion, and OH⁻ and blocks entry of these from the outside; for example, a silicon nitride film, an aluminum nitride film, a silicon nitride oxide film, an aluminum oxynitride film, or the like is used.

In this embodiment, as an example, the oxide insulating layer 296b is formed using a silicon oxide film obtained by a sputtering method, and the oxide insulating layer is etched using the second gate insulating layer which is formed using a silicon nitride film or a silicon nitride oxide film as an etching stopper when the oxide insulating layer which overlaps with the capacitor wiring layer 230 is removed.

In a channel-protective thin film transistor, when the width of an oxide insulating layer is reduced so that a channel length L of a channel formation region is reduced and a source electrode layer and a drain electrode layer are provided over the oxide insulating layer with a small width, there is a possibility that a short circuit may be caused over the oxide insulating layer. Therefore, the source electrode layer 295a and the drain electrode layer 295b are provided so that end portions thereof are apart from the oxide insulating layer 296a having a small width.

This embodiment can be freely combined with any one of Embodiments 1 to 4.

Embodiment 6

In this embodiment, an example of a thin film transistor whose manufacturing process is partly different from that of Embodiment 1 will be described with reference to FIGS. 7A to 7C and FIGS. 8A to 8E. FIGS. 7A to 7C and FIGS. 8A to 8E are the same as FIGS. 1A to 1C and FIGS. 2A to 2E except that there is a difference in part of the process. Therefore, the same portions are denoted by the same reference numerals, and detailed description of the same portions is omitted.

First, a gate electrode layer, a gate insulating layer, a metal thin film, an oxide semiconductor film are formed over a substrate in accordance with Embodiment 1. Then, the island-shaped first oxide semiconductor layer 442 and the island-shaped second oxide semiconductor layer 443 are formed in accordance with Embodiment 1.

Next, dehydration or dehydrogenation of the oxide semiconductor layers is performed. The temperature of first heat treatment for dehydration or dehydrogenation is set at higher than or equal to 400° C. and lower than a strain point of the substrate, preferably 425° C. or higher. Note that the heat treatment time may be one hour or shorter when the temperature of the heat treatment is 425° C. or higher, but is set to longer than one hour when the temperature of the heat treatment is lower than 425° C. In this embodiment, the substrate is introduced into an electric furnace, which is one of heat treatment apparatuses, and heat treatment is performed on the oxide semiconductor layers in a nitrogen atmosphere. Then, the oxide semiconductor layers are not exposed to air, which prevents reincorporation of water and hydrogen into the oxide semiconductor layers, so that the oxide semiconductor layers are obtained. After that, cooling is performed by introduction of a high-purity oxygen gas, a high-purity $N_2O$ gas, or ultra-dry air (having a dew point of −40° C. or lower, preferably −60° C. or lower) into the same furnace. It is preferable that the oxygen gas and the $N_2O$ gas do not include water, hydrogen, and the like. Alternatively, the purity of an oxygen gas or an $N_2O$ gas which is introduced into the heat treatment apparatus is preferably 6N (99.9999%) or higher, more preferably 7N (99.99999%) or higher (that is, the impurity concentration of the oxygen gas or the $N_2O$ gas is 1 ppm or lower, preferably 0.1 ppm or lower).

Further, after the first heat treatment for dehydration or dehydrogenation, heat treatment may be performed at 200° C. to 400° C. inclusive, preferably 200° C. to 300° C. inclusive, in an atmosphere of an oxygen gas or an $N_2O$ gas.

Alternatively, the first heat treatment of the first oxide semiconductor layer 442 and the second oxide semiconductor layer 443 can be performed on the oxide semiconductor film before it is processed into the island-shaped oxide semiconductor layer. In that case, after the first heat treatment, the substrate is taken out of the heating apparatus and subjected to a photolithography step.

Through the above process, the first oxide semiconductor layer 442 and the second oxide semiconductor layer 443 are made to be in an oxygen-excess state; accordingly, high-resistance, that is, e oxide semiconductor films are formed.

Figure 8A:
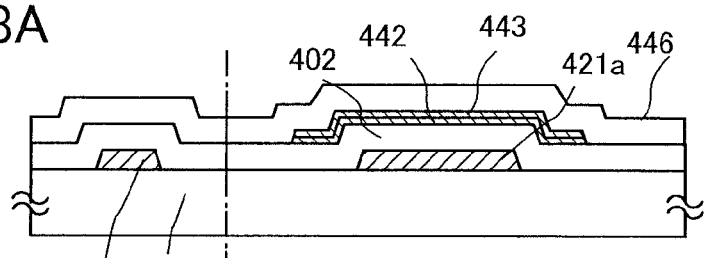
FIGS. 8A to 8E are cross-sectional views illustrating manufacturing steps of an embodiment of the present invention.
Figure 8B:
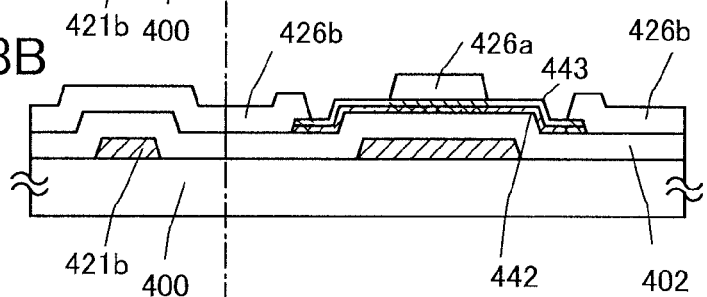
Figure 8C:
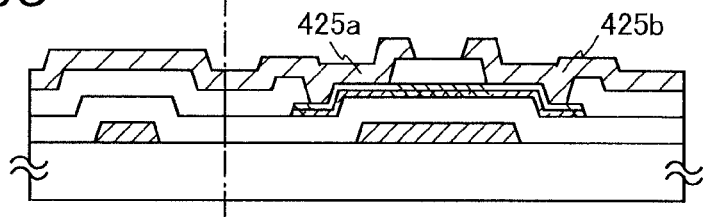
Figure 8D:
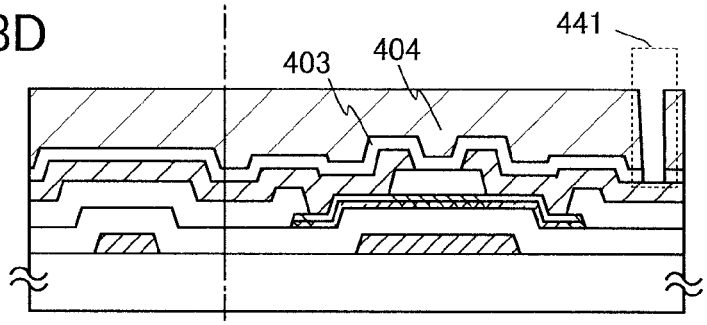

Next, an oxide insulating film is formed over the gate insulating layer 402 and the second oxide semiconductor layer 443 by a sputtering method (see FIG. 8A).

Then, a resist mask is formed by a third photolithography step, and the oxide insulating layers 426a and 426b are formed by selective etching. After that, the resist mask is removed (see FIG. 8B).

Next, a light-transmitting conductive film is formed over the gate insulating layer 402, the oxide insulating layers 426a and 426b, and the second oxide semiconductor layer 443. Then, a resist mask is formed by a fourth photolithography step, and the source electrode layer 425a and the drain electrode layer 425b are formed by selective etching (see FIG. 8C).

Next, in order to reduce variation in electric characteristics of the thin film transistor, heat treatment (preferably at higher than or equal to 150° C. and lower than 350° C.) may be performed in an inert gas atmosphere or a nitrogen gas atmosphere. For example, heat treatment is performed at 250° C. for one hour in a nitrogen gas atmosphere.

Next, the protective insulating layer 403 is formed over the oxide insulating layers 426a and 426b, the source electrode layer 425a, and the drain electrode layer 425b.

Next, the planarizing insulating layer 404 is formed over the protective insulating layer 403.

Next, a fifth photolithography step is performed. A resist mask is formed, and the planarizing insulating layer 404 and the protective insulating layer 403 are etched, so that the contact hole 441 which reaches the drain electrode layer 425b is formed. Then, the resist mask is removed (see FIG. 8D).

Next, a light-transmitting conductive film is formed.

Next, a sixth photolithography step is performed. A resist mask is formed, and unnecessary portions are removed by etching, so that the pixel electrode layer 427 is formed. Then, the resist mask is removed (see FIG. 8E).

Through the above process, a thin film transistor 420 and a wiring intersection in which parasitic capacitance is reduced can be manufactured over the same substrate with the use of six masks.

The thin film transistor 420 used for a pixel is a channel-protective thin film transistor including a stack of the first oxide semiconductor layer 442 and the second oxide semiconductor layer 443 which includes a channel formation region.

Figure 7A:
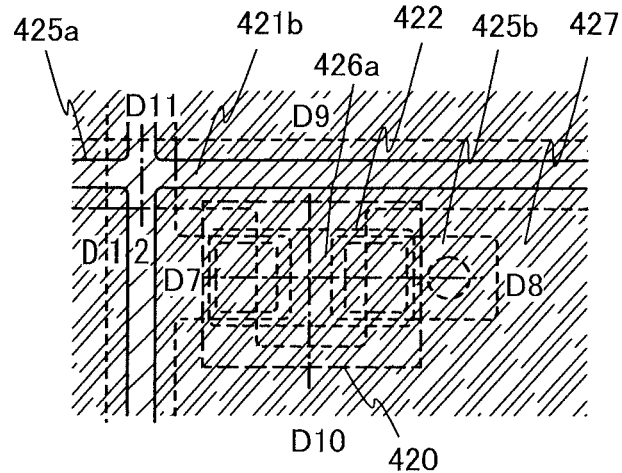
FIG. 7A is a plan view and FIGS. 7B and 7C are cross-sectional views of an embodiment of the present invention.
Figure 7B:
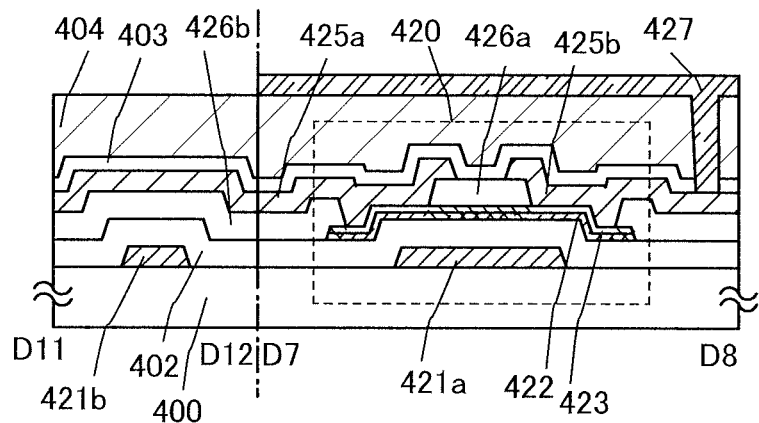
Figure 7C:
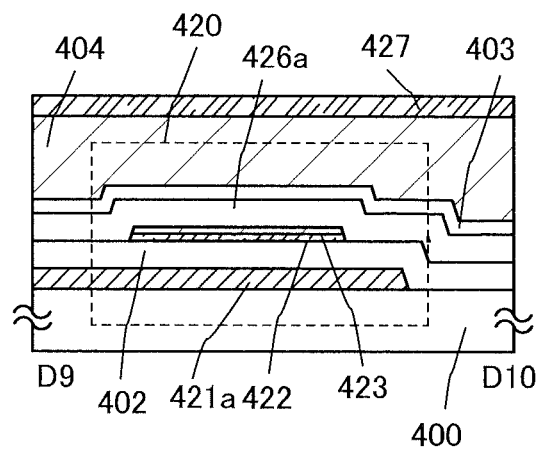
Figure 8E:
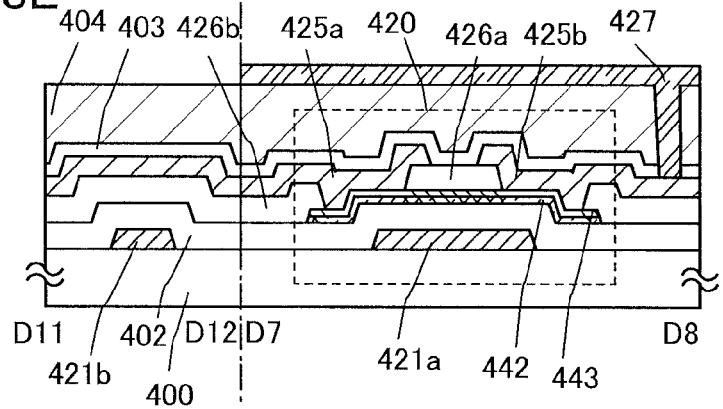

In addition, FIG. 7A is a plan view of the channel-protective thin film transistor 420 which is provided in a pixel, and FIG. 7B is a cross-sectional view taken along line D7-D8 and line D11-D12 of FIG. 7A. FIG. 7C is a cross-sectional view taken along line D9-D10 of FIG. 7A. Note that FIG. 8E is the same as FIG. 7B.

This embodiment can be freely combined with any one of Embodiments 1 to 5.

Embodiment 7

Figure 9A:
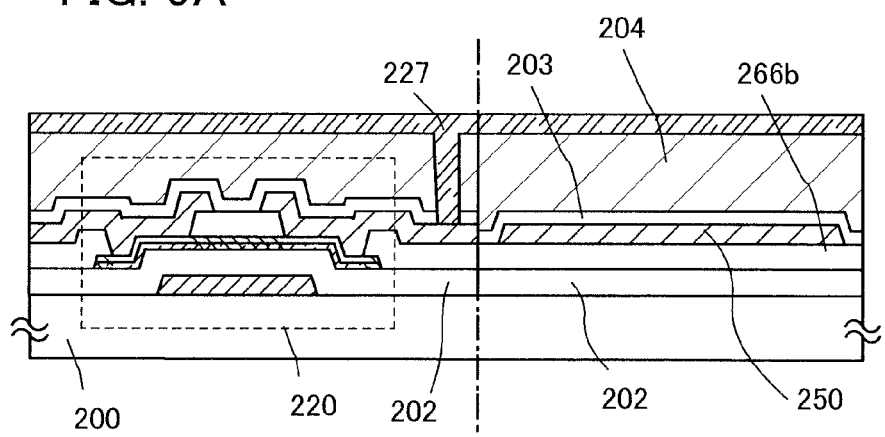
FIGS. 9A and 9B illustrate a semiconductor device of an embodiment of the present invention.

In this embodiment, an example of a structure of a storage capacitor, which is different from that of Embodiment 2, will be described with reference to FIGS. 9A and 9B. FIG. 9A is the same as FIG. 3A except that there is a difference in the structure of a storage capacitor. Therefore, the same portions are denoted by the same reference numerals and detailed description of the same portions is omitted. Note that FIG. 9A illustrates a cross-sectional structure of the thin film transistor 220 in a pixel portion and the storage capacitor.

FIG. 9A illustrates an example in which a storage capacitor is formed by the pixel electrode layer 227 and a capacitor wiring layer 250 which overlaps with the pixel electrode layer 227 with use of the protective insulating layer 203 and the planarizing insulating layer 204 as dielectrics. The capacitor wiring layer 250 is formed using the same light-transmitting material and in the same step as the source electrode layer of the thin film transistor 220 in the pixel portion; therefore, the capacitor wiring layer 250 is disposed so as not to overlap with the source wiring layer of the thin film transistor 220.

In the storage capacitor illustrated in FIG. 9A, the pair of electrodes and the dielectrics have a light-transmitting property, and thus the whole storage capacitor has a light-transmitting property.

Figure 9B:
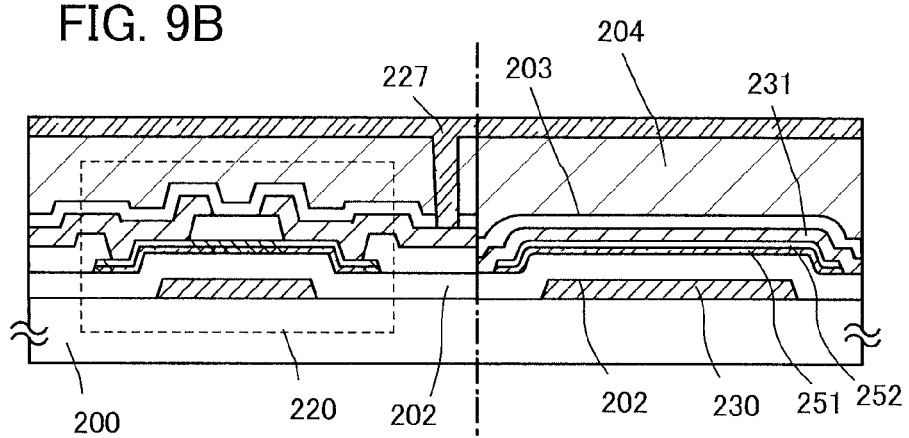

FIG. 9B illustrates an example of a storage capacitor having a structure different from that in FIG. 9A. FIG. 9B is also the same as FIG. 3A except that there is a difference in the structure of the storage capacitor. Therefore, the same portions are denoted by the same reference numerals and detailed description of the same portions is omitted.

FIG. 9B illustrates an example in which a storage capacitor is formed by a stack of the capacitor wiring layer 230, a stack of a first oxide semiconductor layer 251, a second oxide semiconductor layer 252, and the capacitor electrode 231, which overlap with the capacitor wiring layer 230, with use of the gate insulating layer 202 as a dielectric. Further, the capacitor electrode 231 is stacked over and in contact with the stack of the first oxide semiconductor layer 251 and the second oxide semiconductor layer 252 and functions as one of electrodes of the storage capacitor. Note that the stack of the first oxide semiconductor layer 251 and the second oxide semiconductor layer 252 may be formed using the same light-transmitting material and in the same step as the stack of the first oxide semiconductor layer and the second oxide semiconductor layer in the thin film transistor 220. The capacitor wiring layer 230 is formed using the same light-transmitting material and in the same step as the gate electrode layer of the thin film transistor 220; therefore, the capacitor wiring layer 230 is disposed so as not to overlap with a gate wiring layer of the thin film transistor 220. In addition, the capacitor electrode 231 is electrically connected to the pixel electrode layer 227.

Also in the storage capacitor illustrated in FIG. 9B, the pair of electrodes and the dielectric have a light-transmitting property, and thus the whole storage capacitor has a light-transmitting property.

The storage capacitors illustrated in FIGS. 9A and 9B have a light-transmitting property, and high definition of a displayed image is achieved by increasing the number of gate wirings, for example. Therefore, even when the pixel size is reduced, sufficient capacitance and a high aperture ratio can be obtained.

This embodiment can be freely combined with any of the other embodiments.

Embodiment 8

In this embodiment, an example will be described below in which at least some of driver circuits and a thin film transistor placed in a pixel portion are formed over one substrate.

The thin film transistor placed in the pixel portion is formed as described in any of Embodiments 1, 2, 5, and 6. Since the thin film transistor described in any of Embodiments 1, 2, 5, and 6 is an n-channel TFT, some of driver circuits that can be constituted by n-channel TFTs among the driver circuits are formed over the substrate where the thin film transistor in the pixel portion is formed.

Figure 14A:
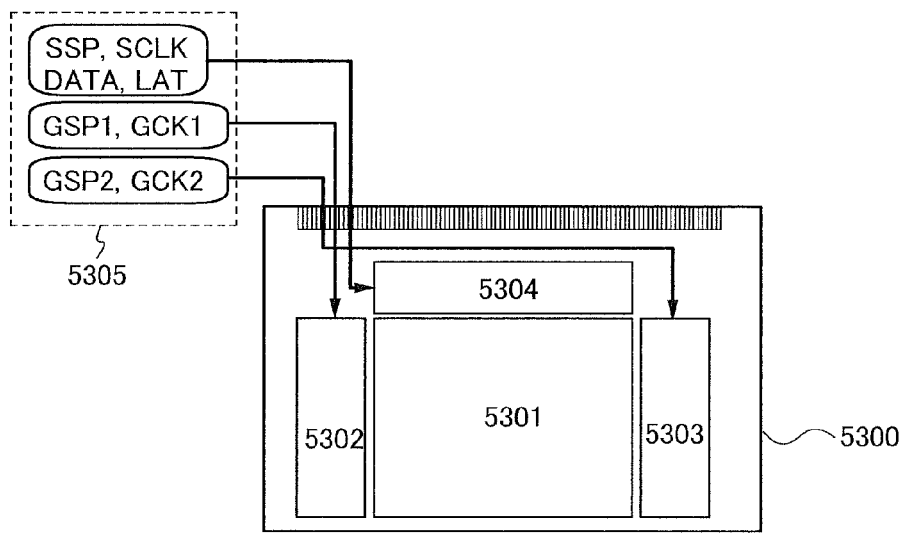
FIGS. 14A and 14B are block diagrams each illustrating a semiconductor device of an embodiment of the present invention.

FIG. 14A illustrates an example of a block diagram of an active matrix display device. A pixel portion 5301, a first scan line driver circuit 5302, a second scan line driver circuit 5303, and a signal line driver circuit 5304 are provided over a substrate 5300 in the display device. In the pixel portion 5301, a plurality of signal lines extended from the signal line driver circuit 5304 are placed and a plurality of scan lines extended from the first scan line driver circuit 5302 and the second scan line driver circuit 5303 are placed. Note that in cross regions of the scan lines and the signal lines, pixels each having a display element are arranged in a matrix. The substrate 5300 of the display device is connected to a timing control circuit 5305 (also referred to as a controller or a control IC) through a connection portion such as a flexible printed circuit (FPC).

In FIG. 14A, the first scan line driver circuit 5302, the second scan line driver circuit 5303, and the signal line driver circuit 5304 are formed over the substrate 5300 where the pixel portion 5301 is formed. Consequently, the number of components of a driver circuit and the like that are externally provided is reduced, so that costs can be reduced. Moreover, the number of connections in the connection portion which are formed when wirings are extended from a driver circuit provided outside the substrate 5300 can be reduced, and the reliability or yield can be increased.

Note that the timing control circuit 5305 supplies, for example, a first scan line driver circuit start signal (GSP1) and a scan line driver circuit clock signal (GCK1) to the first scan line driver circuit 5302. Furthermore, the timing control circuit 5305 supplies, for example, a second scan line driver circuit start signal (GSP2) (which is also referred to as a start pulse) and a scan line driver circuit clock signal (GCK2) to the second scan line driver circuit 5303. Moreover, the timing control circuit 5305 supplies a signal line driver circuit start signal (SSP), a signal line driver circuit clock signal (SCK), video signal data (DATA, also simply referred to as a video signal), and a latch signal (LAT) to the signal line driver circuit 5304. Each clock signal may be a plurality of clock signals with shifted phases or may be supplied together with a signal (CKB) obtained by inverting the clock signal. Note that it is possible to omit one of the first scan line driver circuit 5302 and the second scan line driver circuit 5303.

Figure 14B:
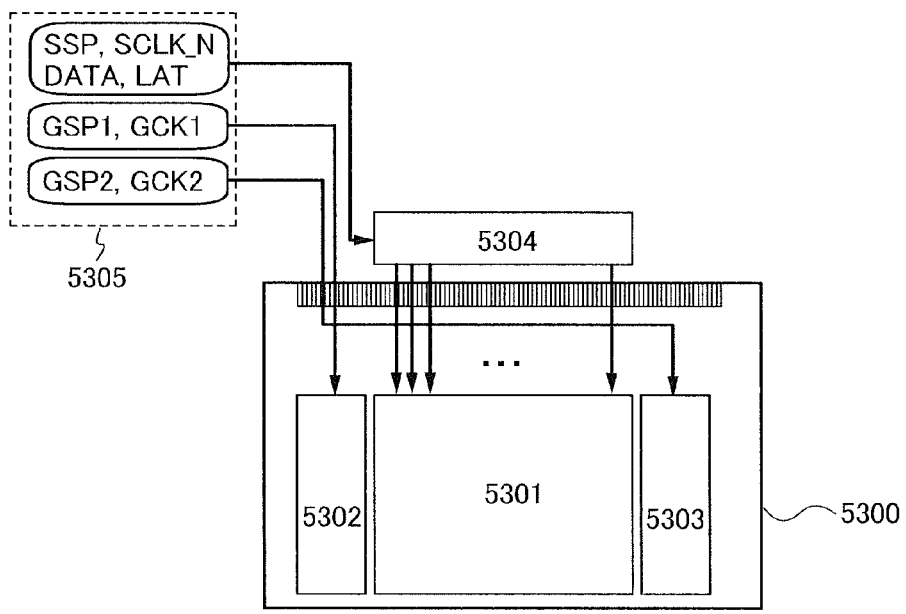

FIG. 14B illustrates a structure in which circuits with lower driving frequency (for example, the first scan line driver circuit 5302 and the second scan line driver circuit 5303) are formed over the substrate 5300 where the pixel portion 5301 is formed, and the signal line driver circuit 5304 is formed over a substrate which is different from the substrate 5300 where the pixel portion 5301 is formed. With this structure, the driver circuits formed over the substrate 5300 can be constituted by thin film transistors whose field effect mobility is lower than that of transistors including a single crystal semiconductor. Thus, increase in size of the display device, reduction in cost, improvement in yield, or the like can be achieved.

Figure 15A:
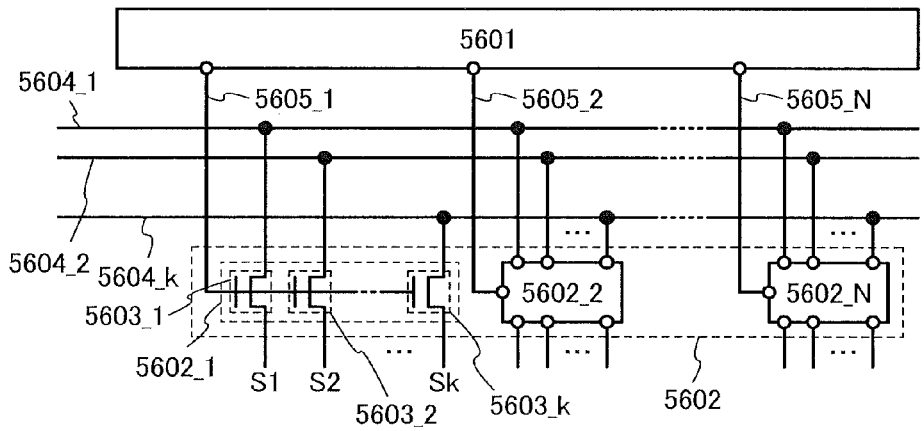
FIGS. 15A and 15B illustrate a semiconductor device of an embodiment of the present invention.
Figure 15B:
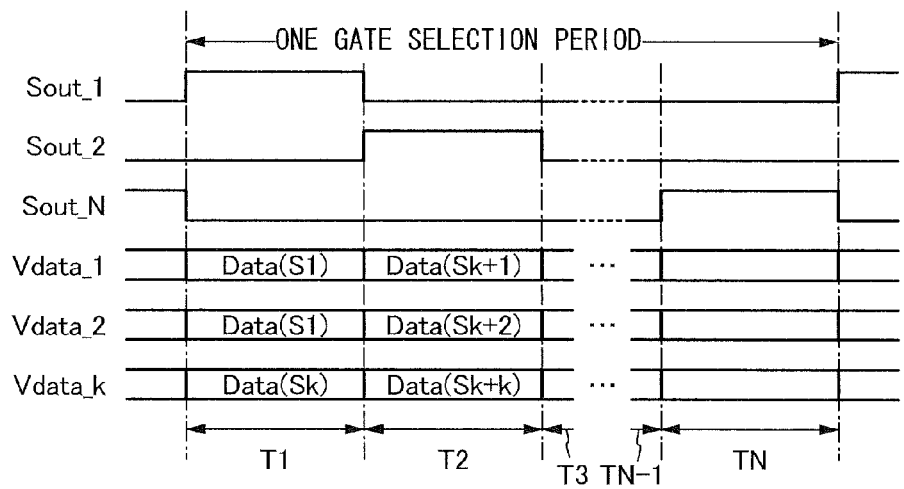

The thin film transistors in Embodiments 1, 2, 5, and 6 are n-channel TFTs. FIGS. 15A and 15B illustrate an example of a structure and operation of a signal line driver circuit constituted by n-channel TFTs.

The signal line driver circuit includes a shift register 5601 and a switching circuit portion 5602. The switching circuit portion 5602 includes a plurality of switching circuits 5602_1 to 5602_N (N is a natural number). The switching circuits 5602_1 to 5602_N each include a plurality of thin film transistors 5603_1 to 5603_$k$ ($k$ is a natural number). The example where the thin film transistors 5603_1 to 5603_$k$ are n-channel TFTs is described below.

A connection relation in the signal line driver circuit is described by using the switching circuit 5602_1 as an example. First terminals of the thin film transistors 5603_1 to 5603_$k$ are connected to wirings 5604_1 to 5604_$k$, respectively. Second terminals of the thin film transistors 5603_1 to 5603_$k$ are connected to signal lines S1 to Sk, respectively. Gates of the thin film transistors 5603_1 to 5603_$k$ are connected to a wiring 5605_1.

The shift register 5601 has a function of sequentially selecting the switching circuits 5602_1 to 5602_N by sequentially outputting H-level signals (also referred to as H signals or signals at a high power supply potential level) to wirings 5605_1 to 5605_N.

The switching circuit 5602_1 has a function of controlling electrical continuity between the wirings 5604_1 to 5604_$k$ and the signal lines S1 to Sk (electrical continuity between the first terminals and the second terminals), that is, a function of controlling whether potentials of the wirings 5604_1 to 5604_$k$ are supplied to the signal lines S1 to Sk. In this manner, the switching circuit 5602_1 functions as a selector. Moreover, the thin film transistors 5603_1 to 5603_$k$ have functions of controlling conduction states between the wirings 5604_1 to 5604_$k$ and the signal lines S1 to Sk, respectively, that is, functions of supplying potentials of the wirings 5604_1 to 5604_$k$ to the signal lines S1 to Sk, respectively. In this manner, each of the thin film transistors 5603_1 to 5603_$k$ functions as a switch.

The video signal data (DATA) is input to each of the wirings 5604_1 to 5604_$k$. The video signal data (DATA) is often an analog signal that corresponds to an image signal or image data.

Next, the operation of the signal line driver circuit in FIG. 15A is described with reference to a timing diagram in FIG. 15B. FIG. 15B illustrates examples of signals Sout_1 to Sout_N and signals Vdata_1 to Vdata_k. The signals Sout_1 to Sout_N are examples of output signals from the shift register 5601. The signals Vdata_1 to Vdata_k are examples of signals input to the wirings 5604_1 to 5604_$k$. Note that one operation period of the signal line driver circuit corresponds to one gate selection period in a display device. For example, one gate selection period is divided into periods T1 to TN. Each of the periods T1 to TN is a period for writing the video signal data (DATA) into a pixel in a selected row.

Note that signal waveform distortion and the like in each structure illustrated in drawings and the like in this embodiment are exaggerated for simplicity in some cases. Therefore, this embodiment is not necessarily limited to the scale illustrated in the drawings and the like.

In the periods T1 to TN, the shift register 5601 sequentially outputs H-level signals to the wirings 5605_1 to 5605_N. For example, in the period T1, the shift register 5601 outputs an H-level signal to the wiring 5605_1. Then, the thin film transistors 5603_1 to 5603_$k$ are turned on, so that the wirings 5604_1 to 5604_$k$ and the signal lines S1 to Sk are brought into conduction. At this time, Data(S1) to Data(Sk) are input to the wirings 5604_1 to 5604_$k$, respectively. The Data(S1) to Data(Sk) are written into pixels in a first to kth columns in the selected row through the thin film transistors 5603_1 to 5603_$k$, respectively. In such a manner, in the periods T1 to TN, the video signal data (DATA) are sequentially written into the pixels in the selected row by k columns.

The video signal data (DATA) are written into pixels by a plurality of columns as described above, whereby the number of video signal data (DATA) or the number of wirings can be reduced. Consequently, the number of connections with an external circuit can be reduced. Moreover, the time for writing can be extended when video signal data (DATA) is written into pixels by a plurality of columns; thus, insufficient writing of video signal data (DATA) can be prevented.

Note that any of the circuits constituted by the thin film transistors in any of Embodiments 1, 2, 5, and 6 can be used for the shift register 5601 and the switching circuit 5602. In that case, the shift register 5601 can be constituted by only n-channel transistors or only p-channel transistors.

The structure of a scan line driver circuit is described. The scan line driver circuit includes a shift register. Additionally, the scan line driver circuit may include a level shifter, a buffer, or the like in some cases. In the scan line driver circuit, a clock signal (CLK) and a start pulse signal (SP) are input to the shift register, so that a selection signal is generated. The selection signal generated is buffered and amplified by the buffer, and the resulting signal is supplied to a corresponding scan line. Gate electrodes of transistors in pixels of one line are connected to the scan line. Since the transistors in the pixels of one line have to be turned on at the same time, a buffer that can supply a large current is used.

One embodiment of a shift register which is used for part of the scan line driver circuit and/or the signal line driver circuit will be described with reference to FIGS. 16A to 16D and FIGS. 17A and 17B.

Figure 16A:
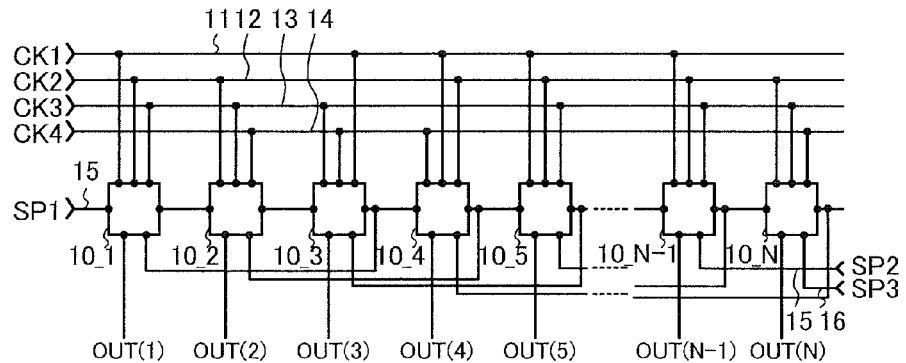
FIGS. 16A to 16D illustrate a semiconductor device of an embodiment of the present invention.

The shift register in the scan line driver circuit and/or the signal line driver circuit is described with reference to FIGS. 16A to 16D and FIGS. 17A and 17B. The shift register includes a first to Nth pulse output circuits 10_1 to 10_N (N is a natural number greater than or equal to 3) (see FIG. 16A). In the shift register illustrated in FIG. 16A, a first clock signal CK1, a second clock signal CK2, a third clock signal CK3, and a fourth clock signal CK4 are supplied from a first wiring 11, a second wiring 12, a third wiring 13, and a fourth wiring 14, respectively, to the first to Nth pulse output circuits 10_1 to 10_N. A start pulse SP1 (a first start pulse) is input from a fifth wiring 15 to the first pulse output circuit 10_1. To the nth pulse output circuit 10_n of the second or subsequent stage (n is a natural number greater than or equal to 2 and less than or equal to N), a signal from the pulse output circuit of the preceding stage (such a signal is referred to as a preceding-stage signal OUT(n−1)) (n is a natural number greater than or equal to 2) is input. To the first pulse output circuit 10_1, a signal from the third pulse output circuit 10_3 of the stage following the next stage is input. Similarly, to the nth pulse output circuit 10_n of the second or subsequent stage, a signal from the (n+2)th pulse output circuit 10_(n+2) of the stage following the next stage (such a signal is referred to as a subsequent-stage signal OUT(n+2)) is input. Therefore, the pulse output circuits of the respective stages output first output signals (OUT(1)(SR) to OUT(N)(SR)) to be input to the pulse output circuit of the subsequent stage and/or the pulse output circuit of the stage before the preceding stage and second output signals (OUT(1) to OUT(N)) to be input to another circuit or the like. Note that since the subsequent-stage signal OUT(n+2) is not input to the last two stages of the shift register as illustrated in FIG. 16A, a second start pulse SP2 and a third start pulse SP3 may be input to the pulse output circuits of the last two stages, for example.

Note that a clock signal (CK) is a signal that alternates between an H level and an L level (also referred to as an L signal or a signal at low power supply potential level) at regular intervals. Here, the first clock signal (CK1) to the fourth clock signal (CK4) are delayed by ¼ cycle sequentially (i.e., they are 90° out of phase with each other). In this embodiment, driving or the like of the pulse output circuit is controlled with the first to fourth clock signals (CK1) to (CK4). Note that the clock signal is also referred to as GCK or SCK in some cases depending on a driver circuit to which the clock signal is input; the clock signal is referred to as CK in the following description.

A first input terminal 21, a second input terminal 22, and a third input terminal 23 are electrically connected to any of the first to fourth wirings 11 to 14. For example, in the first pulse output circuit 10_1 in FIG. 16A, the first input terminal 21 is electrically connected to the first wiring 11, the second input terminal 22 is electrically connected to the second wiring 12, and the third input terminal 23 is electrically connected to the third wiring 13. In the second pulse output circuit 102, the first input terminal 21 is electrically connected to the second wiring 12, the second input terminal 22 is electrically connected to the third wiring 13, and the third input terminal 23 is electrically connected to the fourth wiring 14.

Figure 16B:
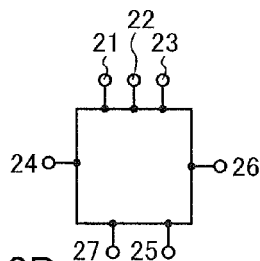

Each of the first to Nth pulse output circuits 10_1 to 10_N includes the first input terminal 21, the second input terminal 22, the third input terminal 23, a fourth input terminal 24, a fifth input terminal 25, a first output terminal 26, and a second output terminal 27 (see FIG. 16B). In the first pulse output circuit 10_1, the first clock signal CK1 is input to the first input terminal 21; the second clock signal CK2 is input to the second input terminal 22; the third clock signal CK3 is input to the third input terminal 23; a start pulse is input to the fourth input terminal 24; a subsequent-stage signal OUT(3) is input to the fifth input terminal 25; the first output signal OUT(1) (SR) is output from the first output terminal 26; and the second output signal OUT(1) is output from the second output terminal 27.

Figure 16C:
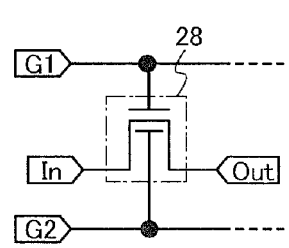

In the first to Nth pulse output circuits 10_1 to 10_N, the thin film transistor (TFT) having four terminals described in the above embodiment can be used in addition to a thin film transistor having three terminals. FIG. 16C illustrates the symbol of a thin film transistor 28 having four terminals, which is described in the above embodiment. The symbol of the thin film transistor 28 illustrated in FIG. 16C represents the thin film transistor having four terminals which is described in any of Embodiments 1, 2, 5, and 6 and is used in the drawings and the like. Note that in this specification, when a thin film transistor has two gate electrodes with a semiconductor layer therebetween, the gate electrode below the semiconductor layer is called a lower gate electrode and the gate electrode above the semiconductor layer is called an upper gate electrode. The thin film transistor 28 is an element which can control electric current between an IN terminal and an OUT terminal with a first control signal G1 which is input to a lower gate electrode and a second control signal G2 which is input to an upper gate electrode.

When an oxide semiconductor is used for a semiconductor layer including a channel formation region in a thin film transistor, the threshold voltage sometimes shifts in the positive or negative direction depending on a manufacturing process. For that reason, the thin film transistor in which an oxide semiconductor is used for a semiconductor layer including a channel formation region preferably has a structure with which the threshold voltage can be controlled. The threshold voltage of the thin film transistor 28 illustrated in FIG. 16C can be controlled to be a desired level by providing gate electrodes above and below a channel formation region of the thin film transistor 28 with a gate insulating film interposed between the upper gate electrode and the channel formation region and between the lower gate electrode and the channel formation region, and by controlling a potential of the upper gate electrode and/or the lower gate electrode Next, an example of a specific circuit configuration of the pulse output circuit will be described with reference to FIG. 16D.

Figure 16D:
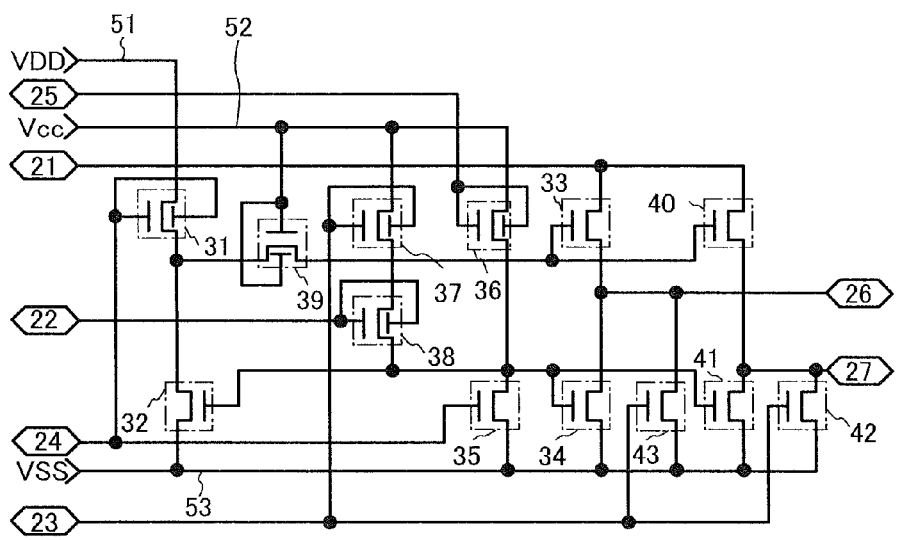

The pulse output circuit 10_1 includes a first to thirteenth transistors 31 to 43 (see FIG. 16D). A signal or a power supply potential is supplied to the first to thirteenth transistors 31 to 43 from a power supply line 51 to which a first high power supply potential VDD is supplied, a power supply line 52 to which a second high power supply potential VCC is supplied, and a power supply line 53 to which a low power supply potential VSS is supplied, in addition to the first to fifth input terminals 21 to 25, the first output terminal 26, and the second output terminal 27, which are described above. The relation of the power supply potentials of the power supply lines in FIG. 16D is as follows: the first power supply potential VDD is higher than or equal to the second power supply potential VCC, and the second power supply potential VCC is higher than the third power supply potential VSS. Note that the first to fourth clock signals (CK1) to (CK4) each alternate between an H level and an L level at regular intervals; the clock signal at the H level is VDD and the clock signal at the L level is VSS. By making the potential VDD of the power supply line 51 higher than the potential VCC of the power supply line 52, a potential applied to a gate electrode of a transistor can be lowered, shift in threshold voltage of the transistor can be reduced, and deterioration of the transistor can be suppressed without an adverse effect on the operation of the transistor. Note that as in FIG. 16D, the thin film transistor 28 with four terminals which is illustrated in FIG. 16C is preferably used as the first transistor 31 and the sixth to ninth transistors 36 to 39 among the first to thirteenth transistors 31 to 43. The first transistor 31 and the sixth to ninth transistors 36 to 39 need to switch a potential of a node to which one electrode serving as a source or a drain is connected depending on a control signal of the gate electrode, and can reduce a malfunction of the pulse output circuit by quick response (sharp rising of on-current) to the control signal input to the gate electrode. By using the thin film transistor 28 with four terminals which is illustrated in FIG. 16C, the threshold voltage can be controlled, and a malfunction of the pulse output circuit can be further reduced. Note that although the first control signal G1 and the second control signal G2 are the same control signals in FIG. 16D, the first control signal G1 and the second control signal G2 may be different control signals.

In FIG. 16D, a first terminal of the first transistor 31 is electrically connected to the power supply line 51, a second terminal of the first transistor 31 is electrically connected to a first terminal of the ninth transistor 39, and gate electrodes (a lower gate electrode and an upper gate electrode) of the first transistor 31 are electrically connected to the fourth input terminal 24. A first terminal of the second transistor 32 is electrically connected to the power supply line 53, a second terminal of the second transistor 32 is electrically connected to the first terminal of the ninth transistor 39, and a gate electrode of the second transistor 32 is electrically connected to a gate electrode of the fourth transistor 34. A first terminal of the third transistor 33 is electrically connected to the first input terminal 21, and a second terminal of the third transistor 33 is electrically connected to the first output terminal 26. A first terminal of the fourth transistor 34 is electrically connected to the power supply line 53, and a second terminal of the fourth transistor 34 is electrically connected to the first output terminal 26. A first terminal of the fifth transistor 35 is electrically connected to the power supply line 53, a second terminal of the fifth transistor 35 is electrically connected to the gate electrode of the second transistor 32 and the gate electrode of the fourth transistor 34, and a gate electrode of the fifth transistor 35 is electrically connected to the fourth input terminal 24. A first terminal of the sixth transistor 36 is electrically connected to the power supply line 52, a second terminal of the sixth transistor 36 is electrically connected to the gate electrode of the second transistor 32 and the gate electrode of the fourth transistor 34, and gate electrodes (a lower gate electrode and an upper gate electrode) of the sixth transistor 36 are electrically connected to the fifth input terminal 25. A first terminal of the seventh transistor 37 is electrically connected to the power supply line 52, a second terminal of the seventh transistor 37 is electrically connected to a second terminal of the eighth transistor 38, and gate electrodes (a lower gate electrode and an upper gate electrode) of the seventh transistor 37 are electrically connected to the third input terminal 23. A first terminal of the eighth transistor 38 is electrically connected to the gate electrode of the second transistor 32 and the gate electrode of the fourth transistor 34, and gate electrodes (a lower gate electrode and an upper gate electrode) of the eighth transistor 38 are electrically connected to the second input terminal 22. The first terminal of the ninth transistor 39 is electrically connected to the second terminal of the first transistor 31 and the second terminal of the second transistor 32, a second terminal of the ninth transistor 39 is electrically connected to a gate electrode of the third transistor 33 and a gate electrode of the tenth transistor 40, and gate electrodes (a lower gate electrode and an upper gate electrode) of the ninth transistor 39 are electrically connected to the power supply line 52. A first terminal of the tenth transistor 40 is electrically connected to the first input terminal 21, a second terminal of the tenth transistor 40 is electrically connected to the second output terminal 27, and the gate electrode of the tenth transistor 40 is electrically connected to the second terminal of the ninth transistor 39. A first terminal of the eleventh transistor 41 is electrically connected to the power supply line 53, a second terminal of the eleventh transistor 41 is electrically connected to the second output terminal 27, and a gate electrode of the eleventh transistor 41 is electrically connected to the gate electrode of the second transistor 32 and the gate electrode of the fourth transistor 34. A first terminal of the twelfth transistor 42 is electrically connected to the power supply line 53, a second terminal of the twelfth transistor 42 is electrically connected to the second output terminal 27, and a gate electrode of the twelfth transistor 42 is electrically connected to the gate electrodes (the lower gate electrode and the upper gate electrode) of the seventh transistor 37. A first terminal of the thirteenth transistor 43 is electrically connected to the power supply line 53, a second terminal of the thirteenth transistor 43 is electrically connected to the first output terminal 26, and a gate electrode of the thirteenth transistor 43 is electrically connected to the gate electrodes (the lower gate electrode and the upper gate electrode) of the seventh transistor 37.

In FIG. 16D, a connection point where the gate electrode of the third transistor 33, the gate electrode of the tenth transistor 40, and the second terminal of the ninth transistor 39 are connected is referred to as a node A. A connection point where the gate electrode of the second transistor 32, the gate electrode of the fourth transistor 34, the second terminal of the fifth transistor 35, the second terminal of the sixth transistor 36, the first terminal of the eighth transistor 38, and the gate electrode of the eleventh transistor 41 are connected is referred to as a node B (see FIG. 17A).

Note that a thin film transistor is an element having at least three terminals of a gate, a drain, and a source. The thin film transistor has a channel region between a drain region and a source region, and current can flow through the drain region, the channel region, and the source region. Here, since the source and the drain of the thin film transistor may interchange depending on the structure, the operating condition, and the like of the thin film transistor, it is difficult to define which is a source or a drain. Therefore, a region functioning as source and drain is not called the source or the drain in some cases. In such a case, for example, one of the source and the drain may be referred to as a first terminal and the other thereof may be referred to as a second terminal.

Figure 17A:
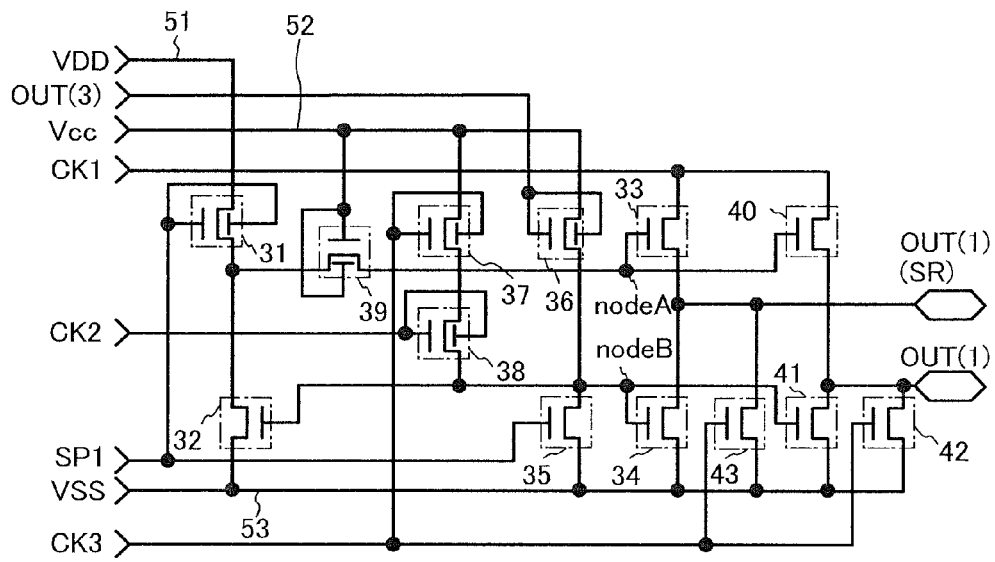
FIGS. 17A and 17B illustrate a semiconductor device of an embodiment of the present invention.

Note that in FIG. 16D and FIG. 17A, a capacitor for performing bootstrap operation by bringing the node A into a floating state may be additionally provided. Furthermore, a capacitor having one electrode electrically connected to the node B may be additionally provided in order to hold a potential of the node B.

Figure 17B:
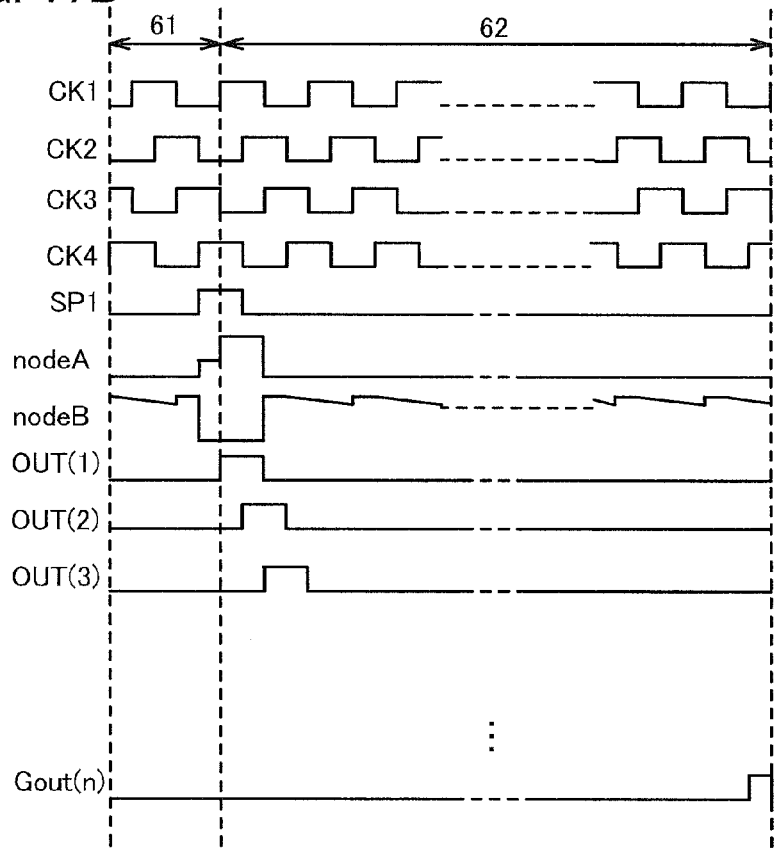

FIG. 17B is a timing diagram of a shift register including a plurality of pulse output circuits illustrated in FIG. 17A. Note that when the shift register is included in a scan line driver circuit, a period 61 in FIG. 17B corresponds to a vertical retrace period and a period 62 corresponds to a gate selection period.

Note that by providing the ninth transistor 39 in which the second power supply potential VCC is applied to the gate as illustrated in FIG. 17A, the following advantages before and after bootstrap operation are provided.

Without the ninth transistor 39 in which the second power supply potential VCC is applied to the gate electrode, if a potential of the node A is raised by bootstrap operation, a potential of the source which is the second terminal of the first transistor 31 rises to a value higher than the first power supply potential VDD. Then, the first terminal of the first transistor 31, that is, the terminal on the power supply line 51 side, comes to serve as a source of the first transistor 31. Consequently, in the first transistor 31, a high bias voltage is applied and thus significant stress is applied between the gate and the source and between the gate and the drain, which might cause deterioration of the transistor. On the other hand, with the ninth transistor 39 in which the second power supply potential VCC is applied to the gate electrode, increase in potential of the second terminal of the first transistor 31 can be prevented while the potential of the node A is raised by bootstrap operation. In other words, providing the ninth transistor 39 can lower the level of a negative bias voltage applied between the gate and the source of the first transistor 31. Thus, the circuit configuration in this embodiment can reduce a negative bias voltage applied between the gate and the source of the first transistor 31, so that deterioration of the first transistor 31 due to stress can be suppressed.

Note that the ninth transistor 39 can be provided anywhere as long as the first terminal and the second terminal of the ninth transistor 39 are connected between the second terminal of the first transistor 31 and the gate of the third transistor 33. Note that when the shift register including a plurality of pulse output circuits in this embodiment is included in a signal line driver circuit having a larger number of stages than a scan line driver circuit, the ninth transistor 39 can be omitted, which is advantageous in that the number of transistors is reduced.

Note that an oxide semiconductor is used for semiconductor layers of the first to thirteenth transistors 31 to 43; thus, the off-current of the thin film transistors can be reduced, the on-current and field effect mobility can be increased, and the degree of deterioration of the transistors can be reduced. As a result, a malfunction in the circuit can be reduced. Moreover, the transistor including an oxide semiconductor less deteriorates by application of a high potential to a gate electrode compared to a transistor including amorphous silicon. Consequently, even when the first power supply potential VDD is supplied to the power supply line which supplies the second power supply potential VCC, the shift register can operate similarly and the number of power supply lines between circuits can be reduced; thus, the size of the circuit can be reduced.

Note that the shift register will achieve similar effect even when the connection relation is changed so that a clock signal that is supplied to the gate electrodes (the lower gate electrode and the upper gate electrode) of the seventh transistor 37 from the third input terminal 23 and a clock signal that is supplied to the gate electrodes (the lower gate electrode and the upper gate electrode) of the eighth transistor 38 from the second input terminal 22 may be supplied from the second input terminal 22 and the third input terminal 23, respectively. In the shift register illustrated in FIG. 17A, a state of the seventh transistor 37 and the eighth transistor 38 is changed so that both the seventh transistor 37 and the eighth transistor 38 are on, then the seventh transistor 37 is off and the eighth transistor 38 is on, and then the seventh transistor 37 and the eighth transistor 38 are off; thus, the fall in potential of the node B, which is caused by fall in potentials of the second input terminal 22 and the third input terminal 23, is caused twice by fall in potential of the gate electrode of the seventh transistor 37 and fall in potential of the gate electrode of the eighth transistor 38. On the other hand, in the case where a state of the seventh transistor 37 and the eighth transistor 38 in the shift register illustrated in FIG. 17A is changed as in the period 61 in FIG. 17B so that both the seventh transistor 37 and the eighth transistor 38 are on, then the seventh transistor 37 is on and the eighth transistor 38 is off, and then the seventh transistor 37 and the eighth transistor 38 are off, the fall in potential of the node B, which is caused by fall in potentials of the second input terminal 22 and the third input terminal 23, is caused only once by fall in potential of the gate electrode of the eighth transistor 38. Therefore, the connection relation, that is, the clock signal K3 is supplied from the third input terminal 23 to the gate electrode of the seventh transistor 37 and the clock signal CK2 is supplied from the second input terminal 22 to the gate electrode of the eighth transistor 38, is preferable. That is because the number of times of the charge in the potential of the node B can be reduced, whereby the noise can be decreased.

In such a manner, an H-level signal is regularly supplied to the node B in a period during which the potentials of the first output terminal 26 and the second output terminal 27 are held at an L level; thus, a malfunction of the pulse output circuit can be suppressed.

Embodiment 9

By manufacturing thin film transistors and using the thin film transistors for a pixel portion and driver circuit, a semiconductor device having a display function (also referred to as a display device) can be manufactured. Moreover, some or all of the driver circuits which include the thin film transistors, can be formed over a substrate where the pixel portion is formed, whereby a system-on-panel can be obtained.

The display device includes a display element. Examples of the display element include a liquid crystal element (also referred to as a liquid crystal display element) and a light-emitting element (also referred to as a light-emitting display element). The light-emitting element includes an element whose luminance is controlled by current or voltage in its category, and specifically includes an inorganic electroluminescent (EL) element, an organic EL element, and the like in its category. Furthermore, the display device may include a display medium whose contrast is changed by an electric effect, such as electronic ink.

In addition, the display device includes a panel in which the display element is sealed, and a module in which an IC and the like including a controller are mounted on the panel. Furthermore, an element substrate, which is one embodiment before the display element is completed in a manufacturing process of the display device, is provided with a means for supplying current to the display element in each of a plurality of pixels. Specifically, the element substrate may be in a state in which only a pixel electrode of the display element is formed, a state in which a conductive film to be a pixel electrode is formed but is not etched yet to form the pixel electrode, or any other states.

Note that a display device in this specification refers to an image display device or a light source (including a lighting device). Further, the display device also includes any of the following modules in its category: a module to which a connector such as a flexible printed circuit (FPC), a tape automated bonding (TAB) tape, or a tape carrier package (TCP) is attached; a module having a TAB tape or a TCP at the end of which a printed wiring board is provided; and a module having an integrated circuit (IC) that is directly mounted on a display element by a chip on glass (COG) method.

The appearance and a cross section of a liquid crystal display panel, which is one embodiment of a semiconductor device, will be described with reference to FIGS. 10A1, 10A2, and 10B. FIGS. 10A1 and 10A2 are plan views of panels in which thin film transistors 4010 and 4011 and a liquid crystal element 4013 are sealed between a first substrate 4001 and a second substrate 4006 with a sealant 4005. FIG. 10B is a cross-sectional view along M-N in FIGS. 10A1 and 10A2.

The sealant 4005 is provided so as to surround a pixel portion 4002 and a scan line driver circuit 4004 which are provided over the first substrate 4001. The second substrate 4006 is provided over the pixel portion 4002 and the scan line driver circuit 4004. Consequently, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that there is no particular limitation on the connection method of the driver circuit which is separately formed, and a COG method, a wire bonding method, a TAB method, or the like can be used. FIG. 10A1 illustrates an example in which the signal line driver circuit 4003 is mounted by a COG method. FIG. 10A2 illustrates an example in which the signal line driver circuit 4003 is mounted by a TAB method.

The pixel portion 4002 and the scan line driver circuit 4004 provided over the first substrate 4001 include a plurality of thin film transistors. FIG. 10B illustrates the thin film transistor 4010 included in the pixel portion 4002 and the thin film transistor 4011 included in the scan line driver circuit 4004, as an example. Insulating layers 4041a, b, 4042a, 4042b, 4020, and 4021 are provided over the thin film transistors 4010 and 4011.

Any of the highly reliable thin film transistors including the oxide semiconductor layers which are described in Embodiments 1, 2, 5, and 6 can be used as the thin film transistors 4010 and 4011. Any of the thin film transistors 260, 289, and 270 described in Embodiments 1, 2, 5, and 6 can be used as the thin film transistor 4011 for the driver circuit, and any of the thin film transistors 420, 448, 220, 280, and 290 can be used as the thin film transistor 4010 for a pixel. In this embodiment, the thin film transistors 4010 and 4011 are n-channel thin film transistors.

A conductive layer 4040 is provided over part of the insulating layer 4021, which overlaps with a channel formation region of an oxide semiconductor layer in the thin film transistor 4011 for the driver circuit. The conductive layer 4040 is provided at the position overlapping with the channel formation region of the oxide semiconductor layer, whereby the amount of change in threshold voltage of the thin film transistor 4011 before and after the BT test can be reduced. A potential of the conductive layer 4040 may be the same or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the thin film transistor 4010. A counter electrode layer 4031 of the liquid crystal element 4013 is formed on the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 functioning as alignment films, respectively, and the liquid crystal layer 4008 is sandwiched between the pixel electrode layer 4030 and the counter electrode layer 4031 with the insulating layers 4032 and 4033 therebetween.

Note that a light-transmitting substrate can be used as the first substrate 4001 and the second substrate 4006; glass, ceramics, or plastics can be used. The plastic can be a fiberglass-reinforced plastics (FRP) plate, a polyvinyl fluoride (PVF) film, a polyester film, or an acrylic resin film.

A spacer 4035 is a columnar spacer which is obtained by selective etching of an insulating film and provided in order to control the distance (a cell gap) between the pixel electrode layer 4030 and the counter electrode layer 4031. Alternatively, a spherical spacer may be used. The counter electrode layer 4031 is electrically connected to a common potential line formed over the substrate where the thin film transistor 4010 is formed. The counter electrode layer 4031 and the common potential line can be electrically connected to each other through conductive particles arranged between a pair of substrates using the common connection portion. Note that the conductive particles are included in the sealant 4005.

Alternatively, liquid crystal exhibiting a blue phase for which an alignment film is unnecessary may be used. A blue phase is one of liquid crystal phases, which is generated just before a cholesteric phase changes into an isotropic phase while the temperature of cholesteric liquid crystal is increased. Since the blue phase is only generated within a relatively narrow range of temperature, a liquid crystal composition containing a chiral agent at 5 wt % or more is used for the liquid crystal layer 4008 in order to improve the temperature range. The liquid crystal composition including liquid crystal exhibiting a blue phase and a chiral agent has a short response time of 1 msec or less and is optically isotropic; therefore, alignment treatment is not necessary and viewing angle dependence is small.

Note that this embodiment can also be applied to a transflective liquid crystal display device in addition to a transmissive liquid crystal display device.

Although, a polarizing plate is provided on the outer surface of the substrate (on the viewer side) and a coloring layer and an electrode layer used for a display element are sequentially provided on the inner surface of the substrate in the example of the liquid crystal display device, the polarizing plate may be provided on the inner surface of the substrate. The stacked-layer structure of the polarizing plate and the coloring layer is not limited to that in this embodiment and may be set as appropriate depending on materials of the polarizing plate and the coloring layer or conditions of the manufacturing process. Further, a light-blocking film serving as a black matrix may be provided in a portion other than the display portion.

In the thin film transistor 4011, the insulating layer 4041*a* which serves as a channel protective layer and the insulating layer 4041*b* which covers a peripheral portion (including a side surface) of the stack of the oxide semiconductor layers are formed. In a similar manner, in the thin film transistor 4010, the insulating layer 4042*a* which serves as a channel protective layer and the insulating layer 4042*b* which covers a peripheral portion (including a side surface) of the stack of the oxide semiconductor layers are formed.

The insulating layers 4041*b* and 4042*b* which cover the peripheral portion (including the side surface) of the stack of the first oxide semiconductor layers and the second oxide semiconductor layer increase the distance between the gate electrode layer and a wiring layer (for example, a source wiring layer or a capacitor wiring layer) over or in the vicinity of the gate electrode layer, whereby parasitic capacitance can be reduced. The insulating layers 4041*a*, 4041*b*, 4042*a*, and 4042*b* may be formed using a material and a method which are similar to those of the oxide insulating layers 426*a* and 426*b* described in Embodiment 1. In addition, in order to reduce the surface roughness due to the thin film transistors, the thin film transistors are covered with the insulating layer 4021 serving as a planarization insulating film. Here, as the insulating layers 4041*a*, 4041*b*, 4042*a*, and 4042*b*, a silicon oxide film is formed by a sputtering method according to Embodiment 1.

The insulating layer 4020 is formed over the insulating layers 4041*a*, 4101*b*, 4042*a*, and 4042*b*. The insulating layer 4020 can be formed using a material and a method which are similar to those of the protective insulating layer 403 described in Embodiment 1. Here, a silicon nitride film is formed by an RF sputtering method or a RF sputtering method as the insulating layer 4020.

The insulating layer 4021 is formed as the planarizing insulating film. The insulating layer 4021 can be formed using a material and a method which are similar to those of the planarizing insulating layer 404 described in Embodiment 1, and a heat-resistant organic material such as polyimide, acrylic, benzocyclobutene, polyamide, or epoxy can be used. Other than such organic materials, it is also possible to use a low-dielectric constant material (a low-k material), a siloxane-based resin, phosphosilicate glass (PSG), borophosphosilicate glass (BPSG), or the like. Note that the insulating layer 4021 may be formed by stacking a plurality of insulating films formed from these materials.

In this embodiment, a plurality of thin film transistors in the pixel portion may be surrounded together by a nitride insulating film. For example, a structure may be employed in which a nitride insulating film is used as the insulating layer 4020 and the gate insulating layer, and the insulating layer 4020 is in contact with the gate insulating layer at least in the periphery surrounding the pixel portion over the active matrix substrate, as illustrated in FIGS. 10A1, 10A2, and 10B. In this manufacturing process, entry of moisture from the outside can be prevented. Moreover, entry of moisture from the outside can be prevented in the long term even after the device is completed as a semiconductor device, for example, as a display device; thus, the long-term reliability of the device can be improved.

Note that the siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. The organic group may include a fluoro group.

There is no particular limitation on the method of forming the insulating layer 4021. Depending on the material, the insulating layer 4021 can be formed by a method such as sputtering method, an SOG method, a spin coating method, a dipping method, a spray coating method, or a droplet discharge method (e.g., an ink jet method, screen printing, or offset printing), or by using a tool (apparatus) such as a doctor knife, a roll coater, a curtain coater, a knife coater, or the like. When the baking step of the insulating layer 4021 and the annealing of the semiconductor layer are combined, a semiconductor device can be manufactured efficiently.

The pixel electrode layer 4030 and the counter electrode layer 4031 can be formed from a light-transmitting conductive material such as indium oxide containing tungsten oxide, indium zinc oxide containing tungsten oxide, indium oxide containing titanium oxide, indium tin oxide containing titanium oxide, indium tin oxide (hereinafter, referred to as ITO), indium zinc oxide, or indium tin oxide to which silicon oxide is added.

Alternatively, a conductive composition including a conductive high molecule (also referred to as a conductive polymer) can be used for the pixel electrode layer 4030 and the counter electrode layer 4031. The pixel electrode formed using the conductive composition preferably has a sheet resistance of 10000 ohms per square or less and a light transmittance of 70% or more at a wavelength of 550 nm. Further, the resistivity of the conductive high molecule included in the conductive composition is preferably 0.1 Ω·cm or less.

As the conductive high molecule, a so-called π-electron conjugated conductive polymer can be used. Examples are polyaniline and a derivative thereof, polypyrrole and a derivative thereof, polythiophene and a derivative thereof, and a copolymer of two or more of these materials.

Further, a variety of signals and potentials are supplied to the signal line driver circuit 4003 which is separately formed, the scan line driver circuit 4004, or the pixel portion 4002 from an FPC 4018.

A connection terminal electrode 4015 is formed using the same conductive film as the pixel electrode layer 4030 included in the liquid crystal element 4013. A terminal electrode 4016 is formed using the same conductive film as source and drain electrode layers of the thin film transistors 4010 and 4011.

The connection terminal electrode 4015 is electrically connected to a terminal included in the FPC 4018 through an anisotropic conductive film 4019.

Note that FIGS. 10A1, 10A2, and 10B illustrate the example in which the signal line driver circuit 4003 is formed separately and mounted on the first substrate 4001; however, this embodiment is not limited to this structure. The scan line driver circuit may be separately formed and then mounted, or only part of the signal line driver circuit or part of the scan line driver circuit may be separately formed and then mounted.

Figure 19:
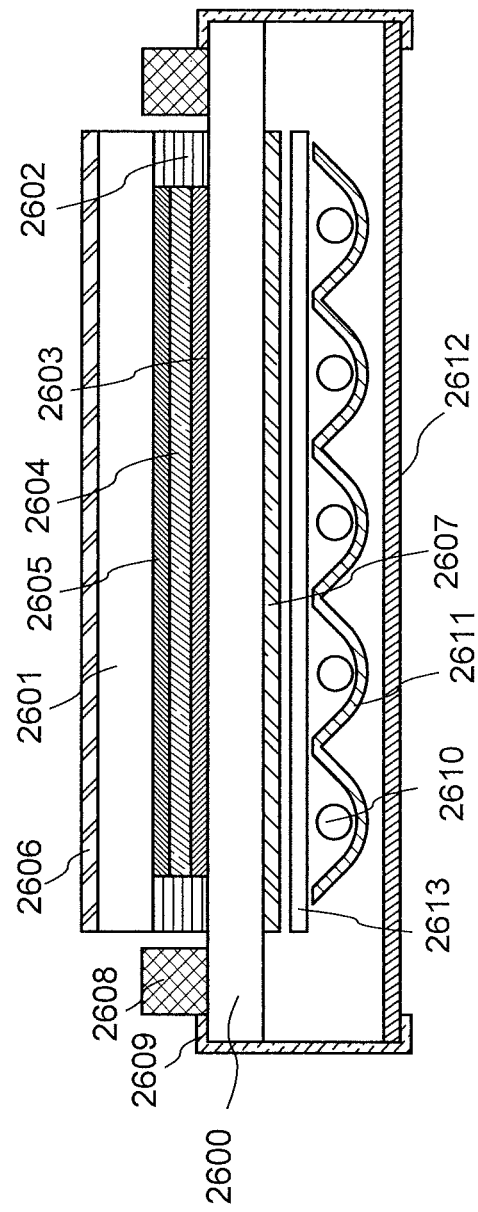
FIG. 19 illustrates a semiconductor device of an embodiment of the present invention.

FIG. 19 illustrates an example of a liquid crystal display module which is formed as a semiconductor device using a TFT substrate 2600 manufactured according to the manufacturing method disclosed in this specification.

FIG. 19 illustrates an example of the liquid crystal display module, in which the TFT substrate 2600 and a counter substrate 2601 are fixed to each other with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In the RGB system, coloring layers corresponding to colors of red, green, and blue are provided for pixels. Polarizing plates 2606 and 2607 and a diffusion plate 2613 are provided outside the TFT substrate 2600 and the counter substrate 2601. A light source includes a cold cathode tube 2610 and a reflective plate 2611. A circuit board 2612 is connected to a wiring circuit portion 2608 of the TFT substrate 2600 by a flexible wiring board 2609 and includes an external circuit such as a control circuit or a power source circuit. The polarizing plate and the liquid crystal layer may be stacked with a retardation plate interposed therebetween.

For the liquid crystal display module, a twisted nematic (TN) mode, an in-plane-switching (IPS) mode, a fringe field switching (FFS) mode, a multi-domain vertical alignment (MVA) mode, a patterned vertical alignment (PVA) mode, an axially symmetric aligned micro-cell (ASM) mode, an optically compensated birefringence (OCB) mode, a ferroelectric liquid crystal (FLC) mode, an antiferroelectric liquid crystal (AFLC) mode, or the like can be employed.

Through the above, a highly reliable liquid crystal display panel as a semiconductor device can be manufactured.

This embodiment can be implemented in appropriate combination with the structures described in the other embodiments.

Embodiment 10

In this embodiment, an example of an electronic paper will be described as an embodiment of a semiconductor device.

A semiconductor device can be used for electronic paper in which electronic ink is driven by an element electrically connected to a switching element. Electronic paper is also referred to as an electrophoretic display device (an electrophoretic display) and is advantageous in that it has the same level of readability as plain paper, it has lower power consumption than other display devices, and it can be made thin and lightweight.

Electrophoretic displays can have various modes. Electrophoretic displays contain a plurality of microcapsules dispersed in a solvent or a solute, each microcapsule containing first particles which are positively charged and second particles which are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above microcapsules are dispersed in a solvent is referred to as electronic ink. This electronic ink can be printed on a surface of glass, plastic, cloth, paper, or the like. Furthermore, by using a color filter or particles that have a pigment, color display can also be achieved.

In addition, if a plurality of the above microcapsules are arranged as appropriate over an active matrix substrate so as to be interposed between two electrodes, an active matrix display device can be completed, and display can be performed by application of an electric field to the microcapsules. As the active matrix substrate, for example, the active matrix substrate with the use of any of the thin film transistors obtained in Embodiments 1, 2, 5, and 6 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 18:
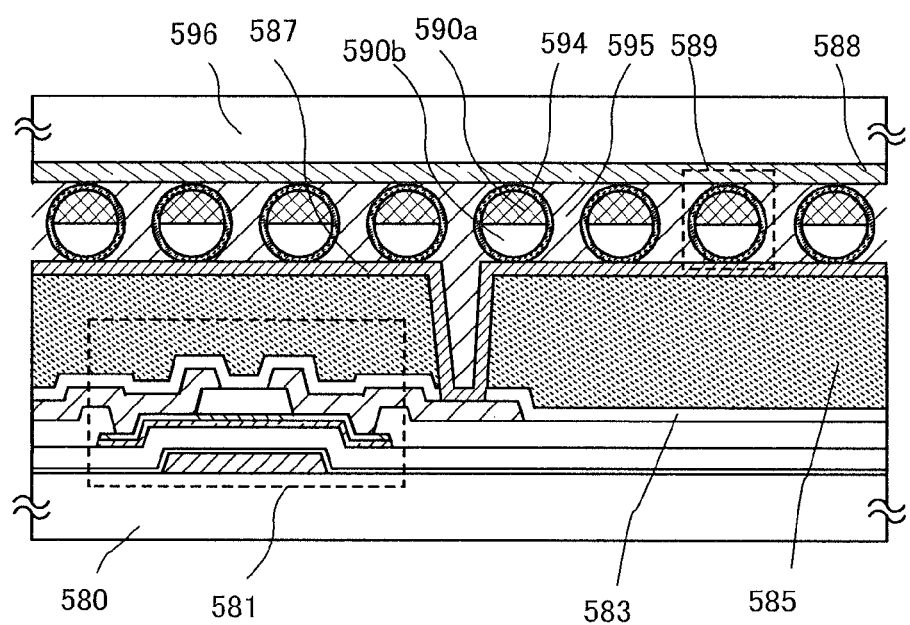
FIG. 18 illustrates a semiconductor device of an embodiment of the present invention.

FIG. 18 illustrates an active matrix electronic paper as an example of a semiconductor device. A thin film transistor 581 used for the semiconductor device can be formed in a manner similar to the thin film transistor described in Embodiment 1, which is a highly reliable thin film transistor including an oxide semiconductor layer. Any of the thin film transistors described in Embodiments 2, 5, and 6 can also be used as the thin film transistor 581 of this embodiment.

The electronic paper in FIG. 18 is an example of a display device using a twisting ball display system. The twisting ball display system refers to a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

The thin film transistor 581 is a thin film transistor having a bottom-gate structure and is covered with an insulating film 583 that is in contact with the semiconductor layer. A source electrode layer or a drain electrode layer of the thin film transistor 581 is in contact with a first electrode layer 587 in an opening formed in an insulating layer 585, whereby the thin film transistor 581 is electrically connected to the first electrode layer 587. Between the first electrode layer 587 and a second electrode layer 588 adjacent to a second substrate 596, spherical particles 589 are provided. Each spherical particle 589 includes a black region 590*a* and a white region 590*b*, and a cavity 594 filled with liquid around the black region 590*a* and the white region 590*b*. The circumference of the spherical particle 589 is filled with filler 595 such as a resin (see FIG. 18). The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 can be electrically connected to the common potential line through conductive particles provided between a pair of substrates.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite sides, so that white or black can be displayed. The electrophoretic display element has higher reflectivity than a liquid crystal display element. The electrophoretic display element has higher reflectance than a liquid crystal display element, and thus, an auxiliary light is unnecessary, power consumption is low, and a display portion can be recognized in a dim place. In addition, even when power is not supplied to the display portion, an image which has been displayed once can be maintained. Accordingly, a displayed image can be stored even if a semiconductor device having a display function (which may be referred to simply as a display device or a semiconductor device provided with a display device) is distanced from an electric wave source.

Through this process, a highly reliable electronic paper as a semiconductor device can be manufactured.

This embodiment can be combined with any of the structures described in the other embodiments as appropriate.

Embodiment 11

An example of a light-emitting display device will be described as a semiconductor device. As a display element included in a display device, a light-emitting element utilizing electroluminescence is described here. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are separately injected from a pair of electrodes into a layer containing a light-emitting organic compound, and current flows. The carriers (electrons and holes) are recombined, and thus, the light-emitting organic compound is excited. The light-emitting organic compound returns to a ground state from the excited state, thereby emitting light. Owing to such a mechanism, this light-emitting element is referred to as a current-excitation light-emitting element.

The inorganic EL elements are classified according to their element structures into a dispersion-type inorganic EL element and a thin-film inorganic EL element. A dispersion-type inorganic EL element has a light-emitting layer where particles of a light-emitting material are dispersed in a binder, and its light emission mechanism is donor-acceptor recombination type light emission that utilizes a donor level and an acceptor level. A thin-film inorganic EL element has a structure where a light-emitting layer is sandwiched between dielectric layers, which are further sandwiched between electrodes, and its light emission mechanism is localized type light emission that utilizes inner-shell electron transition of metal ions. Note that an example of an organic EL element as a light-emitting element is described here.

Figure 12:
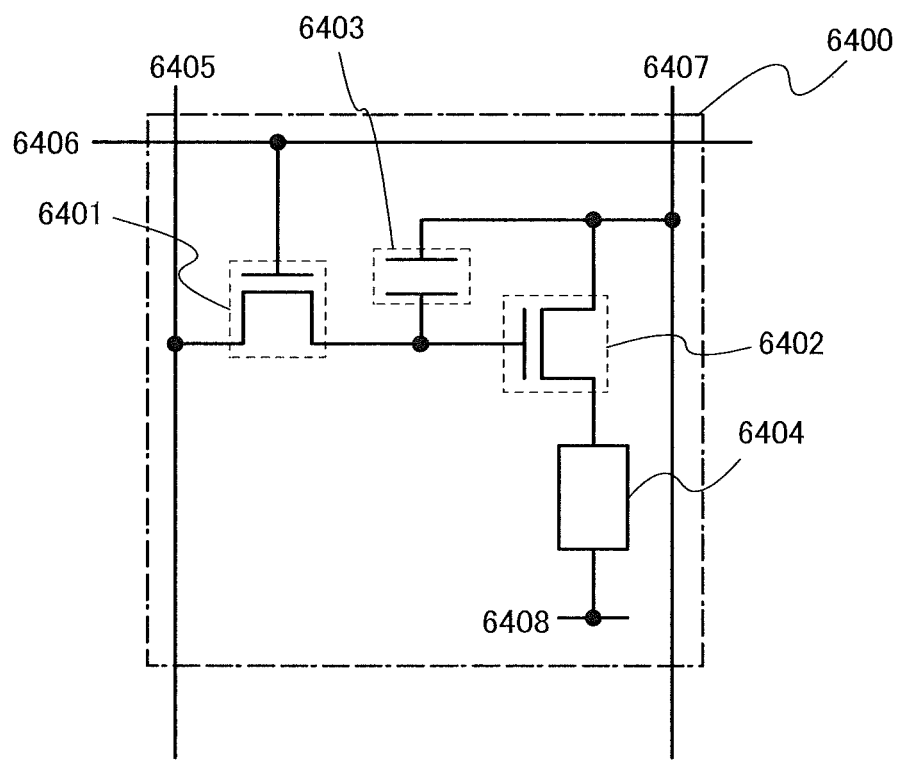
FIG. 12 illustrates an equivalent circuit of a pixel of a semiconductor device of an embodiment of the present invention.

FIG. 12 illustrates an example of a pixel structure as an example of a semiconductor device which can be driven by a digital time grayscale method.

A structure and operation of a pixel to which digital time grayscale driving can be applied are described. Here, one pixel includes two n-channel transistors each of which includes an oxide semiconductor layer as a channel formation region.

A pixel 6400 includes a switching transistor 6401, a driver transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driver transistor 6402. The gate of the driver transistor 6402 is connected to a power supply line 6407 via the capacitor 6403, a first electrode of the driver transistor 6402 is connected to the power supply line 6407, and a second electrode of the driver transistor 6402 is connected to a first electrode (pixel electrode) of the light-emitting element 6404. A second electrode of the light-emitting element 6404 corresponds to a common electrode 6408. The common electrode 6408 is electrically connected to a common potential line provided over the same substrate.

The second electrode (common electrode 6408) of the light-emitting element 6404 is set to a low power supply potential. Note that the low power supply potential is a potential satisfying the low power supply potential<a high power supply potential with reference to the high power supply potential that is set to the power supply line 6407. As the low power supply potential, GND, 0 V, or the like may be employed, for example. A potential difference between the high power supply potential and the low power supply potential is applied to the light-emitting element 6404 and current is supplied to the light-emitting element 6404, so that the light-emitting element 6404 emits light. Here, in order to make the light-emitting element 6404 emit light, each potential is set so that the potential difference between the high power supply potential and the low power supply potential is a forward threshold voltage or higher of the light-emitting element 6404.

Note that gate capacitor of the driver transistor 6402 may be used as a substitute for the capacitor 6403, so that the capacitor 6403 can be omitted. The gate capacitor of the driver transistor 6402 may be formed between the channel region and the gate electrode.

In the case of a voltage-input voltage driving method, a video signal is input to the gate of the driver transistor 6402 so that the driver transistor 6402 is in either of two states of being sufficiently turned on or turned off. That is, the driver transistor 6402 operates in a linear region. Since the driver transistor 6402 operates in the linear region, a voltage higher than the voltage of the power supply line 6407 is applied to the gate of the driver transistor 6402. Note that a voltage higher than or equal to (voltage of the power supply line+Vth of the driver transistor 6402) is applied to the signal line 6405.

In the case of using an analog grayscale method instead of the digital time grayscale method, the same pixel structure as in FIG. 12 can be employed by inputting signals in a different way.

In the case of performing analog grayscale driving, a voltage higher than or equal to (forward voltage of the light-emitting element 6404+Vth of the driver transistor 6402) is applied to the gate of the driver transistor 6402. The forward voltage of the light-emitting element 6404 indicates a voltage at which a desired luminance is obtained, and includes at least forward threshold voltage. The video signal by which the driver transistor 6402 operates in a saturation region is input, so that current can be supplied to the light-emitting element 6404. In order for the driver transistor 6402 to operate in the saturation region, the potential of the power supply line 6407 is set higher than the gate potential of the driver transistor 6402. When an analog video signal is used, it is possible to feed current to the light-emitting element 6404 in accordance with the video signal and perform analog grayscale driving.

Note that the pixel structure is not limited to that illustrated in FIG. 12. For example, the pixel in FIG. 12 can further include a switch, a resistor, a capacitor, a transistor, a logic circuit, or the like.

Next, structures of the light-emitting element are described with reference to FIGS. 13A to 13C. Here, a cross-sectional structure of a pixel will be described by taking an n-channel driving TFT as an example. Driving TFTs 7001, 7011, and 7021 used in semiconductor devices illustrated in FIGS. 13A, 13B, and 13C, respectively, can be formed in a manner similar to that of the thin film transistor described in Embodiment 1 and are highly reliable thin film transistors each including an oxide semiconductor layer. Alternatively, the thin film transistors described in Embodiment 2, 5, or 6 can be employed as the driving TFTs 7001, 7011, and 7021.

In order to extract light emitted from the light-emitting element, at least one of an anode and a cathode is required to transmit light. A thin film transistor and a light-emitting element are formed over a substrate. A light-emitting element can have a top emission structure, in which light emission is extracted through the surface opposite to the substrate; a bottom emission structure, in which light emission is extracted through the surface on the substrate side; or a dual emission structure, in which light emission is extracted through the surface opposite to the substrate and the surface on the substrate side. The pixel structure can be applied to a light-emitting element having any of these emission structures.

A light-emitting element having a top emission structure is described with reference to FIG. 13A.

Figure 13A:
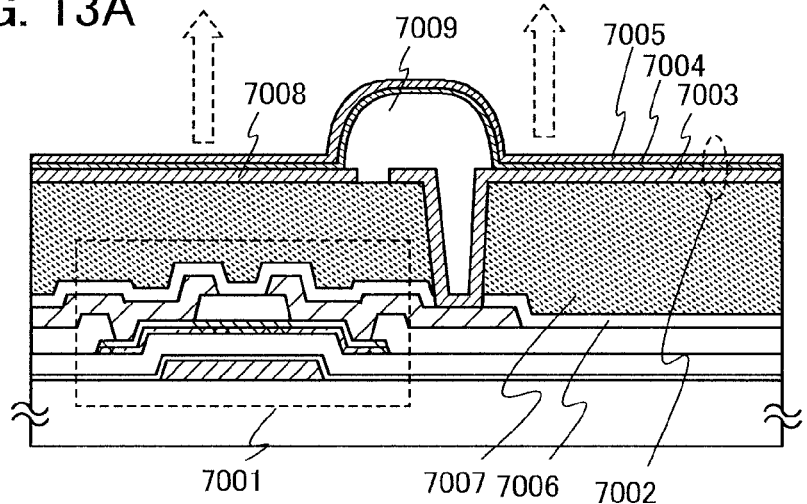
FIGS. 13A to 13C each illustrate a semiconductor device of an embodiment of the present invention.

FIG. 13A is a cross-sectional view of a pixel in the case where the driving TFT 7001 is an n-type TFT and light is emitted from a light-emitting element 7002 to an anode 7005 side. In FIG. 13A, a cathode 7003 of the light-emitting element 7002 is electrically connected to the TFT 7001 serving as a driving TFT, and a light-emitting layer 7004 and the anode 7005 are stacked in this order over the cathode 7003. The cathode 7003 can be formed using a variety of conductive materials as long as they have a low work function and reflect light. For example, Ca, Al, MgAg, AlLi, or the like is desirably used. The light-emitting layer 7004 may be formed using a single layer or a plurality of layers stacked. When the light-emitting layer 7004 is formed using a plurality of layers, the light-emitting layer 7004 is formed by stacking an electron-injection layer, an electron-transport layer, a light-emitting layer, a hole-transport layer, and a hole-injection layer in this order over the cathode 7003. It is not necessary to form all of these layers. The anode 7005 is formed using a light-transmitting conductive film such as a film of indium oxide containing tungsten oxide, indium zinc oxide containing tungsten oxide, indium oxide containing titanium oxide, indium tin oxide containing titanium oxide, indium tin oxide (hereinafter referred to as ITO), indium zinc oxide, or indium tin oxide to which silicon oxide is added.

The light-emitting element 7002 corresponds to a region where the light-emitting layer 7004 is sandwiched between the cathode 7003 and the anode 7005. In the case of the pixel illustrated in FIG. 13A, light is emitted from the light-emitting element 7002 to the anode 7005 side as indicated by an arrow.

Next, a light-emitting element having a bottom emission structure is described with reference to FIG. 13B. FIG. 13B is a cross-sectional view of a pixel in the case where the driving TFT 7011 is of an n-type and light is emitted from a light-emitting element 7012 to a cathode 7013 side. In FIG. 13B, the cathode 7013 of the light-emitting element 7012 is formed over a light-transmitting conductive film 7017 which is electrically connected to the driving TFT 7011, and a light-emitting layer 7014 and an anode 7015 are stacked in this order over the cathode 7013. A light-blocking film 7016 for reflecting or blocking light may be formed to cover the anode 7015 when the anode 7015 has a light-transmitting property. For the cathode 7013, various materials can be used as in the case of FIG. 13A as long as the cathode 7013 is formed using a conductive material having a low work function. The cathode 7013 is formed to have a thickness that can transmit light (preferably, approximately 5 nm to 30 nm). For example, an aluminum film with a thickness of 20 nm can be used as the cathode 7013. Similar to the case of FIG. 13A, the light-emitting layer 7014 may be formed using either a single layer or a plurality of layers stacked. The anode 7015 is not required to transmit light, but can be formed using a light-transmitting conductive material as in the case of FIG. 13A. As the light-blocking film 7016, a metal or the like that reflects light can be used for example; however, it is not limited to a metal film. For example, a resin or the like to which black pigments are added can also be used.

The light-emitting element 7012 corresponds to a region where the light-emitting layer 7014 is sandwiched between the cathode 7013 and the anode 7015. In the case of the pixel illustrated in FIG. 13B, light is emitted from the light-emitting element 7012 to the cathode 7013 side as indicated by an arrow.

Next, a light-emitting element having a dual emission structure is described with reference to FIG. 13C. In FIG. 13C, a cathode 7023 of a light-emitting element 7022 is formed over a light-transmitting conductive film 7027 which is electrically connected to the driving TFT 7021, and a light-emitting layer 7024 and an anode 7025 are stacked in this order over the cathode 7023. As in the case of FIG. 13A, the cathode 7023 can be formed using any of a variety of materials as long as the cathode 7023 is formed using a conductive material having a low work function. The cathode 7023 is formed to have a thickness that can transmit light. For example, a film of Al having a thickness of 20 nm can be used as the cathode 7023. The light-emitting layer 7024 may be formed using a single layer or a plurality of layers stacked as in the case of FIG. 13A. As in the case of FIG. 13A, the anode 7025 can be formed using a light-transmitting conductive material.

The light-emitting element 7022 corresponds to a region where the cathode 7023, the light-emitting layer 7024, and the anode 7025 overlap with one another. In the case of the pixel illustrated in FIG. 13C, light is emitted from the light-emitting element 7022 to both the anode 7025 side and the cathode 7023 side as indicated by arrows.

Note that, although the organic EL elements are described here as the light-emitting elements, an inorganic EL element can also be provided as a light-emitting element.

Note that the example is described in which a thin film transistor (a driving TFT) which controls the driving of a light-emitting element is electrically connected to the light-emitting element; however, a structure may be employed in which a TFT for current control is connected between the driving TFT and the light-emitting element.

Figure 13B:
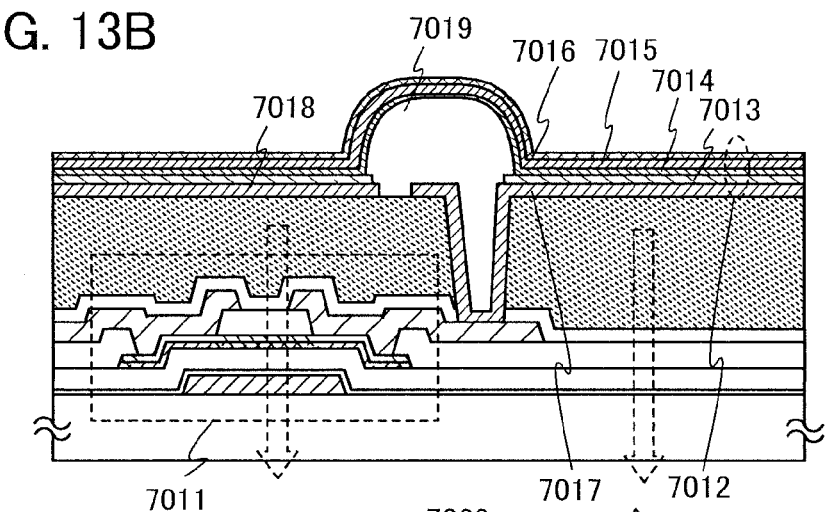
Figure 13C:
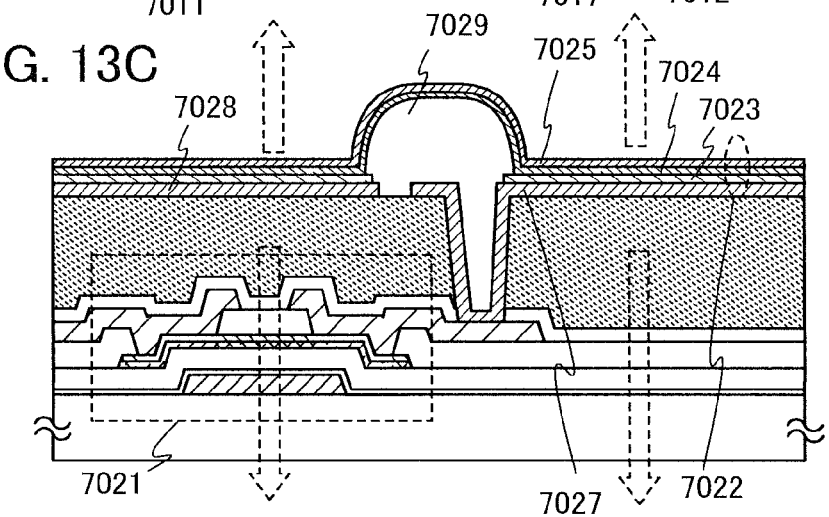

Note that the structure of the semiconductor device is not limited to those illustrated in FIGS. 13A to 13C and can be modified in various ways based on techniques disclosed in this specification.

Figure 11A:
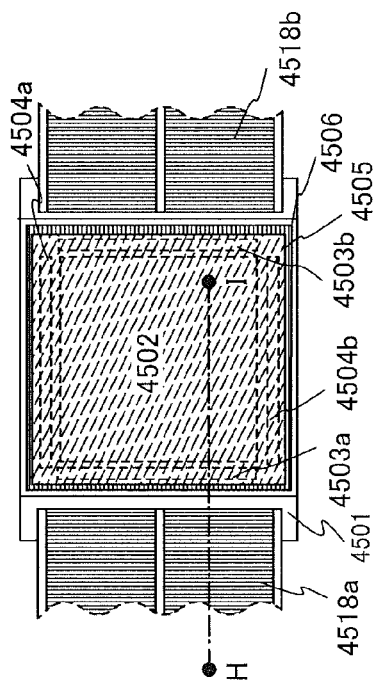
FIGS. 11A and 11B illustrate a semiconductor device of an embodiment of the present invention.
Figure 11B:
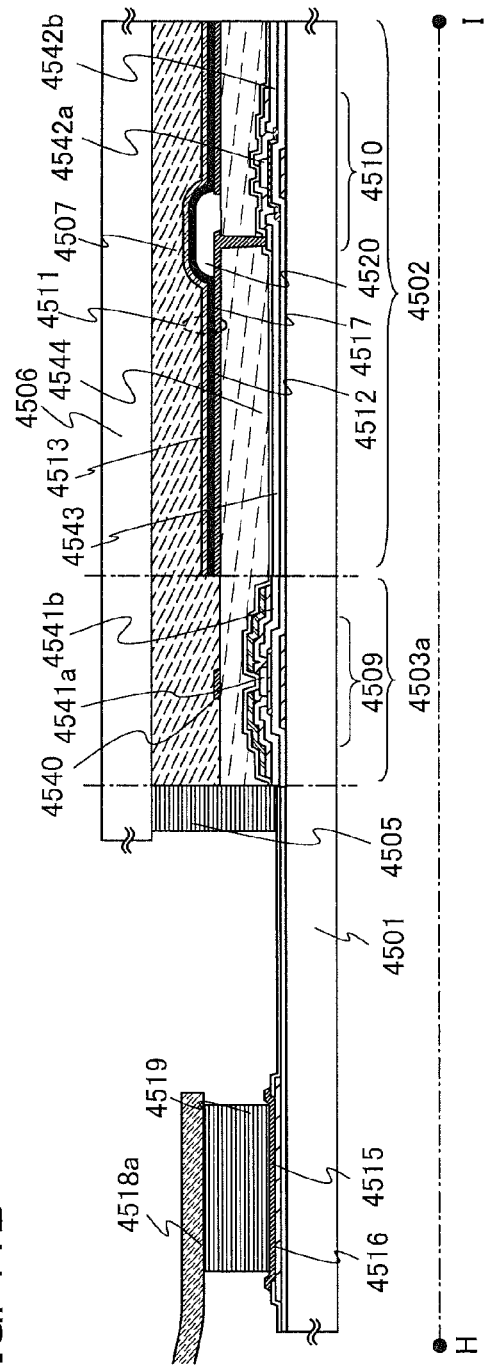

Next, the appearance and a cross section of a light-emitting display panel (also referred to as a light-emitting panel), which is one embodiment of the semiconductor device, are described with reference to FIGS. 11A and 11B. FIG. 11A is a top view of a panel in which a thin film transistor and a light-emitting element formed over a first substrate are sealed between the first substrate and a second substrate with a sealant. FIG. 11B is a cross-sectional view taken along line H-I of FIG. 11A.

A sealant 4505 is provided so as to surround a pixel portion 4502, signal line driver circuits 4503a and 4503b, and scan line driver circuits 4504a and 4504b which are provided over a first substrate 4501. In addition, a second substrate 4506 is provided over the pixel portion 4502, the signal line driver circuits 4503a and 4503b, and the scan line driver circuits 4504a and 4504b. Accordingly, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that a panel be packaged (sealed) with a protective film (such as a laminate film or an ultraviolet curable resin film) or a cover material with high air-tightness and little degasification so that the panel is not exposed to the outside air, in this manner.

The pixel portion 4502, the signal line driver circuits 4503a and 4503b, and the scan line driver circuits 4504a and 4504b formed over the first substrate 4501 each include a plurality of thin film transistors, and a thin film transistor 4510 included in the pixel portion 4502 and a thin film transistor 4509 included in the signal line driver circuit 4503a are illustrated as an example in FIG. 11B.

For the thin film transistors 4509 and 4510, the highly reliable thin film transistors including the oxide semiconductor layer described in any of Embodiments 1, 2, 5, and 6 can be employed. Any of the thin film transistors 260, 289, and 270 described in Embodiment 1, 2, 5, and 6 can be used as the thin film transistor 4509 for the driver circuit. Any of the thin film transistors 420, 448, 220, and 290 can be used as the thin film transistor 4510 for a pixel. In this embodiment, the thin film transistors 4509 and 4510 are n-channel thin film transistors.

A conductive layer 4540 is provided over part of an insulating layer 4544 so as to overlap with a channel formation region of an oxide semiconductor layer in the thin film transistor 4509 for the driver circuit. The conductive layer 4540 is provided so as to overlap with the channel formation region of the oxide semiconductor layer, whereby the amount of change in the threshold voltage of the thin film transistor 4509 before and after BT test can be reduced. Further, a potential of the conductive layer 4540 may be the same as or different from that of a gate electrode layer of the thin film transistor 4509. The conductive layer 4540 can function also as a second gate electrode layer. Alternatively, the potential of the conductive layer 4540 may be GND or 0 V, or the conductive layer 4540 may be in a floating state.

In the thin film transistor 4509, an insulating layer 4541a functioning as a channel protective layer and an insulating layer 4541b covering a peripheral portion (including a side surface) of a stack of the oxide semiconductor layers are formed. In a similar manner, in the thin film transistor 4510, an insulating layer 4542a functioning as a channel protective layer and an insulating layer 4542b covering a peripheral portion of a stack of the oxide semiconductor layers are formed.

Each of the insulating layer 4541b and 4542b, which is an oxide insulating layer covering the peripheral portion (including the side surface) of the stack of the oxide semiconductor layers, increases a distance between a gate electrode layer and a wiring layer such as a source wiring layer or a capacitor wiring layer formed above or around the gate electrode layer, so that parasitic capacitance can be reduced. The insulating layers 4541a, 4541b, 4542a, and 4542b may be formed using a material and a method which are similar to those of the oxide insulating layers 426a and 426b described in Embodiment 1. In addition, in order to reduce the surface roughness of the thin film transistors, the thin film transistors are covered with the insulating layer 4543 functioning as a planarizing insulating film. Here, as the insulating layers 4541a, 4541b, 4542a, and 4542b, a silicon oxide film is formed by sputtering, as described in Embodiment 1.

The insulating layer 4543 is formed over the insulating layers 4541a, 4541b, 4542a, and 4542b. The insulating layer 4543 may be formed using a material and a method similar to those of the protective insulating layer 403 described in Embodiment 1. Here, a silicon nitride film is formed by RF sputtering as the insulating layer 4543.

The insulating layer 4544 is formed as the planarization insulating film. The insulating layer 4544 may be formed using a material and a method which are similar to those of the planarizing insulating layer 404 described in Embodiment 1. Here, an acrylic resin is used for the insulating layer 4544.

In this embodiment, a plurality of thin film transistors in the pixel portion may be surrounded together by a nitride insulating film. It is possible to use a nitride insulating film as the insulating layer 4543 and a gate insulating layer and to provide a region where the insulating layer 4543 is in contact with the gate insulating layer so as to surround at least the periphery of the pixel portion over the active matrix substrate as illustrated in FIGS. 11A and 11B. In this manufacturing process, moisture can be prevented from entering from the outside. Moreover, entry of moisture from the outside can be prevented in the long term even after a device is completed as a semiconductor device, for example, as a display device; thus, the long-term reliability of the device can be achieved.

Moreover, reference numeral 4511 denotes a light-emitting element. A first electrode layer 4517 which is a pixel electrode included in the light-emitting element 4511 is electrically connected to a source electrode layer or a drain electrode layer of the thin film transistor 4510. Note that the structure of the light-emitting element 4511 is, but not limited to, the stack structure which includes the first electrode layer 4517, an electroluminescent layer 4512, and the second electrode layer 4513. The structure of the light-emitting element 4511 can be changed as appropriate depending on the direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material and an opening be formed over the first electrode layer 4517 so that a sidewall of the opening is formed as an inclined surface with continuous curvature.

The electroluminescent layer 4512 may be formed with a single layer or a plurality of layers stacked.

A protective film may be formed over the second electrode layer 4513 and the partition 4520 in order to prevent entry of oxygen, hydrogen, moisture, carbon dioxide, or the like into the light-emitting element 4511. As the protective film, a silicon nitride film, a silicon nitride oxide film, a DLC film, or the like can be formed.

In addition, a variety of signals and potentials are supplied to the signal line driver circuits 4503a and 4503b, the scan line driver circuits 4504a and 4504b, or the pixel portion 4502 from FPCs 4518a and 4518b.

A connection terminal electrode 4515 is formed from the same conductive film as the first electrode layer 4517 included in the light-emitting element 4511, and a terminal electrode 4516 is formed from the same conductive film as the source and drain electrode layers included in the thin film transistors 4509 and 4510.

The connection terminal electrode 4515 is electrically connected to a terminal included in the FPC 4518a via an anisotropic conductive film 4519.

As the second substrate located in the direction in which light is extracted from the light-emitting element 4511 needs to have a light-transmitting property. In that case, a light-transmitting material such as a glass plate, a plastic plate, a polyester film, or an acrylic film is used for the second substrate.

As the filler 4507, an ultraviolet curable resin or a thermosetting resin can be used, in addition to an inert gas such as nitrogen or argon. For example, PVC (polyvinyl chloride), acrylic, polyimide, an epoxy resin, a silicone resin, PVB (polyvinyl butyral), or EVA (ethylene vinyl acetate) can be used. For example, nitrogen is used for the filler.

In addition, if needed, an optical film, such as a polarizing plate, a circularly polarizing plate (including an elliptically polarizing plate), a retardation plate (a quarter-wave plate or a half-wave plate), or a color filter, may be provided as appropriate on a light-emitting surface of the light-emitting element. Further, the polarizing plate or the circularly polarizing plate may be provided with an anti-reflection film. For example, anti-glare treatment by which reflected light can be diffused by projections and depressions on the surface so as to reduce the glare can be performed.

The signal line driver circuits 4503a and 4503b and the scanning line driver circuits 4504a and 4504b may be mounted as driver circuits formed using a single crystal semiconductor film or a polycrystalline semiconductor film over a substrate separately prepared. Alternatively, only the signal line driver circuits or part thereof, or only the scan line driver circuits or part thereof may be separately formed and mounted. This embodiment is not limited to the structure illustrated in FIGS. 11A and 11B Through the above process, a highly reliable light-emitting display device (display panel) as a semiconductor device can be manufactured.

This embodiment can be implemented in combination with the structure described in any of Embodiment 1 to 4 and Embodiments 6 to 8 as appropriate.

Embodiment 12

A semiconductor device disclosed in this specification can be applied to electronic paper. An electronic paper can be used for electronic appliances of a variety of fields as long as they can display data. For example, an electronic paper can be applied to an e-book reader (electronic book), a poster, an advertisement in a vehicle such as a train, or displays of various cards such as a credit card. An example of the electronic device is illustrated in FIG. 20.

Figure 20:
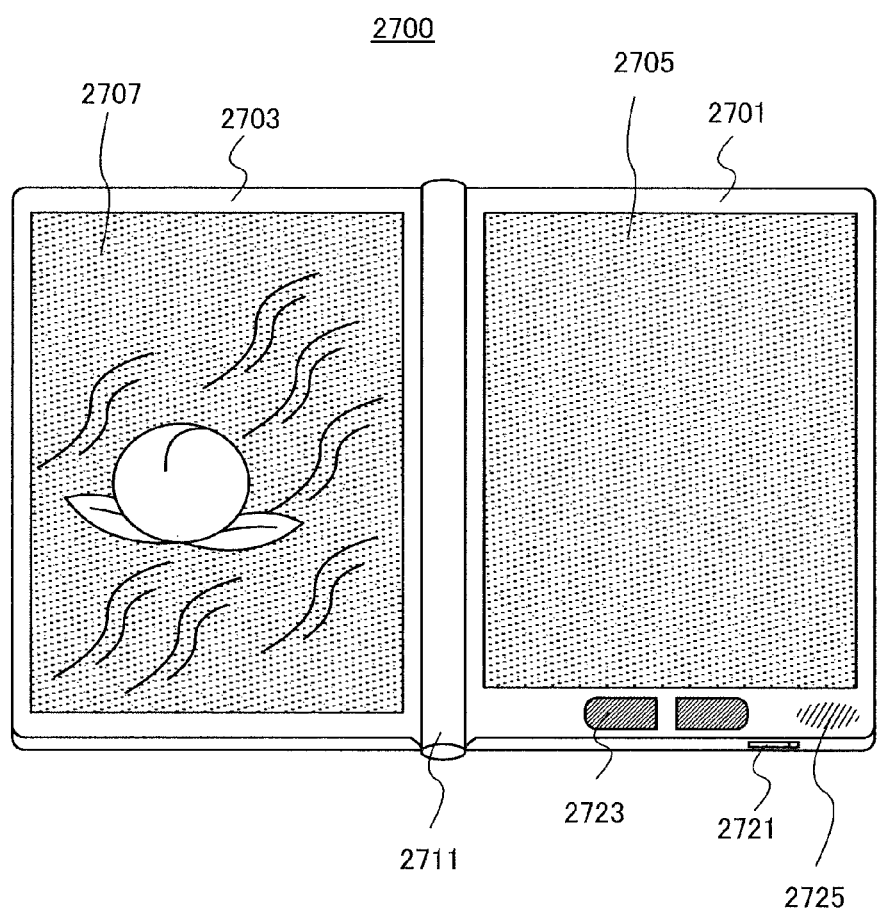
FIG. 20 is an external view illustrating an electronic book of an embodiment of the present invention.

FIG. 20 illustrates an example of an electronic book reader 2700. For example, the electronic book reader 2700 includes two housings, a housing 2701 and a housing 2703. The housing 2701 and the housing 2703 are combined with a hinge 2711 so that the electronic book reader 2700 can be opened and closed with the hinge 2711 as an axis. With such a structure, the electronic book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 20) can display text and a display portion on the left side (the display portion 2707 in FIG. 20) can display graphics.

FIG. 20 illustrates an example in which the housing 2701 is provided with an operation portion and the like. For example, the housing 2701 is provided with a power switch 2721, an operation key 2723, a speaker 2725, and the like. With the operation key 2723, pages can be turned. Note that a keyboard, a pointing device, and the like may be provided on the same surface as the display portion of the housing. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the electronic book reader 2700 may have a function of an electronic dictionary.

The electronic book reader 2700 may have a configuration capable of wirelessly transmitting and receiving data. Through wireless communication, desired book data or the like can be purchased and downloaded from an electronic book server.

Embodiment 13

A semiconductor device disclosed in this specification can be applied to a variety of electronic appliances (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

Figure 21A:
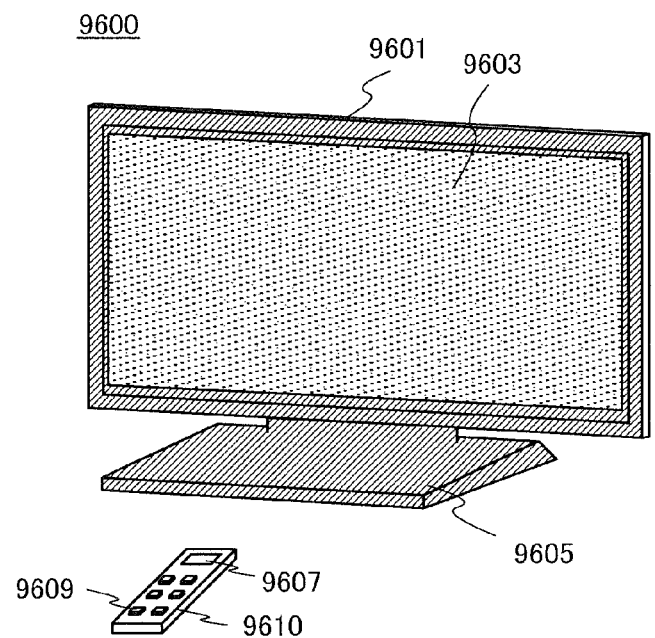
FIGS. 21A and 21B are external views illustrating examples of a television device and a digital photo frame of an embodiment of the present invention.

FIG. 21A illustrates an example of a television set 9600. In the television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with an operation key 9609 of the remote controller 9610 so that an image displayed on the display portion 9603 can be controlled. Furthermore, the remote controller 9610 may be provided with a display portion 9607 for displaying data output from the remote controller 9610.

Note that the television set 9600 is provided with a receiver, a modem, and the like. With use of the receiver, general television broadcasting can be received. With use of the receiver, general television broadcasting can be received. Moreover, when the display device is connected to a communication network with or without wires via the modem, one-way (from a sender to a receiver) or two-way (between a sender and a receiver or between receivers) information communication can be performed.

Figure 21B:
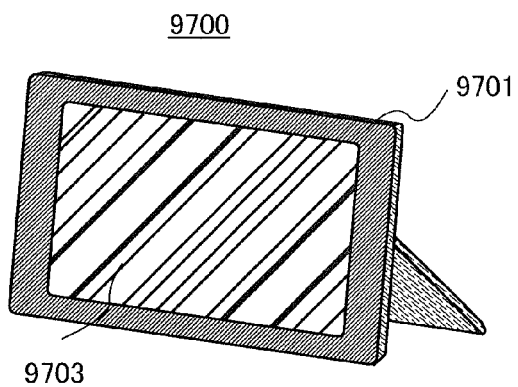

FIG. 21B illustrates an example of a digital photo frame 9700. For example, in the digital photo frame 9700, a display portion 9703 is incorporated in a housing 9701. The display portion 9703 can display a variety of images. For example, the display portion 9703 can display data of an image taken with a digital camera or the like and function as a normal photo frame Note that the digital photo frame 9700 is provided with an operation portion, an external connection portion (a USB terminal, a terminal that can be connected to various cables such as a USB cable, or the like), a recording medium insertion portion, and the like. Although these components may be provided on the surface on which the display portion is provided, it is preferable to provide them on the side surface or the back surface for the design of the digital photo frame 9700. For example, a memory storing data of an image taken with a digital camera is inserted in the recording medium insertion portion of the digital photo frame, whereby the image data can be transferred and then displayed on the display portion 9703.

The digital photo frame 9700 may be configured to transmit and receive data wirelessly. The structure may be employed in which desired image data is transferred wirelessly to be displayed.

Figure 22A:
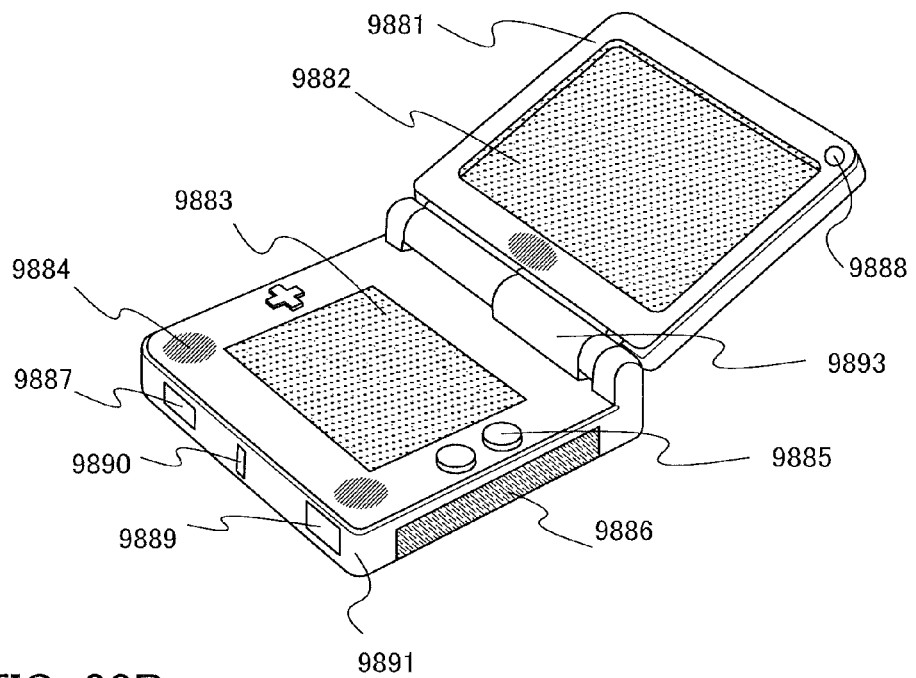
FIGS. 22A and 22B are external views illustrating examples of a game machine of an embodiment of the present invention.

FIG. 22A is a portable game machine and is constituted by two housings of a housing 9881 and a housing 9891 which are connected with a joint portion 9893 so that the portable game machine can be opened or folded. A display portion 9882 and a display portion 9883 are incorporated in the housing 9881 and the housing 9891, respectively. In addition, the portable game machine illustrated in FIG. 22A is provided with a speaker portion 9884, a recording medium insert portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, odor, or infrared ray), and a microphone 9889), and the like. It is needless to say that the structure of the portable amusement machine is not limited to the above and other structures provided with at least a semiconductor device disclosed in this specification can be employed. The portable amusement machine may include other accessory equipment as appropriate. The portable game machine illustrated in FIG. 22A has a function of reading a program or data stored in the recording medium to display it on the display portion, and a function of sharing information with another portable game machine by wireless communication. Note that a function of the portable game machine illustrated in FIG. 22A is not limited to those described above, and the portable game machine can have a variety of functions.

Figure 22B:
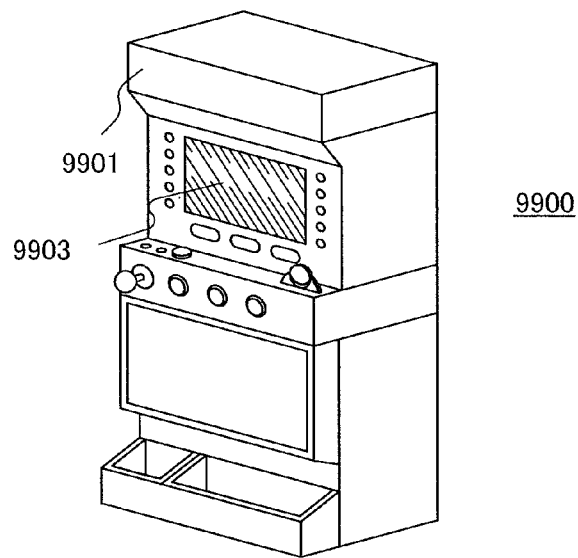

FIG. 22B illustrates an example of a slot machine 9900 which is a large-sized amusement machine. In the slot machine 9900, a display portion 9903 is incorporated in a housing 9901. In addition, the slot machine 9900 includes an operation means such as a start lever or a stop switch, a coin slot, a speaker, and the like. It is needless to say that the structure of the slot machine 9900 is not limited to the above and other structures provided with at least a semiconductor device disclosed in this specification may be employed. The slot machine 9900 may include other accessory equipment as appropriate.

Figure 23A:
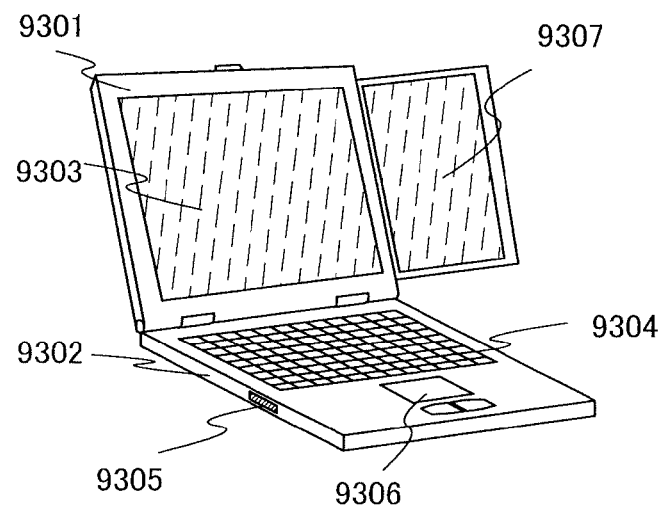
FIGS. 23A and 23B are external views illustrating examples of a portable computer and a mobile phone.

FIG. 23A is a perspective view illustrating an example of a portable computer.

In the portable computer of FIG. 23A, a top housing 9301 having a display portion 9303 and a bottom housing 9302 having a keyboard 9304 can overlap with each other by closing a hinge unit which connects the top housing 9301 and the bottom housing 9302. The portable computer in FIG. 23A is convenient for carrying around. Moreover, in the case of using the keyboard for input, the hinge unit is opened so that a user can input looking at the display portion 9303.

The bottom housing 9302 includes a pointing device 9306 with which input can be performed, in addition to the keyboard 9304. Further, when the display portion 9303 is a touch input panel, input can be performed by touching part of the display portion. The bottom housing 9302 includes an arithmetic function portion such as a CPU or hard disk. In addition, the bottom housing 9302 includes another device, for example, an external connection port 9305 into which a communication cable conformable to communication standards of a USB is inserted.

The top housing 9301, which includes a display portion 9307 and can keep the display portion 9307 therein by sliding it toward the inside of the top housing 9301, can have a large display screen. In addition, the user can adjust the orientation of a screen of the display portion 9307 which can be kept in the top housing 9301. When the display portion 9307 which can be kept in the top housing 9301 is a touch input panel, input can be performed by touching part of the display portion 9307 which can be kept in the top housing 9301.

The display portion 9303 or the display portion 9307 which can be kept in the top housing 9301 are formed using an image display device of a liquid crystal display panel, a light-emitting display panel such as an organic light-emitting element or an inorganic light-emitting element, or the like.

In addition, the portable computer in FIG. 23A can be provided with a receiver and the like and can receive a television broadcast to display an image on the display portion. The user can watch a television broadcast when the whole screen of the display portion 9307 is exposed by sliding the display portion 9307 while the hinge unit which connects the top housing 9301 and the bottom housing 9302 is kept closed. In this case, the hinge unit is not opened and display is not performed on the display portion 9303. In addition, start up of only a circuit for displaying a television broadcast is performed. Therefore, power can be consumed to the minimum, which is useful for the portable computer whose battery capacity is limited.

Figure 23B:
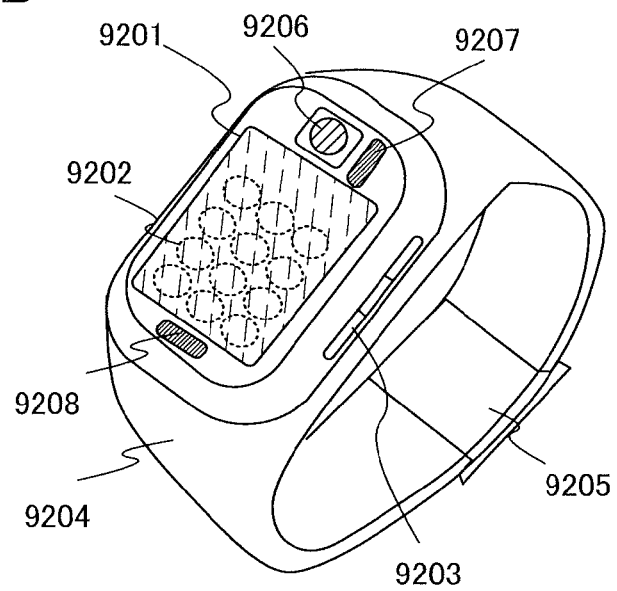

FIG. 23B is a perspective view illustrating an example of a mobile phone that the user can wear on the wrist like a wristwatch.

This mobile phone is formed with a main body which includes a communication device including at least a telephone function, and battery; a band portion 9204 which enables the main body to be worn on the wrist; an adjusting portion 9205 for adjusting the fixation of the band portion 9204 fixed for the wrist; a display portion 9201; a speaker 9207; and a microphone 9208.

In addition, the main body includes operation switches 9203. The operation switches 9203 can have respective functions, for example, can serve as a switch for starting a program for the Internet when a button is pushed, in addition to serving as a power switch, a switch for switching displays, a switch for instruction to start taking images, or the like.

Input to this mobile phone is operated by touching the display portion 9201 with a finger or an input pen, operating the operating switches 9203, or inputting voice into the microphone 9208. In FIG. 23B, the display portion 9201 includes a touch panel 9209, and display buttons 9202 are displayed on the display portion 9201. Input can be performed by touching the display buttons 9202 with a finger or the like.

Further, the main body includes a camera portion 9206 including an image pick-up means having a function of converting an image of an object, which is formed through a camera lens, to an electronic image signal. Note that the camera portion is not necessarily provided.

The mobile phone illustrated in FIG. 23B is provided with a receiver of a television broadcast and the like, and can display an image on the display portion 9201 by receiving a television broadcast. In addition, the mobile phone illustrated in FIG. 23B is provided with a memory device and the like such as a memory, and can record a television broadcast in the memory. The mobile phone illustrated in FIG. 23B may have a function of collecting location information, such as the GPS.

An image display device of a liquid crystal display panel, a light-emitting display panel such as an organic light-emitting element or an inorganic light-emitting element, or the like is used as the display portion 9201. The mobile phone illustrated in FIG. 23B is compact and lightweight and thus has limited battery capacity. Therefore, a panel which can be driven with low power consumption is preferably used as a display device for the display portion 9201.

Note that FIG. 23B illustrates the electronic apparatus which is worn on the wrist; however, this embodiment is not limited thereto as long as a portable shape is employed.

Embodiment 14

In this embodiment, as one mode of a semiconductor device, examples of a display device including the thin film transistor described in any of Embodiments 1, 2, 5, and 6 will be described with reference to FIG. 24 to FIG. 35. In this embodiment, examples of liquid crystal display devices each including a liquid crystal element as a display element are described with reference to FIGS. 24 to 35. Any of the thin film transistors described in Embodiments 1, 2, 5, and 6 can be used for TFTs 628 and 629, which are used for the liquid crystal display device illustrated in FIG. 24 to FIG. 35. Further, the TFTs 628 and 629 can be manufactured through the same process as that described in of Embodiment 1, 2, 5, or 6, and have high electric characteristics and high reliability. The TFT 628 and the TFT 629 include a channel protective layer 608 and a channel protective layer 611, respectively, and are inverted staggered thin film transistors including semiconductor films as channel formation regions.

First, a vertical alignment (VA) liquid crystal display device is shown. The VA liquid crystal display device has a kind of form in which alignment of liquid crystal molecules of a liquid crystal display panel is controlled. In the VA liquid crystal display device, liquid crystal molecules are aligned in a vertical direction with respect to a panel surface when no voltage is applied. In this embodiment mode, in particular, a pixel is divided into some regions (subpixels), and molecules are aligned in different directions in their respective regions. This is referred to as multi-domain or multi-domain design. Hereinafter, a liquid crystal display device of multi-domain design is described.

Figure 24:
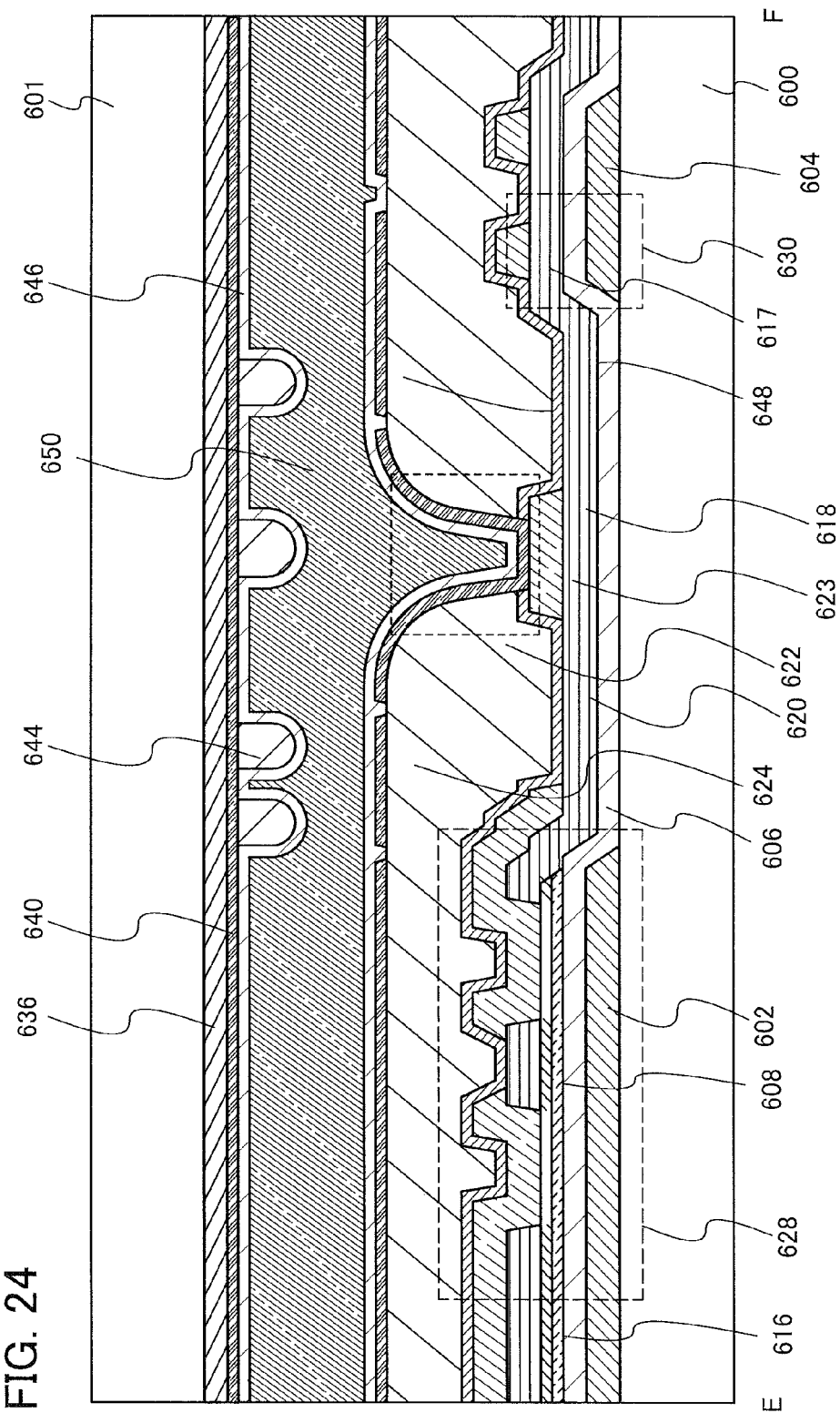
FIG. 24 illustrates a semiconductor device of an embodiment of the present invention.
Figure 25:
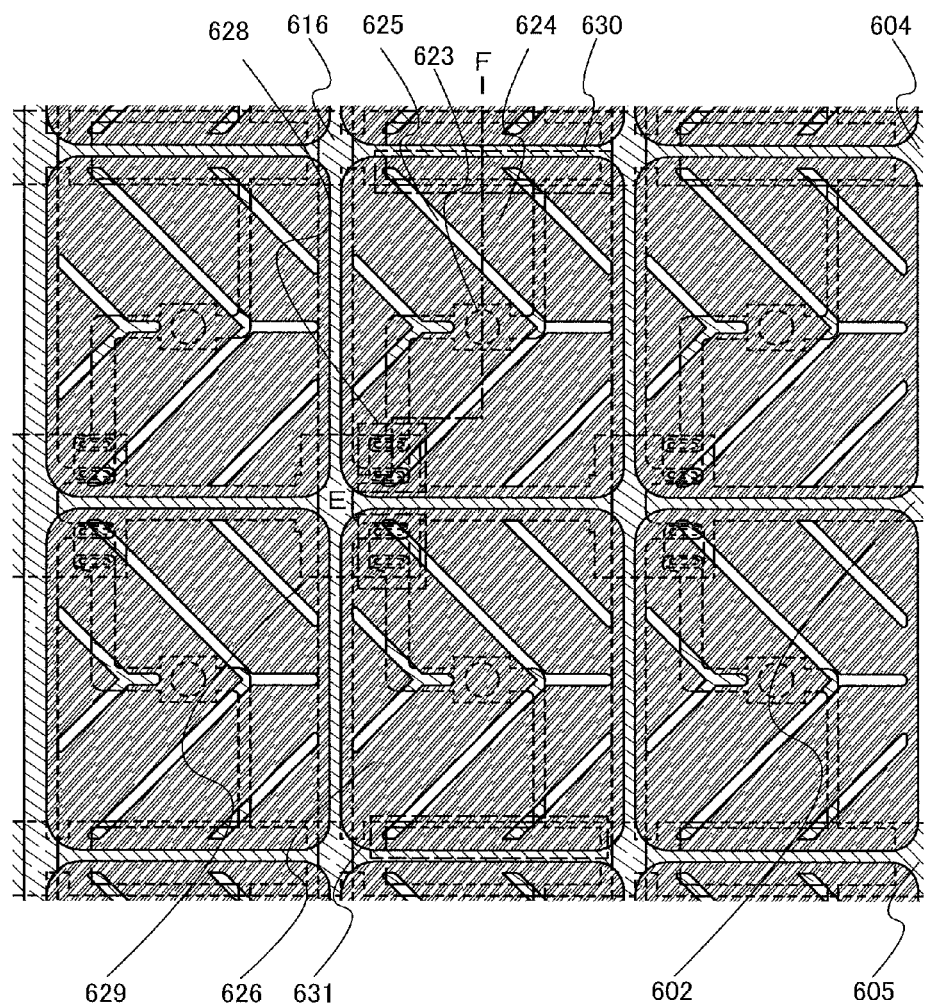
FIG. 25 illustrates a semiconductor device of an embodiment of the present invention.
Figure 26:
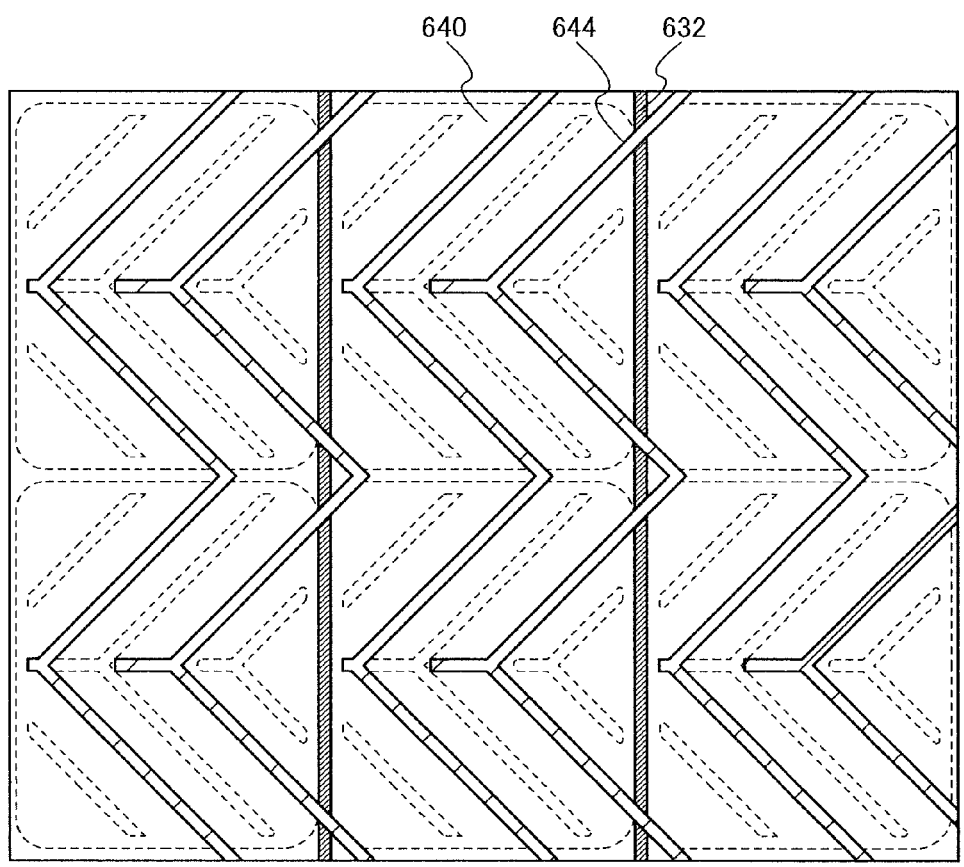
FIG. 26 illustrates a semiconductor device of an embodiment of the present invention.

FIGS. 25 and 26 illustrate a pixel electrode and a counter electrode, respectively. FIG. 25 is a plan view on a substrate side over which the pixel electrode is formed. FIG. 24 illustrates a cross-sectional structure taken along a line E-F in FIG. 25. FIG. 26 is a plan view on a side of a substrate provided with the counter electrode. Hereinafter, description is made with reference to these drawings.

In FIG. 24, a substrate 600 over which a TFT 628, a pixel electrode 624 which is connected to the TFT 628, and a storage capacitor portion 630 are formed and a counter substrate 601 provided with a counter electrode 640 and the like overlap with each other, and liquid crystals are injected between the substrate 600 and the counter substrate 601.

Although not illustrated, at the position where the counter substrate 601 is provided with a spacer, a first coloring film, a second coloring film, a third coloring film, and the counter electrode 640 are formed. With this structure, the height of a projection 644 for controlling orientation of liquid crystals is made different from that of the spacer. An alignment film 648 is formed over the pixel electrode 624, and the counter electrode 640 is similarly provided with an alignment film 646. A liquid crystal layer 650 is formed between the alignment films 646 and 648.

As the spacer, a columnar spacer may be formed; alternatively, spacer beads may be dispersed. In the case where the spacer has light-transmitting property, the spacer may be formed over the pixel electrode 624 formed over the substrate 600.

The TFT 628, the pixel electrode 624 connected to the TFT 628, and the holding capacitor portion 630 are formed over the substrate 600. The pixel electrode 624 is connected to a wiring 618 via a contact hole 623 which penetrates an insulating film 620 which covers the TFT 628, the wiring 616, and the storage capacitor portion 630 and also penetrates a third insulating film 622 which covers the insulating film 620. As the TFT 628, the thin film transistor described in any of Embodiments 1, 2, 5, and 6 can be used as appropriate. Further, the storage capacitor portion 630 includes a first capacitor wiring 604 that is formed at the same time as a gate wiring 602 of the TFT 628; a gate insulating film 606; and a second capacitor wiring 617 that is formed at the same time as a wiring 616 and the wiring 618.

The pixel electrode 624, the liquid crystal layer 650, and the counter electrode 640 overlap with each other, so that a liquid crystal element is formed.

FIG. 25 illustrates a structure over the substrate 600. The pixel electrode 624 is formed using a material described in Embodiment 1. Slits 625 are formed in the pixel electrode 624. The slits 625 are formed to control alignment of the liquid crystals.

The TFT 629, a pixel electrode 626 connected to the TFT 629, and a storage capacitor portion 631, which are illustrated in FIG. 25, can be formed in a similar manner to the TFT 628, the pixel electrode 624, and the storage capacitor portion 630, respectively. Both the TFTs 628 and 629 are connected to the wiring 616. A pixel of this liquid crystal display panel includes the pixel electrodes 624 and 626. The pixel electrodes 624 and 626 are subpixels.

FIG. 26 illustrates the structure of the counter substrate side. The counter electrode 640 is formed over the light-blocking film 632. It is preferable to use the same material as that of the pixel electrode 624 to form the counter electrode 640. The projections 644 that control alignment of liquid crystals are formed over the counter electrode 640.

Figure 27:
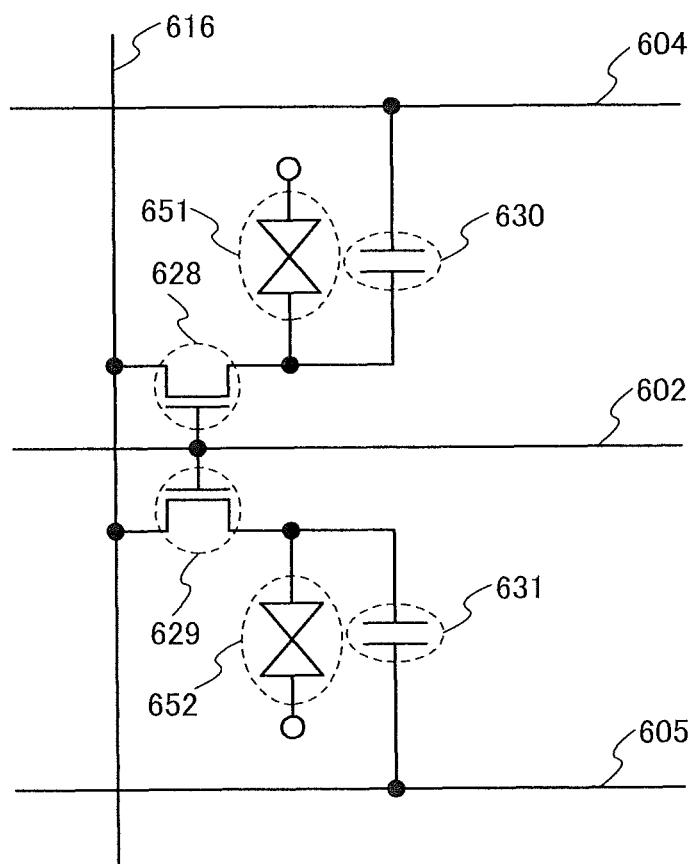
FIG. 27 illustrates a semiconductor device of an embodiment of the present invention.

FIG. 27 shows an equivalent circuit of this pixel structure. Both the TFTs 628 and 629 are connected to the gate wiring 602 and the wiring 616. In this case, when potentials of the capacitor wiring 604 and a capacitor wiring 605 are different from each other, operations of liquid crystal elements 651 and 652 can vary. That is, alignment of the liquid crystal is precisely controlled and a viewing angle is increased by individual control of potentials of the capacitor wirings 604 and 605.

When a voltage is applied to the pixel electrode 624 provided with the slits 625, a distorted electric field (an oblique electric field) is generated in the vicinity of the slits 625. The slit 625 and the projection 644 on the counter substrate 601 side are alternately arranged in an engaging manner, and thus, an oblique electric field is effectively generated to control alignment of the liquid crystal, so that a direction of alignment of the liquid crystal varies depending on location. That is, a viewing angle of the liquid crystal display panel is increased by domain multiplication.

Next, another VA liquid crystal display device, which is different from the above-described device, is described with reference to FIG. 28, FIG. 29, FIG. 30, and FIG. 31.

Figure 28:
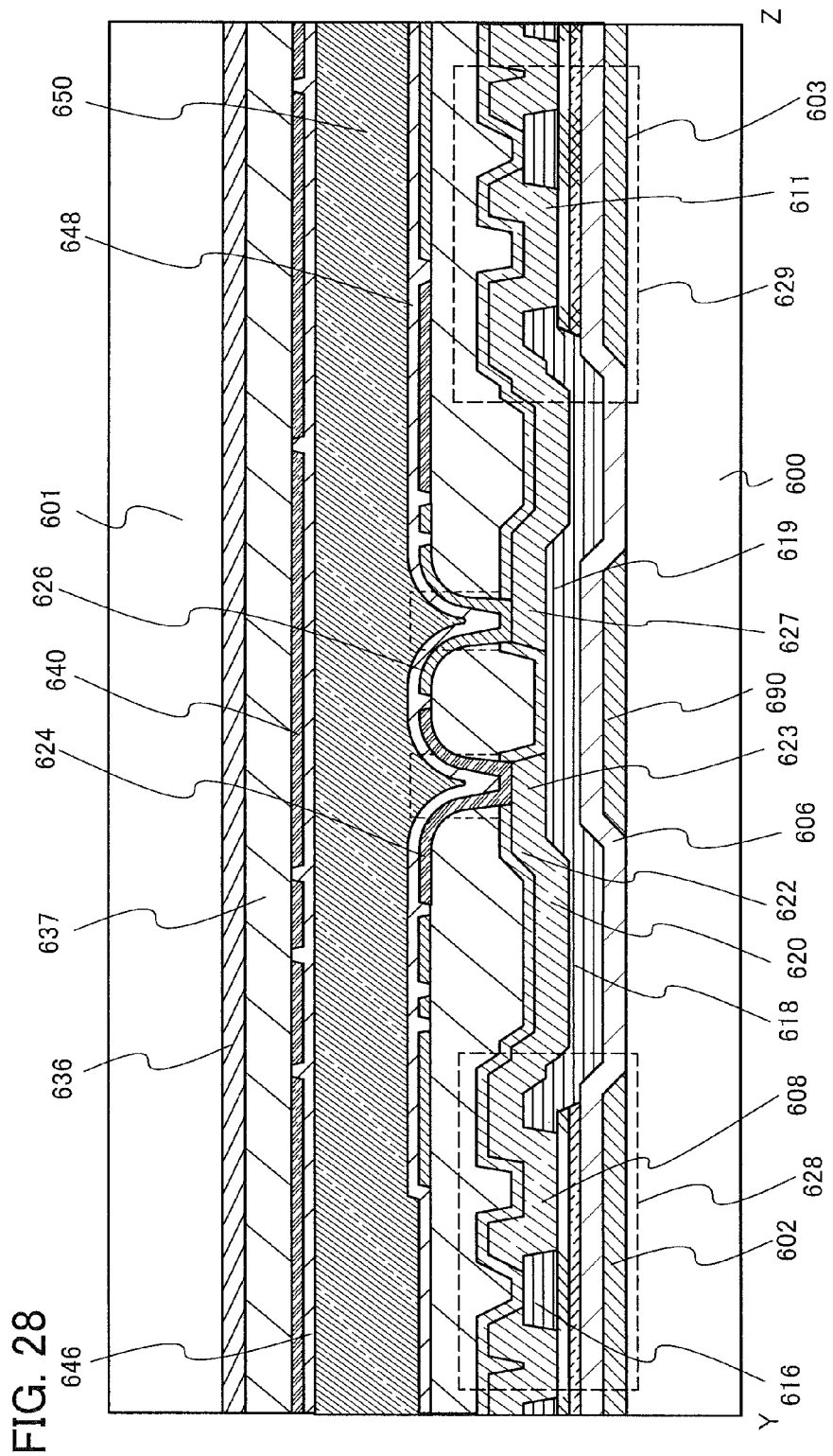
FIG. 28 illustrates a semiconductor device of an embodiment of the present invention.
Figure 29:
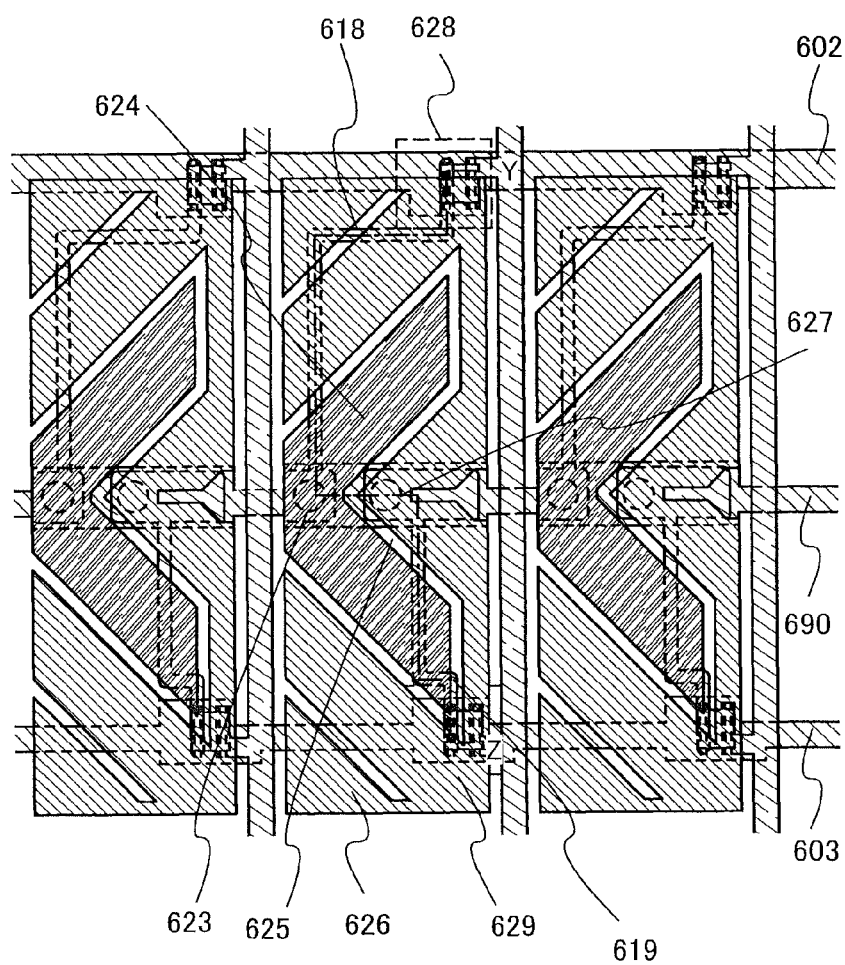
FIG. 29 illustrates a semiconductor device of an embodiment of the present invention.

FIGS. 28 and 29 each illustrate a pixel structure of the VA liquid crystal display device. FIG. 29 illustrates a plan view of the substrate 600. FIG. 28 illustrates a cross-sectional structure taken along a line Y-Z in FIG. 29. Description below will be given with reference to both the drawings.

In this pixel structure, a plurality of pixel electrodes are provided in one pixel, and a TFT is connected to each pixel electrode. The plurality of TFTs are constructed so as to be driven by different gate signals. That is, signals that are applied to individual pixel electrodes in a multi-domain pixel are controlled independently of each other.

Via the contact hole 623, the pixel electrode 624 is connected to the TFT 628 through the wiring 618. Via a contact hole 627, the pixel electrode 626 is connected to the TFT 629 through a wiring 619. The gate wiring 602 of the TFT 628 is separated from a gate wiring 603 of the TFT 629 so that different gate signals can be supplied. On the other hand, the wiring 616 serving as a data line is shared by the TFTs 628 and 629. As each of the TFTs 628 and 629, the thin film transistor shown in any of Embodiments 1, 2, 5, and 6 can be used as appropriate. Also, a capacitor wiring 690 is provided.

Figure 31:
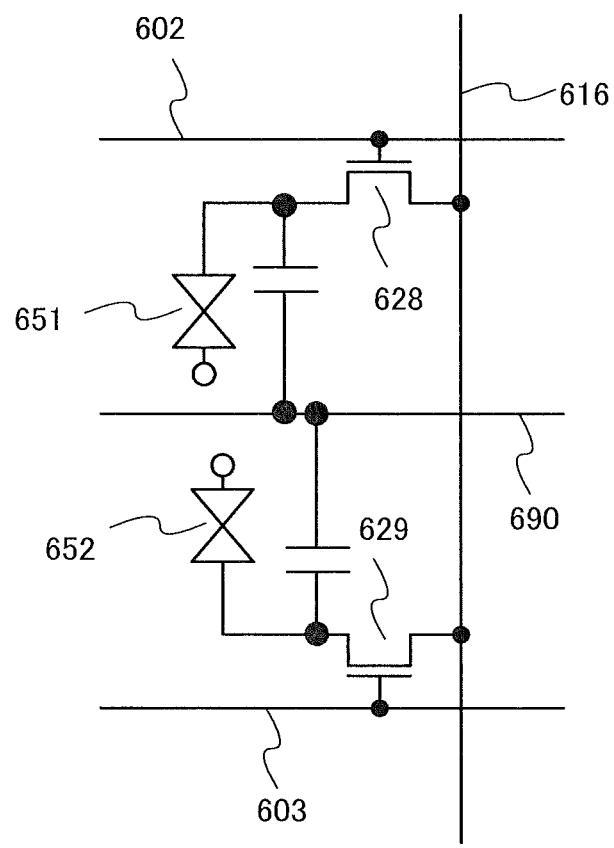
FIG. 31 illustrates a semiconductor device of an embodiment of the present invention.

The shape of the pixel electrode 624 is different from that of the pixel electrode 626, and the pixel electrodes are separated by the slits 625. The pixel electrode 626 surrounds the pixel electrode 624, which has a V-shape. The TFTs 628 and 629 make the timing of applying voltages to the pixel electrodes 624 and 626 different from each other, thereby controlling alignment of liquid crystals. FIG. 31 shows an equivalent circuit of this pixel structure. The TFT 628 is connected to the gate wiring 602, and the TFT 629 is connected to the gate wiring 603. If different gate signals are supplied to the gate wirings 602 and 603, operation timing of the TFTs 628 and 629 can be different.

Figure 30:
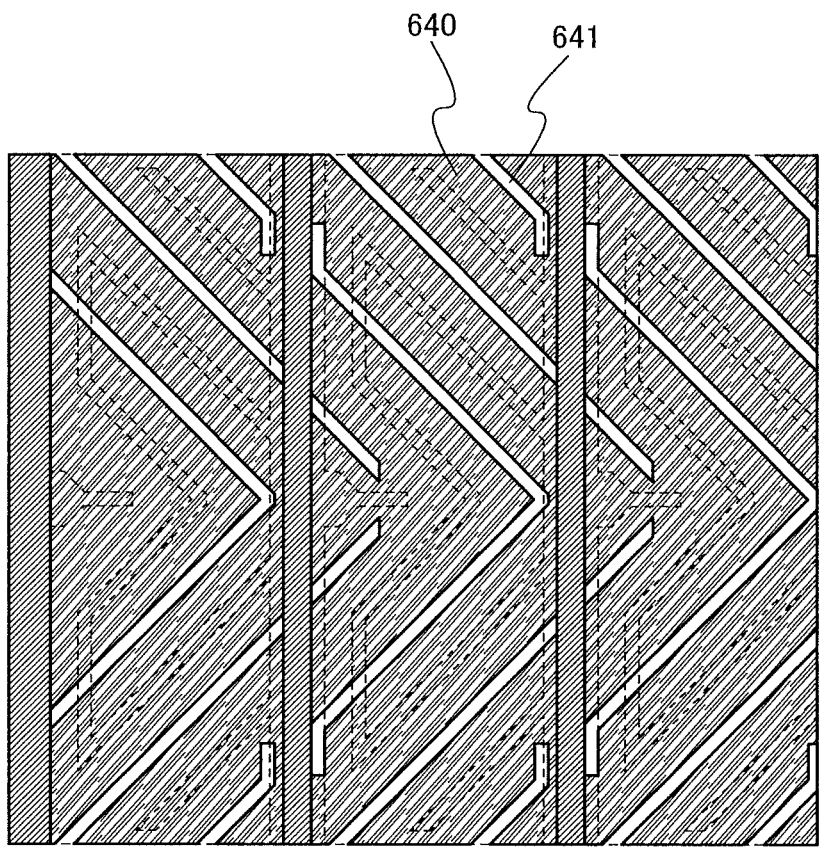
FIG. 30 illustrates a semiconductor device of an embodiment of the present invention.

The counter substrate 601 is provided with a second coloring film 636, and the counter electrode 640. In addition, a planarizing film 637 is formed between the second colored film 636 and the counter electrode 640, thereby preventing alignment disorder of liquid crystals. FIG. 30 illustrates a structure of the counter substrate side. The counter electrode 640 is shared by plural pixels, and slits 641 are formed in the counter electrode 640. The slit 641 and the slit 625 on the pixel electrodes 624 and 626 side are alternately arranged in an engaging manner; thus, an oblique electric field is effectively generated, and alignment of the liquid crystal can be controlled. Accordingly, the orientation of the liquid crystals can be varied in different places, so that the viewing angle is widened.

The pixel electrode 624, the liquid crystal layer 650, and the counter electrode 640 overlap with each other, so that a first liquid crystal element is formed. Further, the pixel electrode 626, the liquid crystal layer 650, and the counter electrode 640 overlap with each other, so that a second liquid crystal element is formed. Furthermore, the multi-domain structure is employed in which the first liquid crystal element and the second liquid crystal element are provided for one pixel.

Next, a liquid crystal display device in a horizontal electric field mode is shown. In a horizontal field effect mode, an electric field is applied in a horizontal direction with respect to liquid crystal molecules in a cell, whereby liquid crystals are driven to express gray scales. In accordance with this method, a viewing angle can be expanded to about 180°. Hereinafter, a liquid crystal display device in the horizontal electric field mode is described.

Figure 32:
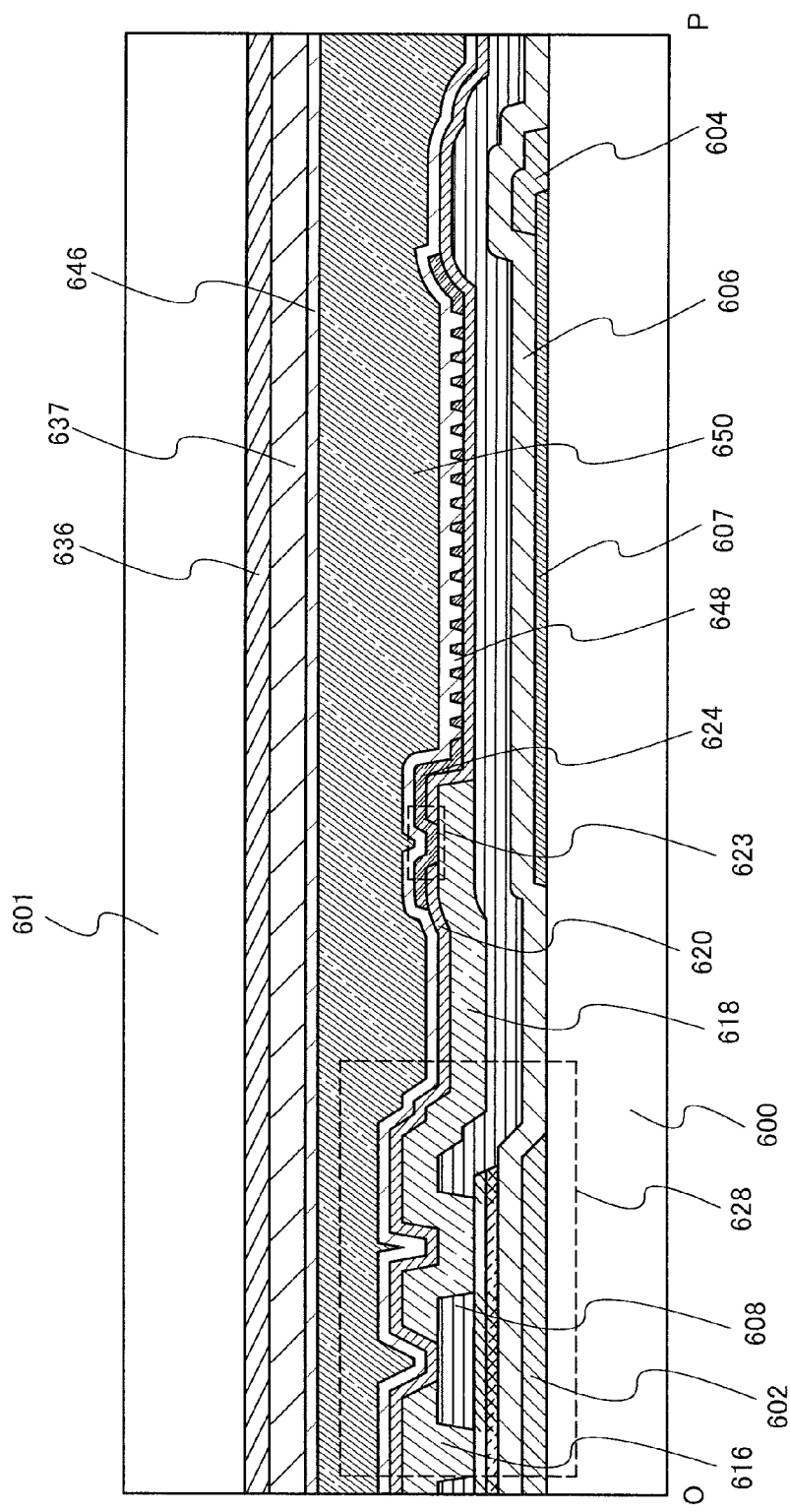
FIG. 32 illustrates a semiconductor device of an embodiment of the present invention.

FIG. 32 illustrates a state in which the substrate 600 provided with the TFT 628 and the pixel electrode 624 connected to the TFT 628 overlaps with the counter substrate 601, and liquid crystal is injected therebetween. The counter substrate 601 is provided with the second coloring film 636, the planarizing film 637, and the like. The pixel electrode is provided for the substrate 600, and not for the counter substrate 601. A liquid crystal layer 650 is formed between the substrate 600 and the counter substrate 601.

A first pixel electrode 607, the capacitor wiring 604 connected to the first pixel electrode 607, and the TFT 628 described Embodiment 1, 2, 5, or 6 are formed over the substrate 600. The first pixel electrode 607 can be formed using a material similar to the pixel electrode layer 427 described in Embodiment 1. The first pixel electrode 607 is compartmentalized almost in a pixel form. The gate insulating film 606 is formed over the first pixel electrode 607 and the capacitor wiring 604.

The wirings 616 and 618 of the TFT 628 are formed over the gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of source and drain electrodes and is connected to the second pixel electrode 624.

The second insulating film 620 is formed over the wirings 616 and 618. Further, the second pixel electrode 624 that is connected to the wiring 618 in a contact hole formed in the insulating film 620 is formed over the insulating film 620. The pixel electrode 624 is formed using a material similar to that of the pixel electrode layer 427 described in Embodiment 1.

In such a manner, the TFT 628 and the second pixel electrode 624 connected to the TFT 628 are formed over the substrate 600. A holding capacitor is formed between the first pixel electrode 607 and the second pixel electrode 624.

Figure 33:
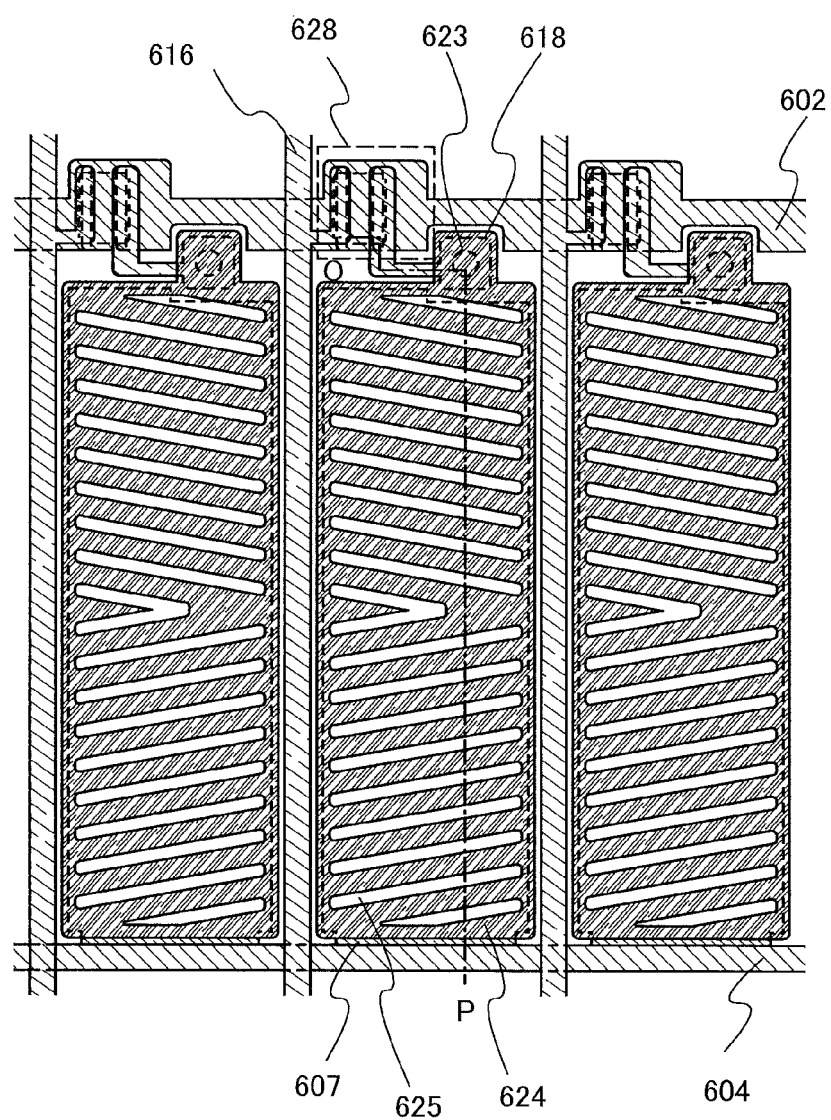
FIG. 33 illustrates a semiconductor device of an embodiment of the present invention.

FIG. 33 is a plan view illustrating the structure of the pixel electrodes. FIG. 32 illustrates a cross-sectional structure taken along a line O-P in FIG. 33. The pixel electrode 624 is provided with the slits 625. The slits 625 are formed to control alignment of the liquid crystals. In this case, an electric field is generated between the first pixel electrode 607 and the second pixel electrode 624. The gate insulating film 606 is formed between the first pixel electrode 607 and the second pixel electrode 624; however, the gate insulating film 606 is formed with a thickness of from 50 nm to 200 nm, which is thin enough as compared with that of a liquid crystal layer with a thickness of 2 µm to 10 µm. Therefore, an electric field is generated in a direction which is substantially parallel to the substrate 600 (a horizontal direction). The alignment of the liquid crystals is controlled with this electric field. Liquid crystal molecules are horizontally rotated with use of the electric field in the direction almost parallel to the substrate. In this case, since the liquid crystal molecules are horizontally aligned in any state, the contrast or the like is less influenced by the viewing angle; thus, the viewing angle is increased. In addition, an aperture ratio can be improved since both the first pixel electrode 607 and the second pixel electrode 624 are light-transmitting electrodes.

Next, a different example of a liquid crystal display device in a horizontal electric field mode is shown.

Figure 34:
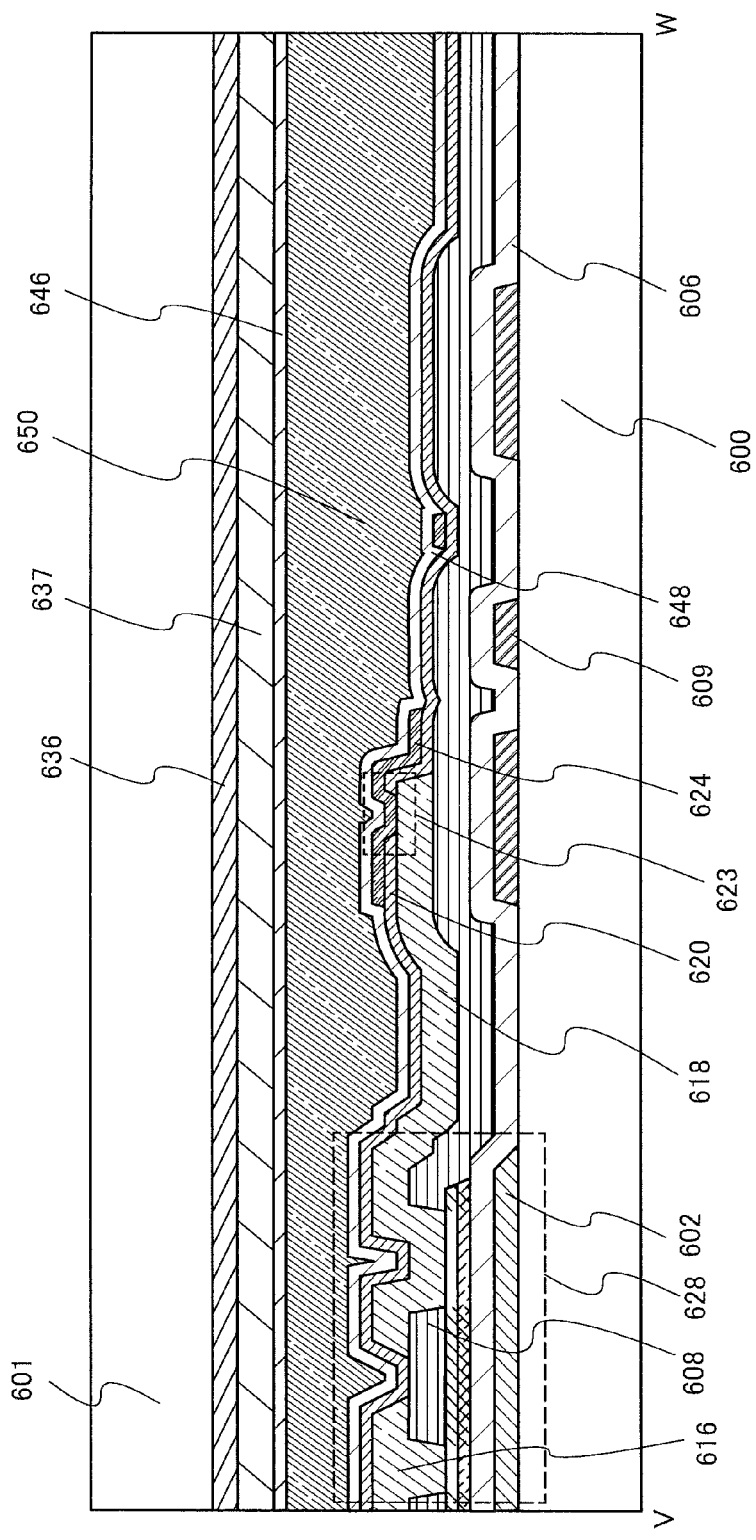
FIG. 34 illustrates a semiconductor device of an embodiment of the present invention.
Figure 35:
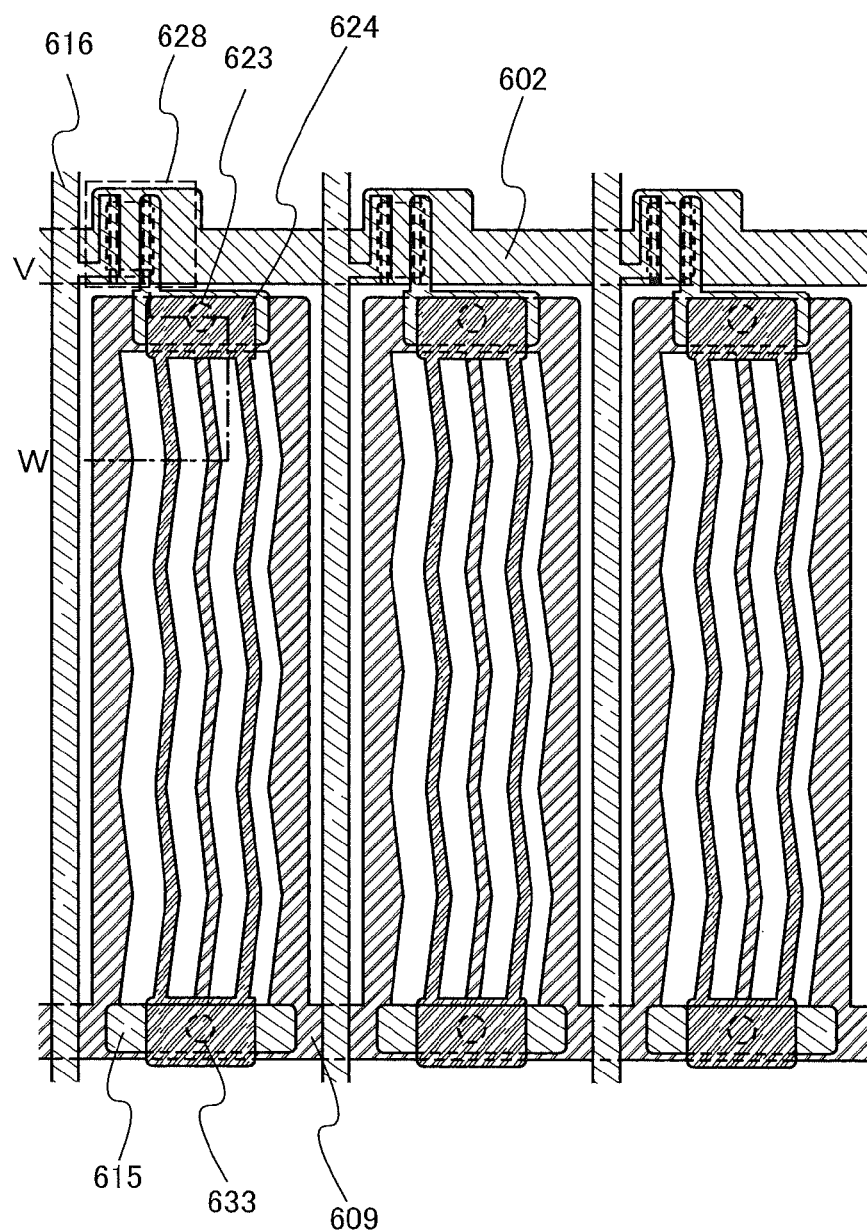
FIG. 35 illustrates a semiconductor device of an embodiment of the present invention.

FIGS. 34 and 35 illustrate a pixel structure of a liquid crystal display device in an IPS mode. Note that FIG. 35 is a plane view, and FIG. 34 illustrates a cross-sectional structure taken along a line V-W shown in FIG. 35. Description below will be given with reference to both the drawings.

FIG. 34 illustrates a state in which the substrate 600 provided with the TFT 628 and the pixel electrode 624 connected to the TFT 628 overlaps with the counter substrate 601, and liquid crystal is injected therebetween. The counter substrate 601 is provided with the second color film 636, the planarizing film 637, and the like. The pixel electrode is provided for the substrate 600, and not for the counter substrate 601. The liquid crystal layer 650 is formed between the substrate 600 and the counter substrate 601.

A common potential line 609 and the TFT 628 described in Embodiment 1, 2, 5, or 6 are formed over the substrate 600. The common potential line 609 can be formed at the same time as forming the gate wiring 602 of the TFT 628.

The wirings 616 and 618 of the TFT 628 are formed over the gate insulating film 606. The wiring 616 is a data line through which a video signal travels, extends in one direction in a liquid crystal display panel, is connected to a source or drain region of the TFT 628, and functions as one of source and drain electrodes. The wiring 618 functions as the other of source and drain electrodes and is connected to the second pixel electrode 624.

The second insulating film 620 is formed over the wirings 616 and 618. Further, the second pixel electrode 624 that is connected to the wiring 618 in the contact hole 623 formed in the insulating film 620 is formed over the insulating film 620. The pixel electrode 624 is formed using a material similar to that of the pixel electrode layer 427 described in Embodiment 1. Note that as shown in FIG. 35, the pixel electrode 624 is formed so as to generate a horizontal electric field with a comb-shaped electrode which is formed at the same time as the common potential line 609. Further, a comb-like portion of the pixel electrode 624 and the comb-like electrode that is formed at the same time as the common potential line 609 correspond to each other.

When an electric field is generated between the potential applied to the pixel electrode 624 and that of the common potential line 609, the alignment of liquid crystals is controlled with this electric field. Liquid crystal molecules are horizontally rotated with use of the electric field in the direction almost parallel to the substrate. In this case, since the liquid crystal molecules are horizontally aligned in any state, the contrast or the like is less influenced by the viewing angle; thus, the viewing angle is increased.

In the above manner, the TFT 628 and the pixel electrode 624 connected to the TFT 628 are formed over the substrate 600. A storage capacitor is formed by providing the gate insulating film 606 between the common potential line 609 and a capacitor electrode 615. The capacitor electrode 615 is connected to the pixel electrode 624 through a contact hole 633.

Through the above process, a liquid crystal display device can be manufactured as a display device.

Embodiment 15

In the case where the size of a liquid crystal display panel exceeds 10 inches and is set to 60 inches or further, 120 inches, wiring resistance of a wiring having a light-transmitting property may be a problem; therefore, in this embodiment, an example in which wiring resistance is reduced by using a metal wiring as part of a gate wiring will be described.

Note that the same reference numerals are used for the same portions in FIG. 3A and FIG. 36A, and detailed description thereof is omitted. Note that this embodiment can be applied to the active matrix substrate described in Embodiment 1.

FIGS. 36A and 36B are examples in which a gate electrode layer of a thin film transistor of a driver circuit is formed using a metal wiring. In the driver circuit, the material of the gate electrode layer is not limited to a light-transmitting material. Note that since the metal wiring is formed, the number of photomasks is larger than those of Embodiment 1 and Embodiment 2.

In FIG. 36A, the thin film transistor 260 of a driver circuit includes the gate electrode layer in which a second metal wiring layer 241 is stacked over a first metal wiring layer 242. Note that the first metal wiring layer 242 can be formed using the same material and through the same process as a first metal wiring layer 236. The second metal wiring layer 241 can be formed using the same material and through the same process as a second metal wiring layer 237.

In a similar manner, in FIG. 36B, the thin film transistor 270 of a driver circuit includes a gate electrode layer in which a second metal wiring layer 243 is stacked over a first metal wiring layer 244. Note that the first metal wiring layer 244 can be formed using the same material and through the same process as the first metal wiring layer 236. The second metal wiring layer 243 can be formed using the same material and through the same process as the second metal wiring layer 237.

In the case where the first metal wiring layer 242 and the conductive layer 267 are electrically connected to each other, the second metal wiring layer 241 which is provided for preventing oxidation of the first metal wiring layer 242 is preferably a metal nitride film. In a similar manner, in the case where the first metal wiring layer 244 and the conductive layer 277 are electrically connected to each other, the second metal wiring layer 243 which is provided for preventing oxidation of the first metal wiring layer 244 is preferably a metal nitride film.

First, a heat resistant conductive material film (the thickness thereof is 100 nm to 500 nm inclusive) which can endure first heat treatment for dehydration or dehydrogenation is formed over the substrate 200.

In this embodiment, a tungsten film with a thickness of 370 nm and a tantalum nitride film with a thickness of 50 nm are formed. Here, the conductive film is formed with a stack of the tantalum nitride film and the tungsten film; however, this embodiment is not limited thereto. The conductive film is formed using an element selected from Ta, W, Ti, Mo, Al, and Cu, an alloy including any of these elements as its component, an alloy film including a combination of any of these elements, or a nitride including any of these elements as its component. Further, the heat resistant conductive material film is not limited to a single-layer structure including any of the above elements, and can have a stacked-layer structure of two or more layers.

A metal wiring is formed through a first photolithography step to form the first metal wiring layer 236 and the second metal wiring layer 237, the first metal wiring layer 242 and the second metal wiring layer 241, and the first metal wiring layer 244 and the second metal wiring layer 243. An inductively coupled plasma (ICP) etching method is preferably used for etching of the tungsten film and the tantalum nitride film. The films can be etched into a desired tapered shape by appropriately adjusting the etching condition (the amount of power applied to a coil-shaped electrode, the amount of power applied to an electrode on the substrate side, the electrode temperature on the substrate side, or the like) using an ICP etching method. When the first metal wiring layer 236 and the second metal wiring layer 237 are etched into a tapered shape, defects in formation of the light-transmitting conductive film which is formed over and in contact with the metal wiring layers can be reduced.

Then, after formation of the light-transmitting conductive film, a gate wiring layer 238 and the gate electrode layer of the thin film transistor 220 are formed through a second photolithography step. The light-transmitting conductive film is formed using the conductive material having light-transmitting property with respect to visible light, which is described in Embodiment 1.

For example, if there is an interface of the gate wiring layer 238, which is in contact with the first metal wiring layer 236 or the second metal wiring layer 237, an oxide film may be formed by heat treatment performed later so that contact resistance may be increased, depending on the material of the light-transmitting conductive film; therefore, the second metal wiring layer 237 is preferably formed using a metal nitride film which prevents oxidation of the first metal wiring layer 236.

Next, the gate insulating layer, the oxide semiconductor layer, and the like are formed in a process similar to that in Embodiment 1. Subsequent steps are performed in accordance with Embodiment 1, so that an active matrix substrate is manufactured.

The gate wiring layer 238 overlapping with part of the second metal wiring layer 237 is illustrated in FIGS. 36A and 36B. Alternatively, the gate wiring layer may cover the whole part of the first metal wiring layer 236 and the second metal wiring layer 237. In other words, the first metal wiring layer 236 and the second metal wiring layer 237 can be referred to as auxiliary wirings for reducing resistance of the gate wiring layer 238.

In addition, in a terminal portion, a first terminal electrode whose potential is the same as that of the gate wiring is formed over the protective insulating layer 203 and electrically connected to the second metal wiring layer 237. A wiring led from the terminal portion is also formed using a metal wiring.

In addition, the metal wiring for reducing the wiring resistance, that is, the first metal wiring layer 236 and the second metal wiring layer 237 can be used as auxiliary wirings for a gate wiring layer and a capacitor wiring layer in a portion other than a display portion.

In this embodiment, the wiring resistance is reduced by partly using the metal wiring. Accordingly, even in the case where the size of a liquid crystal display panel exceeds 10 inches and is set to 60 inches, or further, 120 inches, high definition of displayed images can be obtained, so that a high aperture ratio can be achieved.

This application is based on Japanese Patent Application serial no. 2009-179722 filed with Japan Patent Office on Jul. 31, 2009, the entire contents of which are hereby incorporated by reference.

The invention claimed is:

1. A semiconductor device comprising:
a gate electrode layer over an insulating surface;
a gate insulating layer over the gate electrode layer;
an oxide semiconductor layer comprising indium over the gate insulating layer, the oxide semiconductor layer comprising a channel formation region overlapping with the gate electrode layer with the gate insulating layer therebetween, wherein the oxide semiconductor layer has a stacked structure including a first oxide semiconductor film and a second oxide semiconductor film over the first oxide semiconductor film;
an oxide insulating layer over the oxide semiconductor layer, the oxide insulating layer including a first contact hole and a second contact hole, wherein the oxide insulating layer covers a periphery of the oxide semiconductor layer;
a source electrode layer over the oxide insulating layer, the source electrode layer being in electrical contact with the oxide semiconductor layer through the first contact hole of the oxide insulating layer;
a drain electrode layer over the oxide insulating layer, the drain electrode layer being in electrical contact with the oxide semiconductor layer through the second contact hole of the oxide insulating layer;
an inorganic insulating film over the source electrode layer and the drain electrode layer;
a pixel electrode layer over the inorganic insulating film, the pixel electrode layer being in electrical contact with one of the source electrode layer and the drain electrode layer; and
a wiring intersection of a gate wiring layer and a source wiring layer,
wherein the source electrode layer overlaps with a first end of the oxide semiconductor layer with the oxide insulating layer interposed therebetween,
wherein the drain electrode layer overlaps with a second end of the oxide semiconductor layer with the oxide insulating layer interposed therebetween,
wherein in the wiring intersection, the gate insulating layer and the oxide insulating layer are provided between the gate wiring layer and the source wiring layer,
wherein the gate wiring layer includes the gate electrode layer, and
wherein the source wiring layer includes the source electrode layer.

2. The semiconductor device according to claim 1, further comprising a capacitor portion over a same substrate,
wherein the capacitor portion comprises a capacitor wiring and a capacitor electrode which overlaps with the capacitor wiring,
wherein a dielectric in the capacitor portion is the gate insulating layer, and
wherein the capacitor wiring and the capacitor electrode are in contact with the gate insulating layer.

3. The semiconductor device according to claim 1, wherein a width in a channel length direction of the gate electrode layer is smaller than a width in a channel length direction of the oxide semiconductor layer.

4. The semiconductor device according to claim 1,
wherein a width in a channel length direction of the gate electrode layer is larger than a width in a channel length direction of the oxide semiconductor layer, and
wherein an end surface of the gate electrode layer overlaps with the source electrode layer or the drain electrode layer with the gate insulating layer and the oxide insulating layer interposed therebetween.

5. The semiconductor device according to claim 1, wherein the oxide insulating layer is a silicon oxide film or an aluminum oxide film.

6. The semiconductor device according to claim 1, wherein the source electrode layer and the drain electrode layer are formed of a light-transmitting conductive film.

7. The semiconductor device according to claim 1, wherein the oxide semiconductor layer further comprises gallium and zinc.

8. The semiconductor device according to claim 1,
wherein the first contact hole of the oxide insulating layer completely overlaps with the oxide semiconductor layer, and
wherein the second contact hole of the oxide insulating layer completely overlaps with the oxide semiconductor layer.

9. The semiconductor device according to claim 1, wherein the inorganic insulating film further comprises nitrogen.

10. The semiconductor device according to claim 1, wherein the gate insulating layer comprises a silicon nitride film and a silicon oxide film over the silicon nitride film.

11. A semiconductor device comprising:
a gate electrode layer over an insulating surface;
a gate insulating layer over the gate electrode layer;
an oxide semiconductor layer comprising indium over the gate insulating layer, the oxide semiconductor layer comprising a channel formation region overlapping with the gate electrode layer with the gate insulating layer therebetween, wherein the oxide semiconductor layer has a stacked structure including a first oxide semiconductor film and a second oxide semiconductor film over the first oxide semiconductor film;
an oxide insulating layer over the oxide semiconductor layer, the oxide insulating layer including a first contact hole and a second contact hole, wherein the oxide insulating layer covers a periphery of the oxide semiconductor layer;
a source electrode layer over the oxide insulating layer, the source electrode layer being in electrical contact with the oxide semiconductor layer through the first contact hole of the oxide insulating layer; and
a drain electrode layer over the oxide insulating layer, the drain electrode layer being in electrical contact with the oxide semiconductor layer through the second contact hole of the oxide insulating layer;
an inorganic insulating film over the source electrode layer and the drain electrode layer;
an insulating layer comprising a resin over the inorganic insulating film;
a pixel electrode layer over the insulating layer, the pixel electrode layer being in electrical contact with one of the source electrode layer and the drain electrode layer; and
a wiring intersection of a gate wiring layer and a source wiring layer,
wherein the source electrode layer overlaps with a first end of the oxide semiconductor layer with the oxide insulating layer interposed therebetween,
wherein the drain electrode layer overlaps with a second end of the oxide semiconductor layer with the oxide insulating layer interposed therebetween,
wherein in the wiring intersection, the gate insulating layer and the oxide insulating layer are provided between the gate wiring layer and the source wiring layer,
wherein the gate wiring layer includes the gate electrode layer, and
wherein the source wiring layer includes the source electrode layer.

12. The semiconductor device according to claim 11, wherein a width in a channel length direction of the gate electrode layer is smaller than a width in a channel length direction of the oxide semiconductor layer.

13. The semiconductor device according to claim 11,
wherein a width in a channel length direction of the gate electrode layer is larger than a width in a channel length direction of the oxide semiconductor layer, and
wherein an end surface of the gate electrode layer overlaps with the source electrode layer or the drain electrode layer with the gate insulating layer and the oxide insulating layer interposed therebetween.

14. The semiconductor device according to claim 11, wherein the oxide insulating layer is a silicon oxide film or an aluminum oxide film.

15. The semiconductor device according to claim 11, wherein the oxide semiconductor layer further comprises gallium and zinc.

16. The semiconductor device according to claim 11,
wherein the first contact hole of the oxide insulating layer completely overlaps with the oxide semiconductor layer, and
wherein the second contact hole of the oxide insulating layer completely overlaps with the oxide semiconductor layer.

17. The semiconductor device according to claim 11, wherein the inorganic insulating film further comprises nitrogen.

18. The semiconductor device according to claim 11, wherein the gate insulating layer comprises a silicon nitride film and a silicon oxide film over the silicon nitride film.

19. The semiconductor device according to claim 11, wherein the resin is selected from a group consisting of polyimide, acrylic, benzocyclobutene, polyamide, epoxy and a siloxane-based resin.

20. A semiconductor device comprising:
a gate wiring layer over an insulating surface;
a gate insulating layer over the gate wiring layer;
an oxide semiconductor layer comprising indium over the gate insulating layer, the oxide semiconductor layer comprising a channel formation region overlapping with the gate wiring layer with the gate insulating layer therebetween, wherein the oxide semiconductor layer has a stacked structure including a first oxide semiconductor film and a second oxide semiconductor film over the first oxide semiconductor film;
an oxide insulating layer over the oxide semiconductor layer, the oxide insulating layer including a first contact hole and a second contact hole, wherein the oxide insulating layer covers a periphery of the oxide semiconductor layer;
a source electrode layer over the oxide insulating layer, the source electrode layer being in electrical contact with the oxide semiconductor layer through the first contact hole of the oxide insulating layer;
a drain electrode layer over the oxide insulating layer, the drain electrode layer being in electrical contact with the oxide semiconductor layer through the second contact hole of the oxide insulating layer;
an inorganic insulating film over the source electrode layer and the drain electrode layer;
an insulating layer comprising a resin over the inorganic insulating film;
a pixel electrode layer over the insulating layer, the pixel electrode layer being in electrical contact with one of the source electrode layer and the drain electrode layer; and
a wiring intersection of a gate wiring layer and a source wiring layer,
wherein the source electrode layer overlaps with a first end of the oxide semiconductor layer with the oxide insulating layer interposed therebetween,
wherein the drain electrode layer overlaps with a second end of the oxide semiconductor layer with the oxide insulating layer interposed therebetween,
wherein whole of the oxide semiconductor layer overlaps with the gate wiring layer,
wherein in the wiring intersection, the gate insulating layer and the oxide insulating layer are provided between the gate wiring layer and the source wiring layer,
wherein the gate wiring layer includes the gate electrode layer, and
wherein the source wiring layer includes the source electrode layer.

21. The semiconductor device according to claim 20, wherein the oxide insulating layer is a silicon oxide film or an aluminum oxide film.

22. The semiconductor device according to claim 20, wherein the oxide semiconductor layer further comprises gallium and zinc.

23. The semiconductor device according to claim 20,
wherein the first contact hole of the oxide insulating layer completely overlaps with the oxide semiconductor layer, and
wherein the second contact hole of the oxide insulating layer completely overlaps with the oxide semiconductor layer.

24. The semiconductor device according to claim 20, wherein the inorganic insulating film further comprises nitrogen.

25. The semiconductor device according to claim 20, wherein the gate insulating layer comprises a silicon nitride film and a silicon oxide film over the silicon nitride film.

26. The semiconductor device according to claim 20, wherein the resin is selected from a group consisting of polyimide, acrylic, benzocyclobutene, polyamide, epoxy and a siloxane-based resin.

27. A semiconductor device comprising:
a gate electrode layer over an insulating surface;
a gate insulating layer over the gate electrode layer;
an oxide semiconductor layer comprising indium over the gate insulating layer, the oxide semiconductor layer comprising a channel formation region overlapping with the gate electrode layer with the gate insulating layer therebetween, wherein the oxide semiconductor layer has a stacked structure including a first oxide semiconductor film and a second oxide semiconductor film over the first oxide semiconductor film;
an oxide insulating layer over the oxide semiconductor layer, the oxide insulating layer including a first contact hole and a second contact hole, wherein the oxide insulating layer covers a periphery of the oxide semiconductor layer;
a source electrode layer over the oxide insulating layer, the source electrode layer being in electrical contact with the oxide semiconductor layer through the first contact hole of the oxide insulating layer;
a drain electrode layer over the oxide insulating layer, the drain electrode layer being in electrical contact with the oxide semiconductor layer through the second contact hole of the oxide insulating layer;
an inorganic insulating film over the source electrode layer and the drain electrode layer;
a pixel electrode layer over the inorganic insulating film, the pixel electrode layer being in electrical contact with one of the source electrode layer and the drain electrode layer; and
a wiring intersection of a gate wiring layer and a source wiring layer,
wherein the source electrode layer overlaps with a first end of the oxide semiconductor layer with the oxide insulating layer interposed therebetween,
wherein the drain electrode layer overlaps with a second end of the oxide semiconductor layer with the oxide insulating layer interposed therebetween,
wherein a resistance in the channel formation region is higher than a resistance in a region of the oxide semiconductor layer, the region being in contact with one of the source electrode layer and the drain electrode layer,
wherein in the wiring intersection, the gate insulating layer and the oxide insulating layer are provided between the gate wiring layer and the source wiring layer,
wherein the gate wiring layer includes the gate electrode layer, and
wherein the source wiring layer includes the source electrode layer.

28. The semiconductor device according to claim 27, wherein a width in a channel length direction of the gate electrode layer is smaller than a width in a channel length direction of the oxide semiconductor layer.

29. The semiconductor device according to claim 27,
wherein a width in a channel length direction of the gate electrode layer is larger than a width in a channel length direction of the oxide semiconductor layer, and
wherein an end surface of the gate electrode layer overlaps with the source electrode layer or the drain electrode layer with the gate insulating layer and the oxide insulating layer interposed therebetween.

30. The semiconductor device according to claim 27, wherein the oxide insulating layer is a silicon oxide film or an aluminum oxide film.

31. The semiconductor device according to claim 27, wherein the oxide semiconductor layer further comprises gallium and zinc.

32. The semiconductor device according to claim 27,
wherein the first contact hole of the oxide insulating layer completely overlaps with the oxide semiconductor layer, and
wherein the second contact hole of the oxide insulating layer completely overlaps with the oxide semiconductor layer.

33. The semiconductor device according to claim 27, wherein the inorganic insulating film further comprises nitrogen.

34. The semiconductor device according to claim 27, wherein the gate insulating layer comprises a silicon nitride film and a silicon oxide film over the silicon nitride film.

35. A semiconductor device comprising:
a gate electrode layer over an insulating surface;
a gate insulating layer over the gate electrode layer;
an oxide semiconductor layer comprising indium over the gate insulating layer, the oxide semiconductor layer comprising a channel formation region overlapping with the gate electrode layer with the gate insulating layer therebetween, wherein the oxide semiconductor layer has a stacked structure including a first oxide semiconductor film and a second oxide semiconductor film over the first oxide semiconductor film;
an oxide insulating layer over the oxide semiconductor layer, the oxide insulating layer including a first contact hole and a second contact hole, wherein the oxide insulating layer covers a periphery of the oxide semiconductor layer;
a source electrode layer over the oxide insulating layer, the source electrode layer being in electrical contact with the oxide semiconductor layer through the first contact hole of the oxide insulating layer;
a drain electrode layer over the oxide insulating layer, the drain electrode layer being in electrical contact with the oxide semiconductor layer through the second contact hole of the oxide insulating layer;
an inorganic insulating film over the source electrode layer and the drain electrode layer;

a pixel electrode layer over the inorganic insulating film, the pixel electrode layer being in electrical contact with one of the source electrode layer and the drain electrode layer; and
a wiring intersection of a gate wiring layer and a source wiring layer,
wherein the source electrode layer overlaps with a first end of the oxide semiconductor layer with the oxide insulating layer interposed therebetween,
wherein the drain electrode layer overlaps with a second end of the oxide semiconductor layer with the oxide insulating layer interposed therebetween,
wherein a concentration of oxygen in the channel formation region is higher than a concentration of oxygen in a region of the oxide semiconductor layer, the region being in contact with one of the source electrode layer and the drain electrode layer,
wherein in the wiring intersection, the gate insulating layer and the oxide insulating layer are provided between the gate wiring layer and the source wiring layer,
wherein the gate wiring layer includes the gate electrode layer, and
wherein the source wiring layer includes the source electrode layer.

36. The semiconductor device according to claim 35, wherein a width in a channel length direction of the gate electrode layer is smaller than a width in a channel length direction of the oxide semiconductor layer.

37. The semiconductor device according to claim 35,
wherein a width in a channel length direction of the gate electrode layer is larger than a width in a channel length direction of the oxide semiconductor layer, and
wherein an end surface of the gate electrode layer overlaps with the source electrode layer or the drain electrode layer with the gate insulating layer and the oxide insulating layer interposed therebetween.

38. The semiconductor device according to claim 35, wherein the oxide insulating layer is a silicon oxide film or an aluminum oxide film.

39. The semiconductor device according to claim 35, wherein the oxide semiconductor layer further comprises gallium and zinc.

40. The semiconductor device according to claim 35,
wherein the first contact hole of the oxide insulating layer completely overlaps with the oxide semiconductor layer, and
wherein the second contact hole of the oxide insulating layer completely overlaps with the oxide semiconductor layer.

41. The semiconductor device according to claim 35, wherein the inorganic insulating film further comprises nitrogen.

42. The semiconductor device according to claim 35, wherein the gate insulating layer comprises a silicon nitride film and a silicon oxide film over the silicon nitride film.

43. A semiconductor device comprising:
a gate wiring layer over an insulating surface;
a gate insulating layer over the gate wiring layer;
an oxide semiconductor layer comprising indium over the gate insulating layer, the oxide semiconductor layer comprising a channel formation region overlapping with the gate wiring layer with the gate insulating layer therebetween, wherein the oxide semiconductor layer has a stacked structure including a first oxide semiconductor film and a second oxide semiconductor film over the first oxide semiconductor film;
an oxide insulating layer over the oxide semiconductor layer, the oxide insulating layer including a first contact hole and a second contact hole, wherein the oxide insulating layer covers a periphery of the oxide semiconductor layer;
a source electrode layer over the oxide insulating layer, the source electrode layer being in electrical contact with the oxide semiconductor layer through the first contact hole of the oxide insulating layer;
a drain electrode layer over the oxide insulating layer, the drain electrode layer being in electrical contact with the oxide semiconductor layer through the second contact hole of the oxide insulating layer;
an inorganic insulating film over the source electrode layer and the drain electrode layer;
a pixel electrode layer over the inorganic insulating film, the pixel electrode layer being in electrical contact with one of the source electrode layer and the drain electrode layer; and
a wiring intersection of a gate wiring layer and a source wiring layer,
wherein the source electrode layer overlaps with a first end of the oxide semiconductor layer with the oxide insulating layer interposed therebetween, and
wherein the drain electrode layer overlaps with a second end of the oxide semiconductor layer with the oxide insulating layer interposed therebetween,
wherein whole of the oxide semiconductor layer overlaps with the gate wiring layer,
wherein in the wiring intersection, the gate insulating layer and the oxide insulating layer are provided between the gate wiring layer and the source wiring layer,
wherein the gate wiring layer includes the gate electrode layer, and
wherein the source wiring layer includes the source electrode layer.

44. The semiconductor device according to claim 43, wherein the oxide insulating layer is a silicon oxide film or an aluminum oxide film.

45. The semiconductor device according to claim 43, wherein the oxide semiconductor layer further comprises gallium and zinc.

46. The semiconductor device according to claim 43,
wherein the first contact hole of the oxide insulating layer completely overlaps with the oxide semiconductor layer, and
wherein the second contact hole of the oxide insulating layer completely overlaps with the oxide semiconductor layer.

47. The semiconductor device according to claim 43, wherein the inorganic insulating film further comprises nitrogen.

48. The semiconductor device according to claim 43, wherein the gate insulating layer comprises a silicon nitride film and a silicon oxide film over the silicon nitride film.

* * * * *

UNITED STATES PATENT AND TRADEMARK OFFICE
CERTIFICATE OF CORRECTION

PATENT NO.         : 8,937,306 B2
APPLICATION NO.    : 13/862528
DATED              : January 20, 2015
INVENTOR(S)        : Shunpei Yamazaki et al.

It is certified that error appears in the above-identified patent and that said Letters Patent is hereby corrected as shown below:

In the Specification

Column 17, line 66, replace "4240" with --424f--;

Column 33, line 7, before "oxide" replace "e" with --i-type--;

Column 38, line 13, replace "102" with --10_2--;

Column 43, line 60, after "4041a," replace "b" with --4041b--;

Column 46, line 18, replace "ink jet" with --ink-jet--;

In the Claims

Column 67, line 21, claim 11, after "layer;" delete "and";

Column 68, line 51, claim 20, after "of" replace "a" with --the--;

Column 68, line 64, claim 20, after "includes" replace "the" with --a--;

Column 72, line 25, claim 43, after "of" replace "a" with --the--;

Column 72, line 29, claim 43, after "therebetween," delete "and"; and

Column 72, line 38, claim 43, after "includes" replace "a" with --the--.

Signed and Sealed this
Eighth Day of September, 2015

Michelle K. Lee
*Director of the United States Patent and Trademark Office*

UNITED STATES PATENT AND TRADEMARK OFFICE
CERTIFICATE OF CORRECTION

PATENT NO. : 8,937,306 B2
APPLICATION NO. : 13/862528
DATED : January 20, 2015
INVENTOR(S) : Shunpei Yamazaki et al.

It is certified that error appears in the above-identified patent and that said Letters Patent is hereby corrected as shown below:

In the Specification

Column 17, line 66, replace "4240" with --424f--;

Column 33, line 7, before "oxide" replace "e" with --i-type--;

Column 38, line 13, replace "102" with --10_2--;

Column 43, line 60, after "4041a," replace "b" with --4041b--;

Column 46, line 18, replace "ink jet" with --ink-jet--;

In the Claims

Column 67, line 21, claim 11, after "layer;" delete "and";

Column 68, line 51, claim 20, after "of" replace "a" with --the--;

Column 68, line 64, claim 20, after "includes" replace "the" with --a--;

Column 72, line 25, claim 43, after "of" replace "a" with --the--;

Column 72, line 29, claim 43, after "therebetween," delete "and"; and

Column 72, line 38, claim 43, after "includes" replace "the" with --a--.

This certificate supersedes the Certificate of Correction issued September 8, 2015.

Signed and Sealed this
Third Day of November, 2015

Michelle K. Lee
*Director of the United States Patent and Trademark Office*